United States Patent
Ando

(10) Patent No.: US 8,173,352 B2
(45) Date of Patent: May 8, 2012

(54) RESIST COMPOSITION

(75) Inventor: Nobuo Ando, Toyonaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 250 days.

(21) Appl. No.: 12/627,683

(22) Filed: Nov. 30, 2009

(65) Prior Publication Data

US 2010/0136481 A1 Jun. 3, 2010

(30) Foreign Application Priority Data

Dec. 2, 2008 (JP) ................................. 2008-307648

(51) Int. Cl.
*G03F 7/004* (2006.01)
(52) U.S. Cl. ...................... 430/270.1; 430/905; 430/910
(58) Field of Classification Search ................ 430/270.1, 430/326, 905, 910
See application file for complete search history.

(56) References Cited

U.S. PATENT DOCUMENTS

| | | | | |
|---|---|---|---|---|
| 6,893,794 B2 * | 5/2005 | Akita et al. | ................. | 430/270.1 |
| 6,953,651 B2 * | 10/2005 | Namba et al. | ............. | 430/270.1 |
| 7,202,010 B2 | 4/2007 | Yamada et al. | | |
| 7,566,522 B2 | 7/2009 | Takata et al. | | |
| 2003/0114589 A1 * | 6/2003 | Suetsugu et al. | .............. | 525/132 |
| 2004/0166432 A1 * | 8/2004 | Ohsawa et al. | ................ | 430/170 |
| 2005/0014095 A1 * | 1/2005 | Yamaguchi et al. | ........ | 430/270.1 |

FOREIGN PATENT DOCUMENTS

JP 2005-274877 A 10/2005
* cited by examiner

*Primary Examiner* — John Chu
(74) *Attorney, Agent, or Firm* — Birch, Stewart, Kolasch & Birch, LLP

(57) ABSTRACT

A resist composition comprising:
(A) a resin comprising a structural unit having an acid-labile group in its side chain and a structural unit represented by the formula (I):

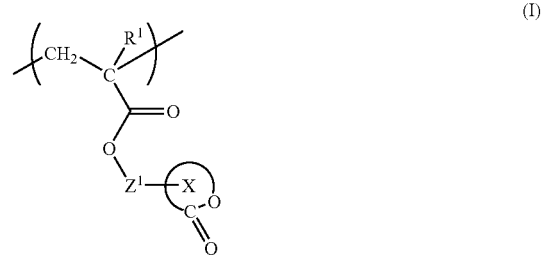

wherein $R^1$ represents a hydrogen atom or a methyl group, $Z^1$ represents a single bond or $-(CH_2)_k-CO-O-$, k represents an integer of 1 to 4, and ring X represents an unsubstituted or substituted C3-C30 cyclic hydrocarbon group having $-COO-$, (B) a resin comprising a structural unit having an acid-labile group in its side chain and a structural unit represented by the formula (III):

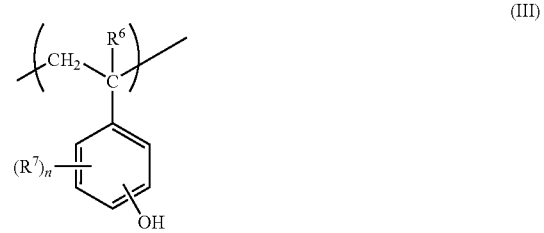

wherein $R^6$ represents a hydrogen atom or a methyl group, $R^7$ is independently in each occurrence a linear or branched chain C1-C6 alkyl group and n represents an integer of 0 to 4, and
(C) an acid generator.

4 Claims, No Drawings

RESIST COMPOSITION

This nonprovisional application claims priority under 35 U.S.C. §119(a) on Patent Application No. 2008-307648 filed in JAPAN on Dec. 2, 2008, the entire contents of which are hereby incorporated by reference.

FIELD OF THE INVENTION

The present invention relates to a resist composition.

BACKGROUND OF THE INVENTION

A resist composition used for semiconductor microfabrication employing a lithography process contains a resin having an acid-labile group and an acid generator.

In semiconductor microfabrication, it is desirable to form patterns having high sensitivity and high resolution and good pattern profile such as shape of the pattern, and it is expected for a chemically amplified resist composition to give such patterns.

US 2003/0099900 A1 discloses a resist composition comprising a resin having a structural unit derived from 2-ethyl-2-adamantyl methacrylate and a structural unit derived from p-hydroxystyrene, and an acid generator. JP 2005-274877 A also discloses a resist composition for EUV lithography comprising a resin having a structural unit derived from 2-ethyl-2-adamantyl methacrylate and a structural unit derived from p-hydroxystyrene, and an acid generator.

SUMMARY OF THE INVENTION

The present invention is to provide a resist composition.
The present invention relates to the followings:

<1> A resist composition comprising:

(A) a resin comprising a structural unit having an acid-labile group in its side chain and a structural unit represented by the formula (I):

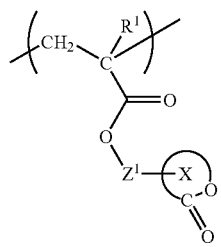

wherein $R^1$ represents a hydrogen atom or a methyl group, $Z^1$ represents a single bond or $-(CH_2)_k-CO-O-$, k represents an integer of 1 to 4, and ring X represents an unsubstituted or substituted C3-C30 cyclic hydrocarbon group having $-COO-$, (B) a resin comprising a structural unit having an acid-labile group in its side chain and a structural unit represented by the formula (III):

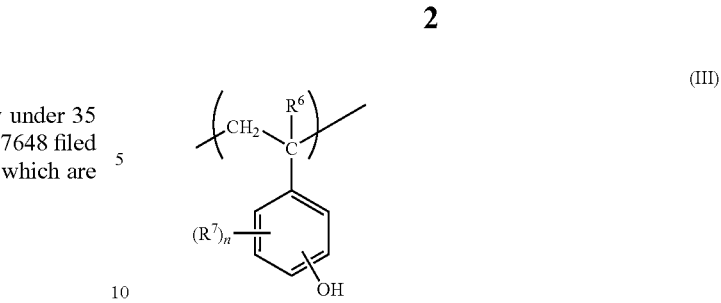

wherein $R^6$ represents a hydrogen atom or a methyl group, $R^7$ is independently in each occurrence a linear or branched chain C1-C6 alkyl group and n represents an integer of 0 to 4, and (C) an acid generator;

<2> The resist composition according to <1>, wherein the structural unit having an acid-labile group in its side chain is a structural unit (IIa) or (IIb):

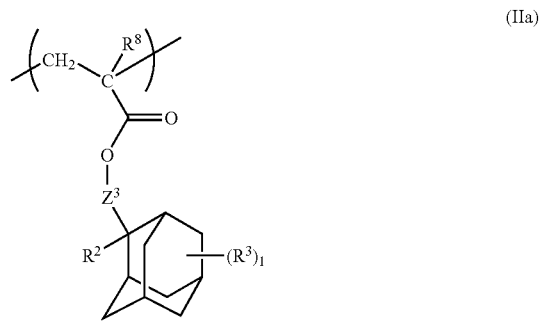

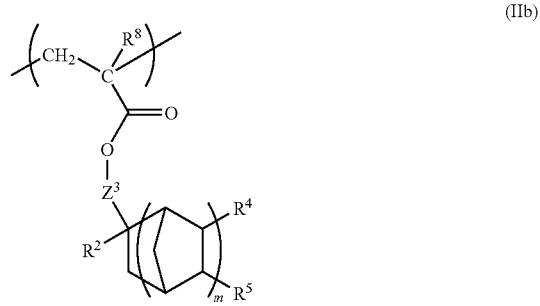

wherein $R^8$ represents a hydrogen atom or a methyl group, $Z^3$ represents a single bond or $-(CH_2)_j-CO-O-$, j represents an integer of 1 to 4, $R^2$ represents a C1-C8 linear or branched chain alkyl group or a C3-C8 cycloalkyl group, $R^3$ represents a methyl group, l represents an integer of 0 to 14, $R^4$ and $R^5$ each independently represent a hydrogen atom or a C1-C8 monovalent hydrocarbon group which may have one or more heteroatoms, or $R^4$ and $R^5$ may be bonded to form a C1-C8 divalent hydrocarbon group which may have at least one heteroatom which forms a ring together with the adjacent carbon atoms to which $R^4$ and $R^5$ are bonded, or $R^4$ and $R^5$ may be also bonded to form a carbon-carbon double bond between the carbon atom to which $R^4$ is bonded and the carbon atom to which $R^5$ is bonded, and m represents an integer of 1 to 3;

<3> The resist composition according to <1> or <2>, wherein a weight ratio of the resin (A) to the resin (B) (the resin (A)/the resin (B)) is 1/3 to 3/1;

<4> The resist composition according to any one of <1> to <3>, wherein the acid generator is a salt represented by the formula (V):

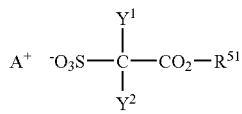
(V)

wherein $A^+$ represents an organic counter ion, $Y^1$ and $Y^2$ each independently represent a fluorine atom or a C1-C6 perfluoroalkyl group, $R^{51}$ represents a C1-C30 hydrocarbon group which may have one or more substituents selected from the group consisting of a C1-C6 alkoxy group, a C1-C4 perfluoroalkyl group, a C1-C6 hydroxyalkyl group, a hydroxyl group and a cyano group, and in which one or more —$CH_2$— may be replace by —CO— or —O—;

<5> Use of the resist composition according to any one of <1> to <4> for extreme ultraviolet lithography or electron beam lithography.

DESCRIPTION OF PREFERRED EMBODIMENTS

The resist composition of the present invention comprises (A) a resin comprising a structural unit having an acid-labile group in its side chain and a structural unit represented by the formula (I):

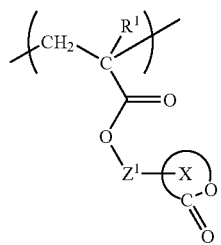
(I)

wherein $R^1$ represents a hydrogen atom or a methyl group, $Z^1$ represents a single bond or —$(CH_2)_k$—CO—O—, k represents an integer of 1 to 4, and ring X represents an unsubstituted or substituted C3-C30 cyclic hydrocarbon group having —COO— (hereinafter, simply referred to as Resin (A)), (B) a resin comprising a structural unit having an acid-labile group in its side chain and a structural unit represented by the formula (III):

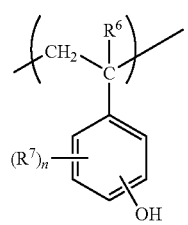
(III)

wherein $R^6$ represents a hydrogen atom or a methyl group, $R^7$ is independently in each occurrence a linear or branched chain C1-C6 alkyl group and n represents an integer of 0 to 4 (hereinafter, simply referred to as Resin (B)), and (C) an acid generator.

Resin (A) itself is insoluble or poorly soluble in an alkali aqueous solution but becomes soluble in an alkali aqueous solution by the action of an acid. Resin (B) itself is also insoluble or poorly soluble in an alkali aqueous solution but becomes soluble in an alkali aqueous solution by the action of an acid.

The structural unit having an acid-labile group in its side chain of Resin (A) and that of Resin (B) may be same or different from each other.

Resin (A) may have two or more kinds of the structural unit having an acid-labile group in its side chain, and Resin (B) may have two or more kinds of the structural unit having an acid-labile group in its side chain.

In the present specification, "acid-labile group" means a group cleaved by contacting with an acid to be converted to a hydrophilic group such as a hydroxyl group and a carboxyl group.

Examples of the acid-labile group include a group represented by the formula (1):

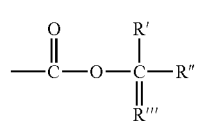
(1)

wherein R', R" and R'" each independently represents a linear or branched chain C1-C30 aliphatic hydrocarbon group and R' and R" may be bonded to form a ring (hereinafter, simply referred to as the acid-labile group (1)). Examples of the acid-labile group (1) include a 1,1-dialkylalkoxycarbonyl group such as a tert-butoxycarbonyl group; a 2-alkyl-2-adamantyloxycarbonyl group such as a 2-methyl-2-adamantyloxycarbonyl group, a 2-ethyl-2-adamantyloxycarbonyl group and a 2-isopropyl-2-adamantyloxycarbonyl group; a 1-alkylcycloalkoxycarbonyl group such as a 1-ethylcyclohexyloxycarbonyl group; and a 1-(1-adamantyl)-1-alkylalkoxycarbonyl group.

The structural units having an acid-labile group is derived from a monomer having a carbon-carbon double bond and an acid-labile group, and preferable examples of the monomer include an acrylate having an acid-labile group and a methacrylate having an acid-labile group. The monomer having an acid-labile group containing a C5-C20 alicyclic hydrocarbon group is preferable because excellent resolution is obtained when the resin obtained is used in the present composition. Examples of the C5-C20 alicyclic hydrocarbon group include a monocyclic saturated aliphatic hydrocarbon group having a cycloalkane ring such as a cyclopentane ring, a cyclohexane ring, a cycloheptane ring and a cyclooctane ring; and a polycyclic aliphatic hydrocarbon group having a bridged hydrocarbon ring such as an adamantane ring and a norbornane ring.

Examples of the structural unit having an acid-labile group in its side chain include structural units represented by the formulae (IIa) and (IIb):

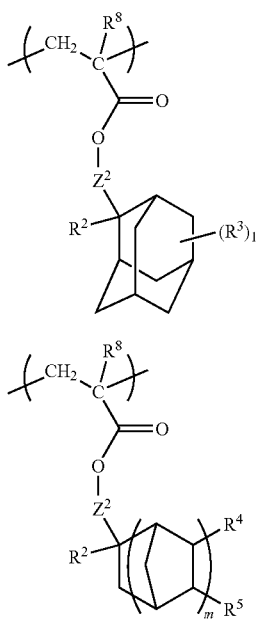

wherein $R^8$ represents a hydrogen atom or a methyl group, $Z^2$ represents a single bond or —[CH$_2$]$_r$—CO—O—, r represents an integer of 1 to 4, $R^2$ represents a C1-C8 linear or branched chain alkyl group or a C3-C8 cycloalkyl group, $R^3$ represents a methyl group, 1 represents an integer of 0 to 14, $R^4$ and $R^5$ each independently represent a hydrogen atom or a C1-C8 monovalent hydrocarbon group which may have one or more heteroatoms, or $R^4$ and $R^5$ may be bonded to form a C1-C8 divalent hydrocarbon group which may have one or more heteroatoms and which forms a ring together with the adjacent carbon atoms to which $R^4$ and $R^5$ are bonded, or $R^4$ and $R^5$ may be bonded to form a carbon-carbon double bond between the carbon atom to which $R^4$ is bonded and the carbon atom to which $R^5$ is bonded, and m represents an integer of 1 to 3.

In the formulae (IIa) and (IIb), $R^2$ is preferably a C1-C6 linear or branched chain alkyl group or a C3-C6 cycloalkyl group and more preferably a C1-C6 linear or branched chain alkyl group.

Examples of the C1-C8 linear or branched chain alkyl group include a methyl group, an ethyl group, a propyl group, an isopropyl group, a butyl group, an isobutyl group, a sec-butyl group, a pentyl group, an isopentyl group, a neopentyl group, a hexyl group, a heptyl group and an octyl group. Examples of the C3-C8 cycloalkyl group include a cyclopentyl group, a cyclohexyl group, a cyclooctyl group, a 2-methylcyclopentyl group, a 3-methylcyclohexyl group, a 4-methylcyclohexyl group, a 2,3-dimethylcyclohexyl group and a 4,4-dimethylcyclohexyl group.

In the formulae (IIa) and (IIb), $Z^2$ is preferably a single bond or —CH$_2$—COO—, and more preferably represents a single bond.

In the formula (IIa), 1 is preferably 0 or 1. In the formula (IIb), m is preferably 1 or 2.

Examples of the C1-C8 monovalent hydrocarbon group include a methyl group, an ethyl group, a propyl group, an isopropyl group, a butyl group, an isobutyl group, a sec-butyl group, a pentyl group, a hexyl group, a heptyl group and an octyl group. Examples of the C1-C8 divalent hydrocarbon group formed by bonding $R^4$ and $R^5$ include an ethylene group and a trimethylene group.

Examples of the monomer giving the structural unit represented by the formula (IIa) include the followings:

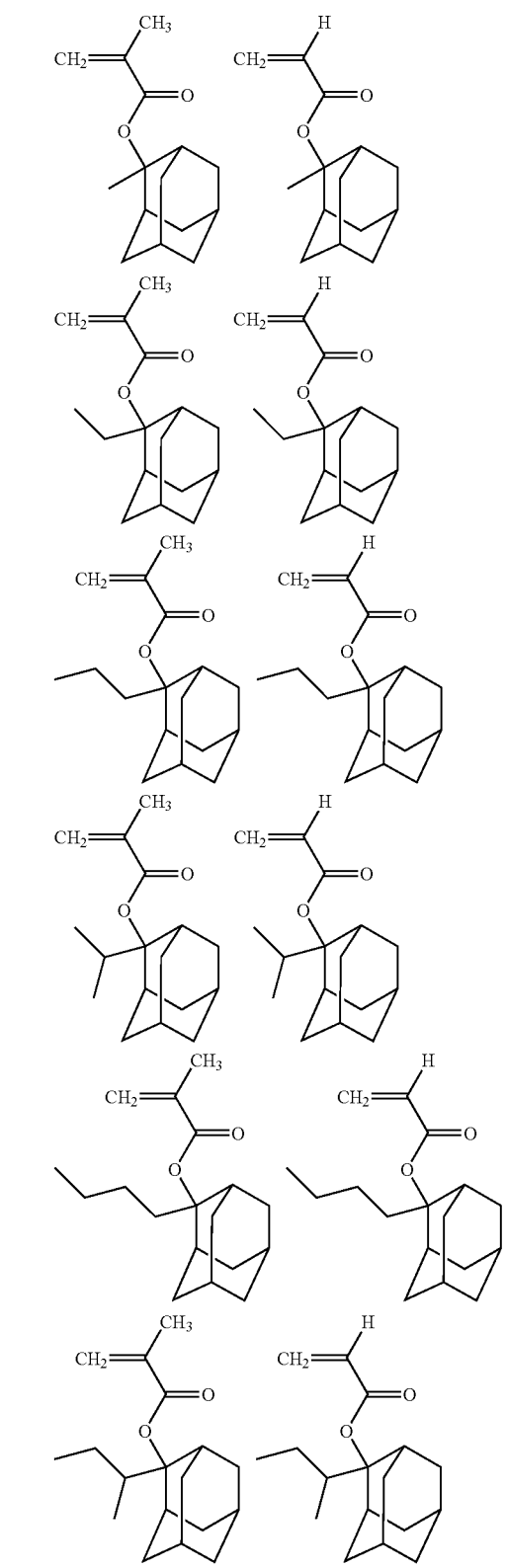

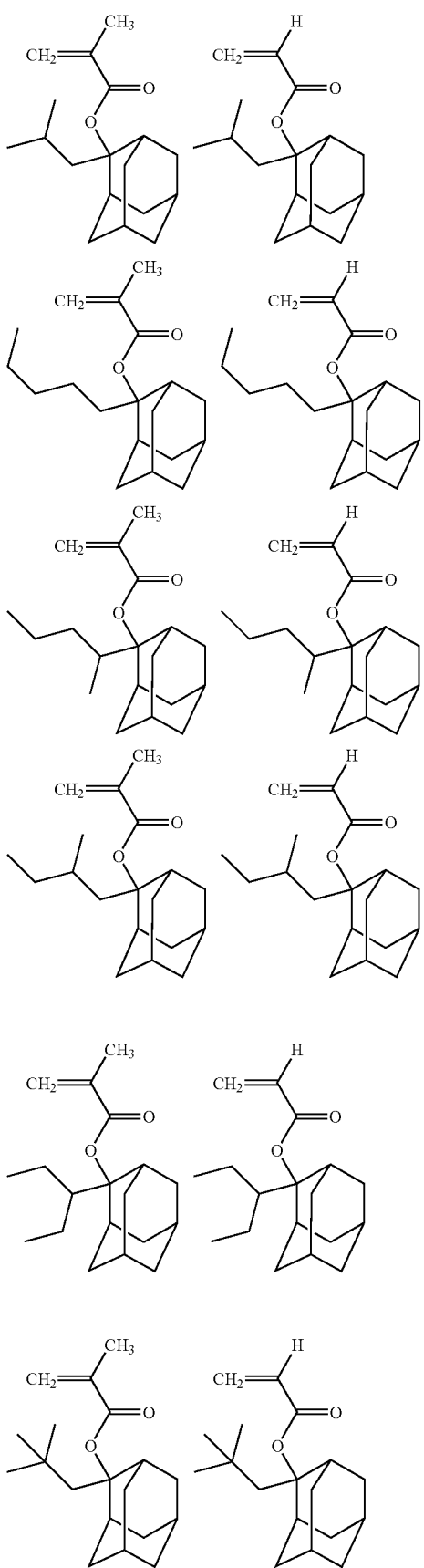
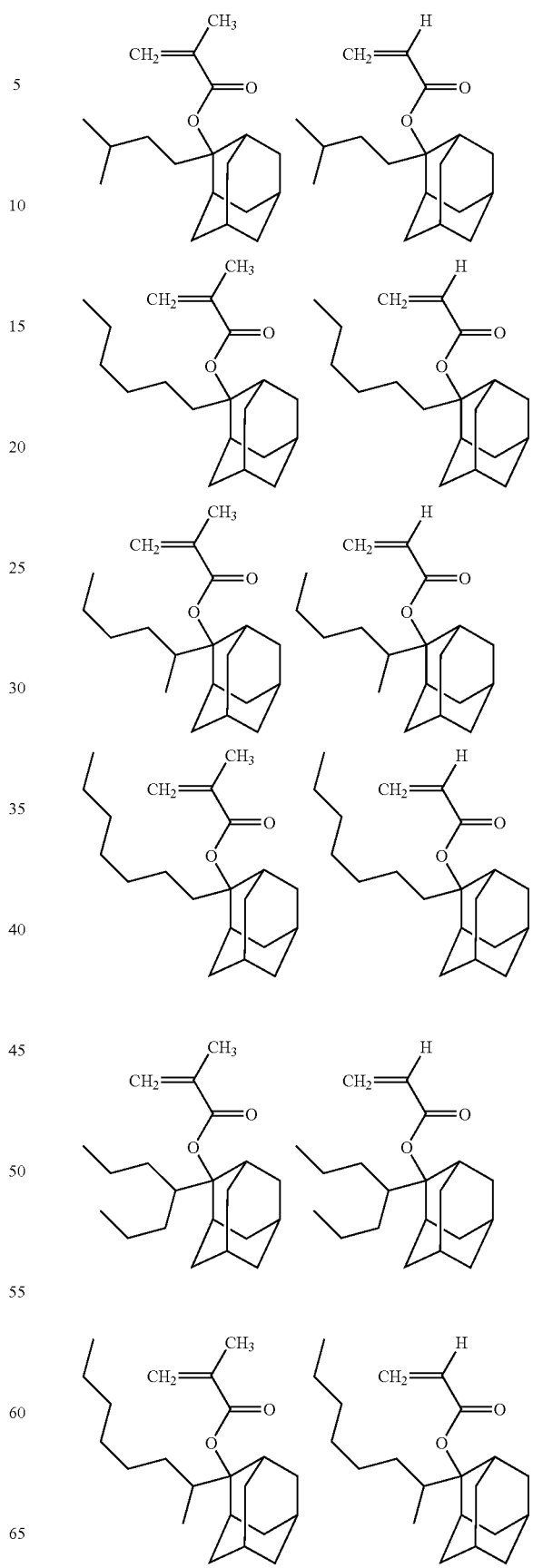

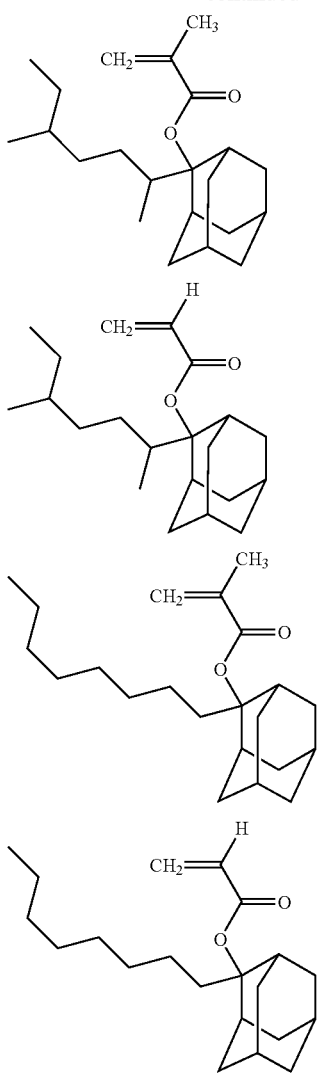
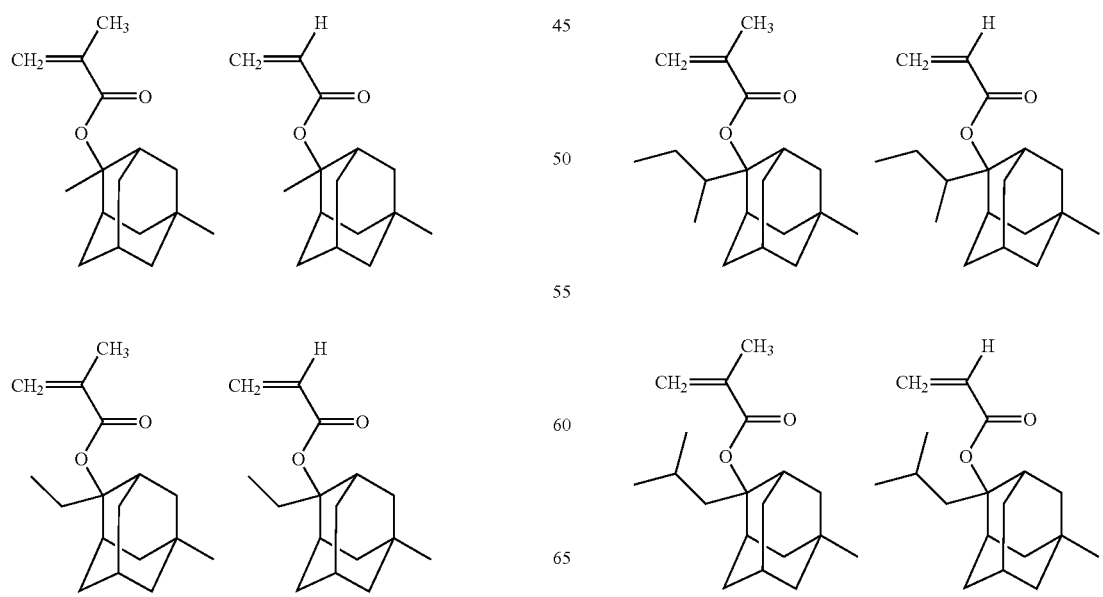

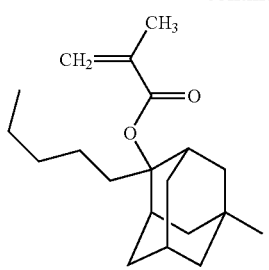
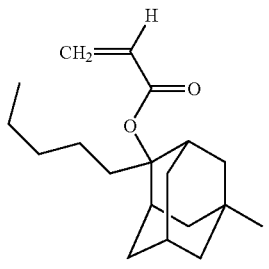
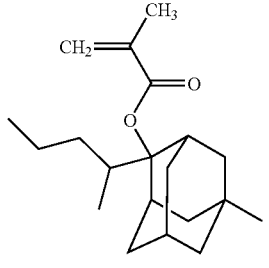
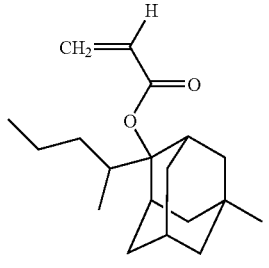
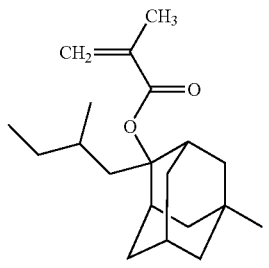
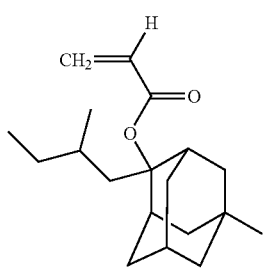
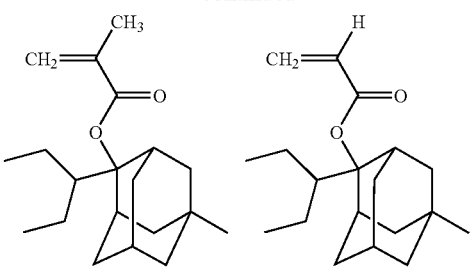
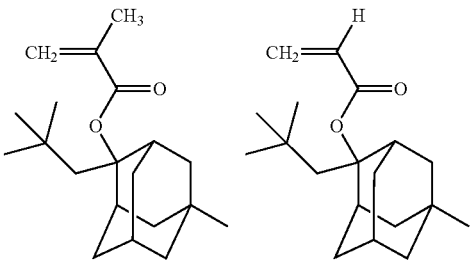
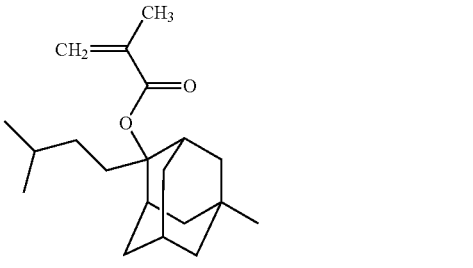
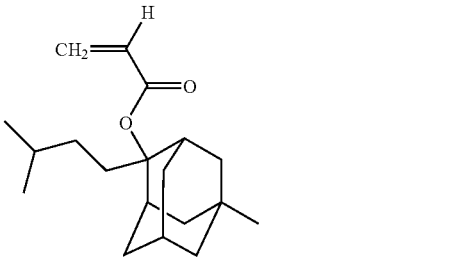
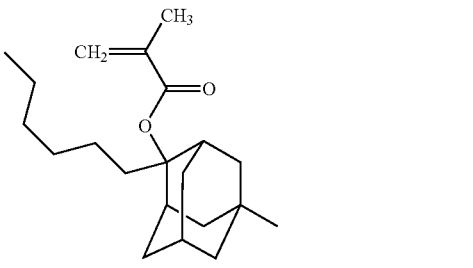
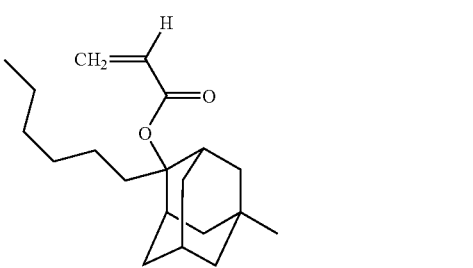

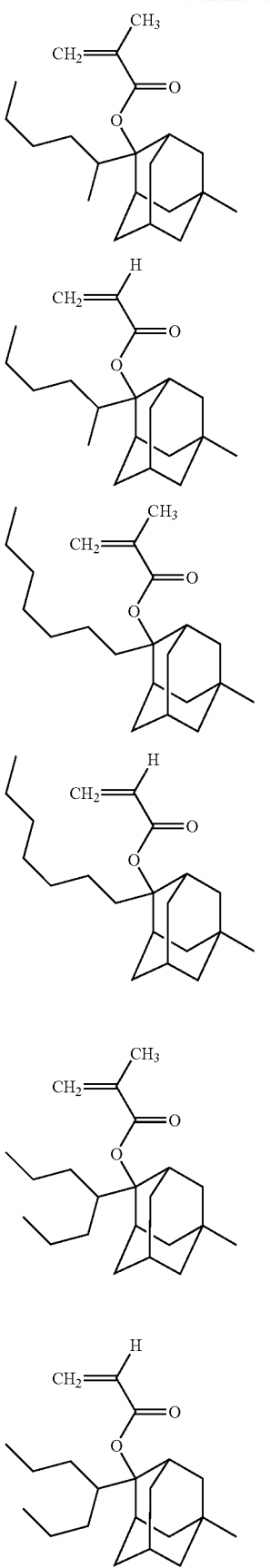
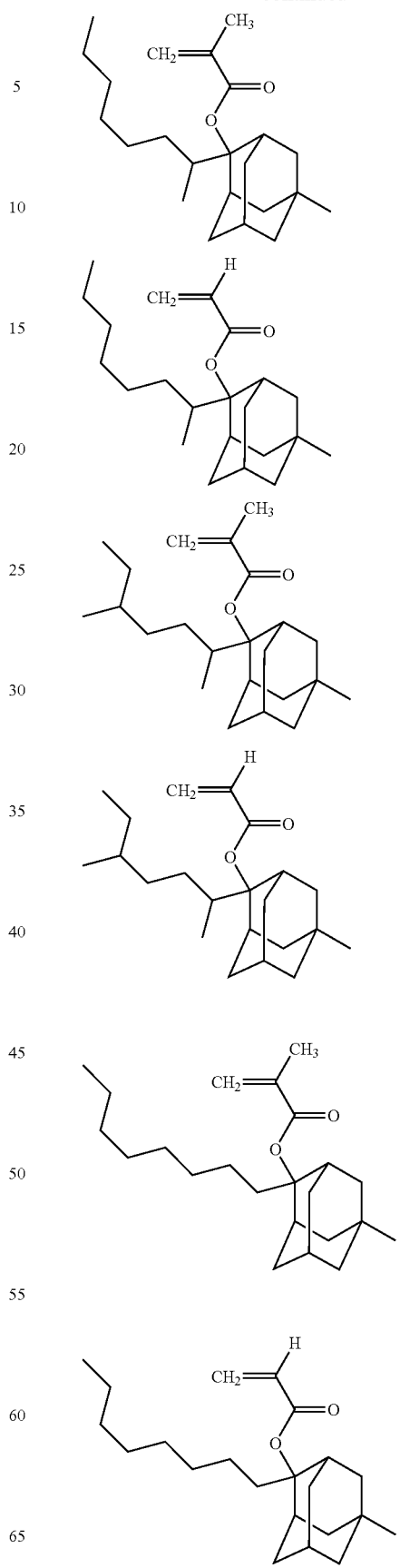

15
-continued
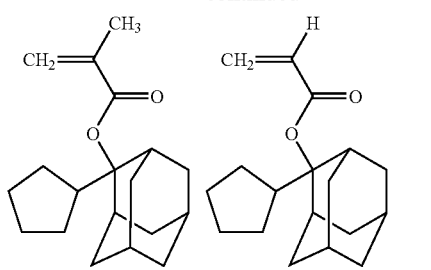
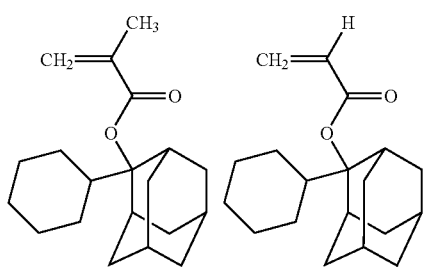
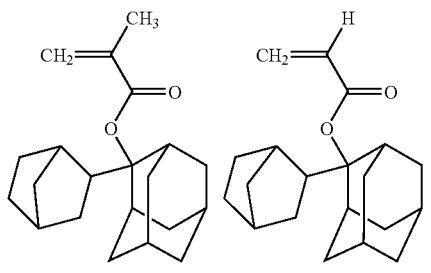
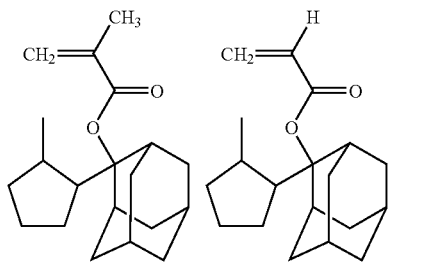
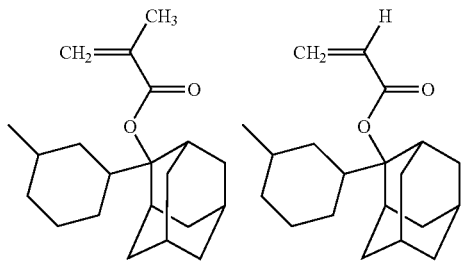
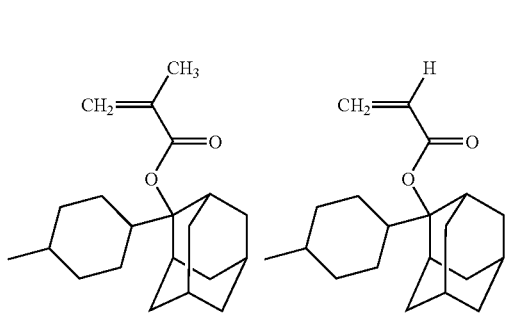
16
-continued
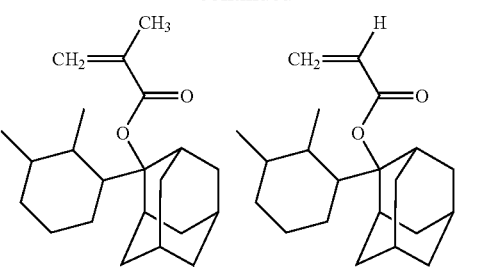
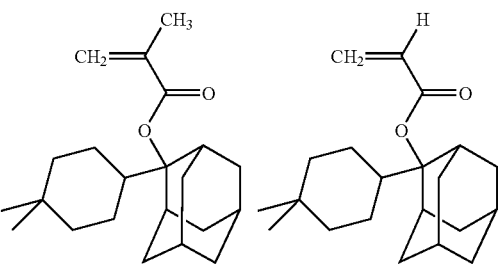
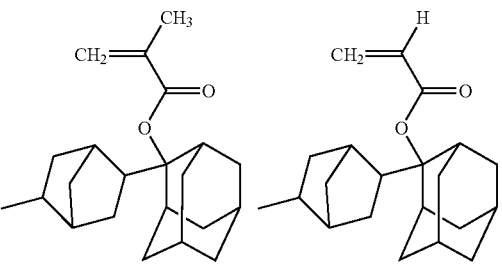
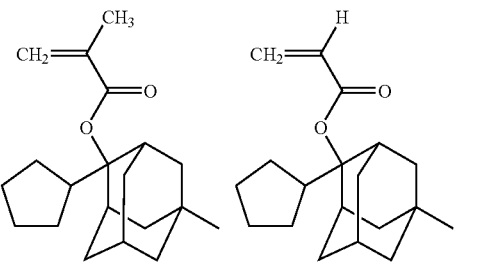
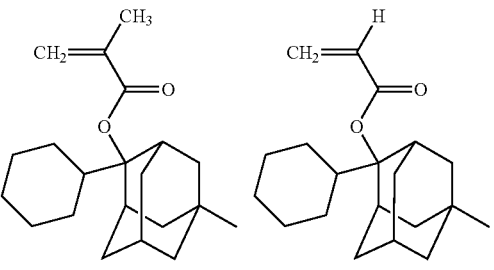
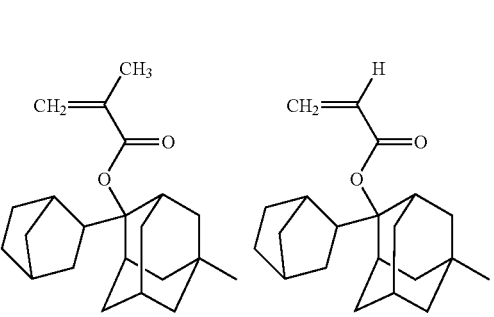

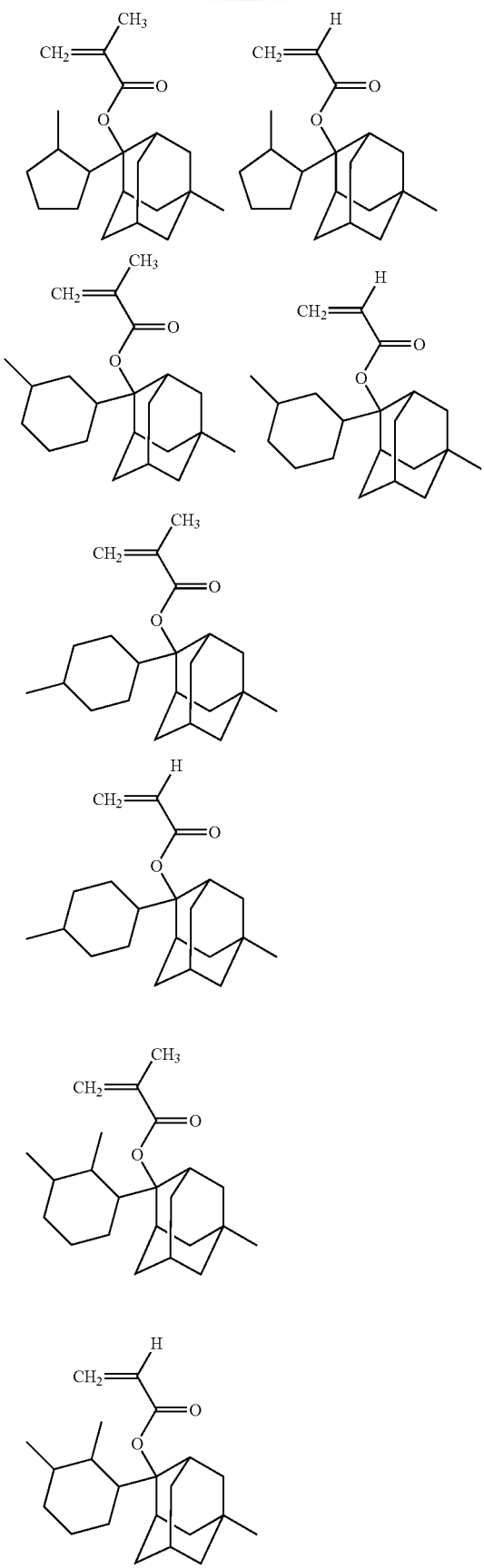
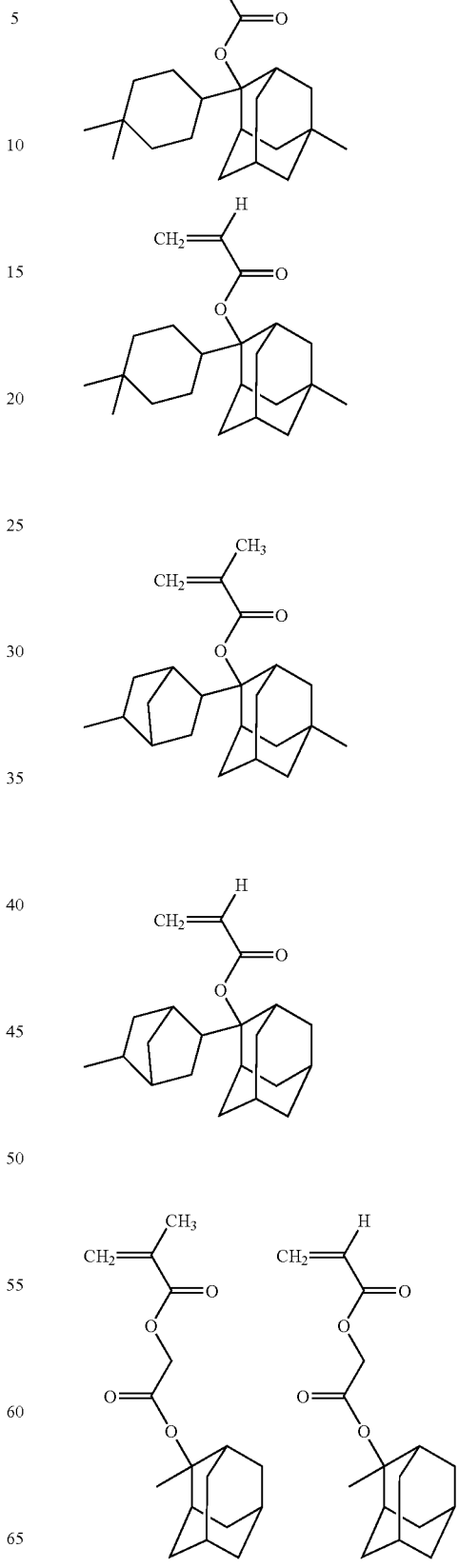

19
-continued
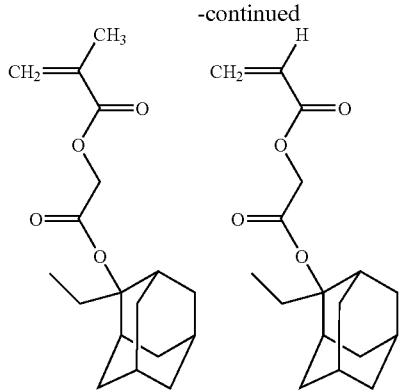
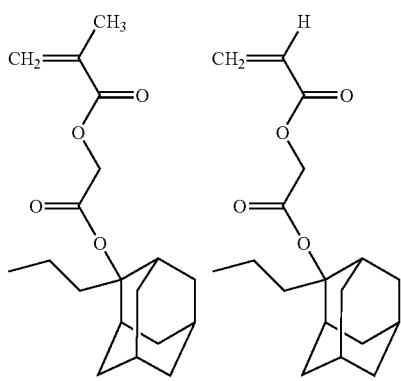
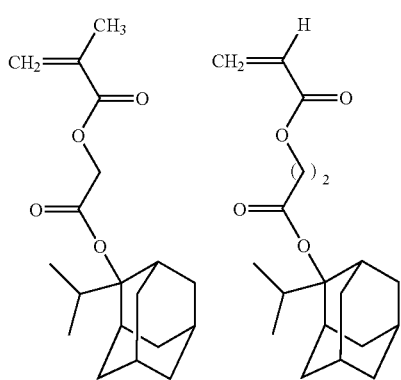
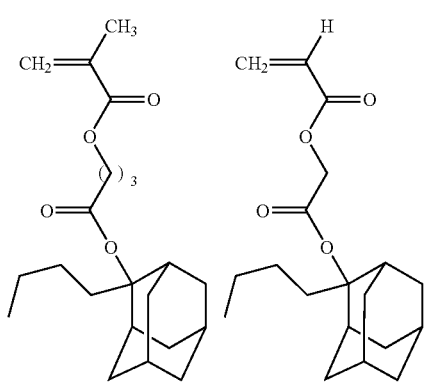
20
-continued
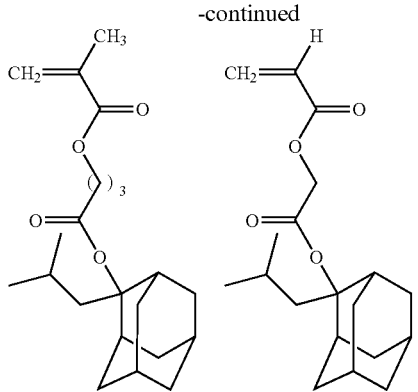
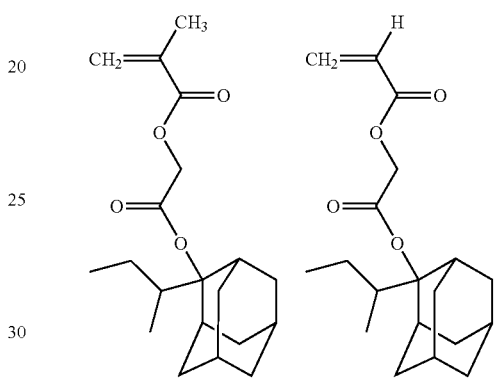
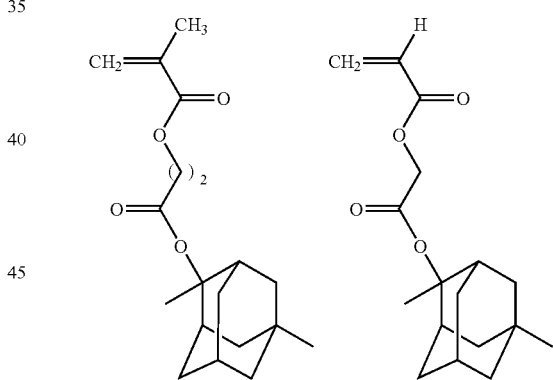
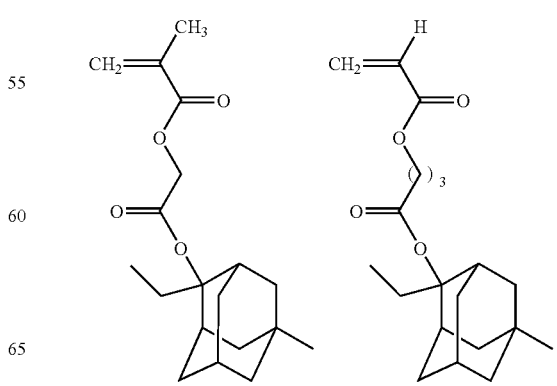

-continued
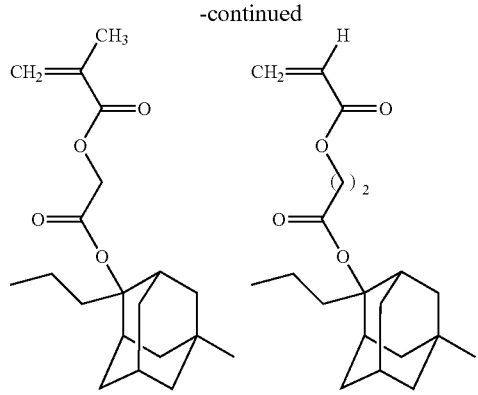
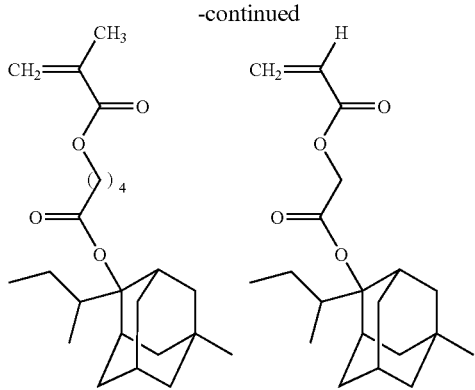
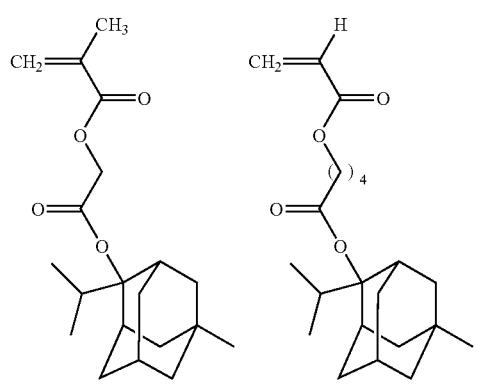
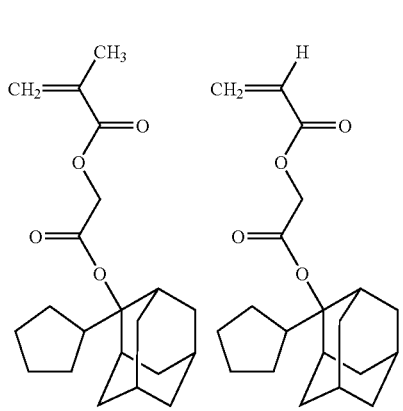
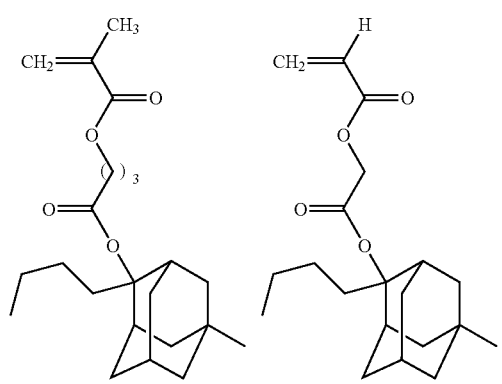
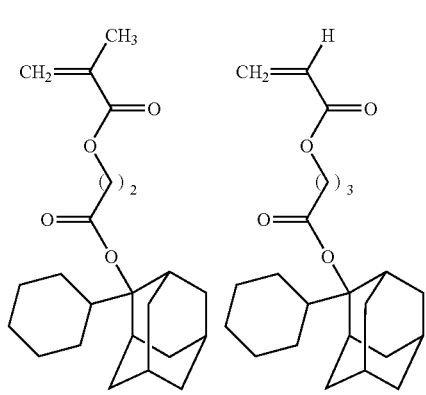
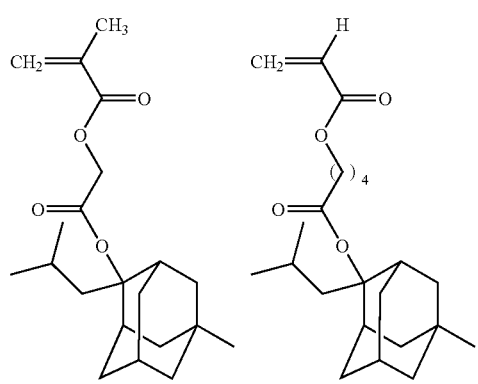
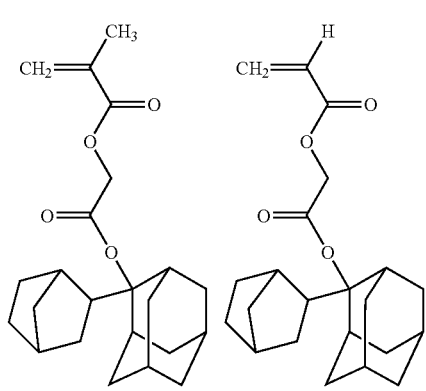

-continued
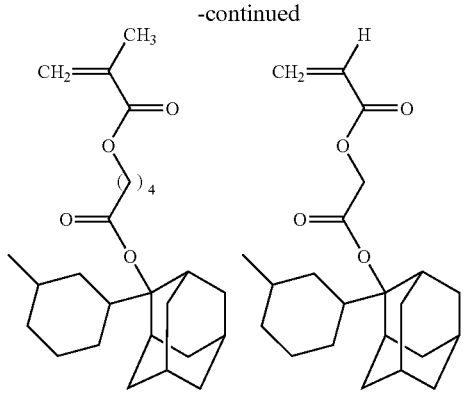
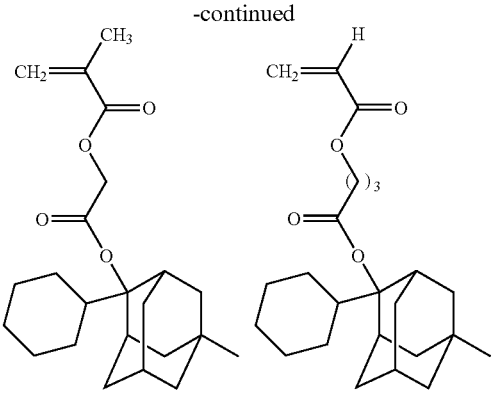
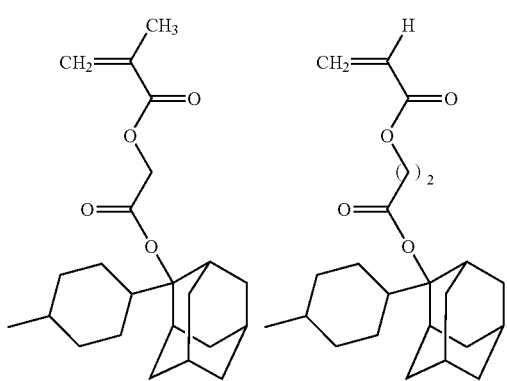
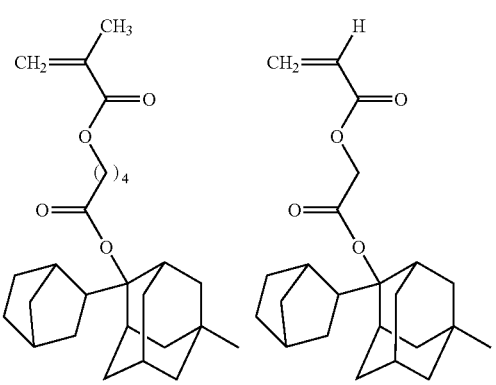
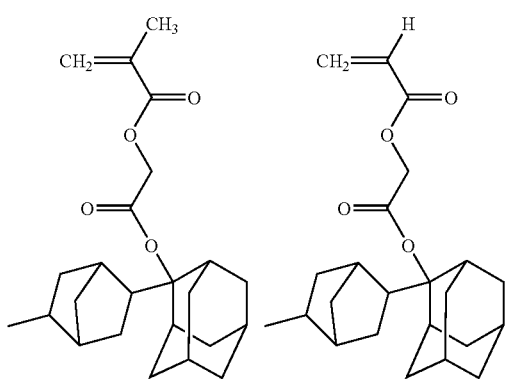
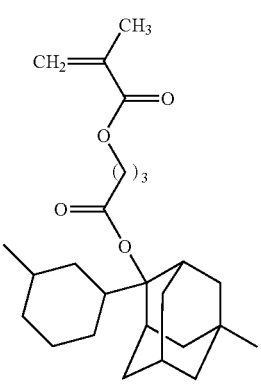
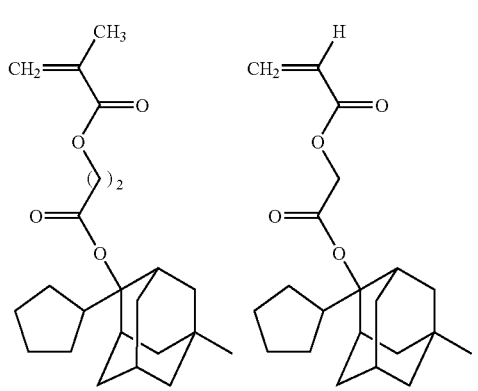
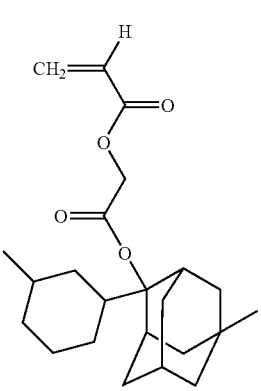

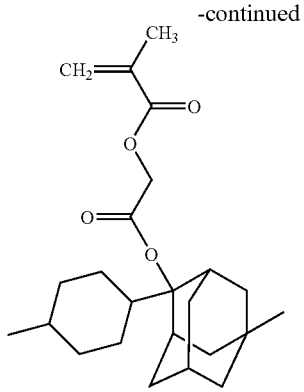
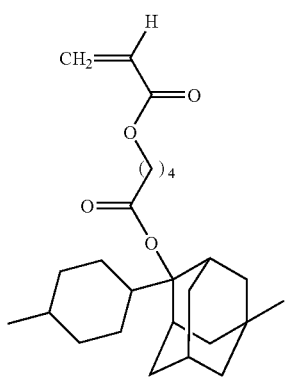
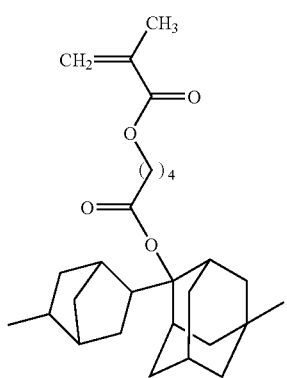
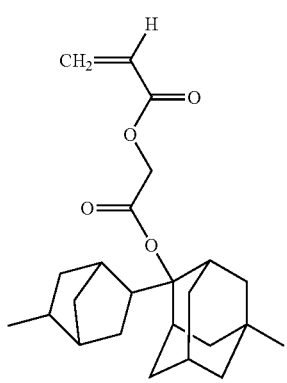
Examples of the monomer giving the structural unit represented by the formula (IIb) include the followings:
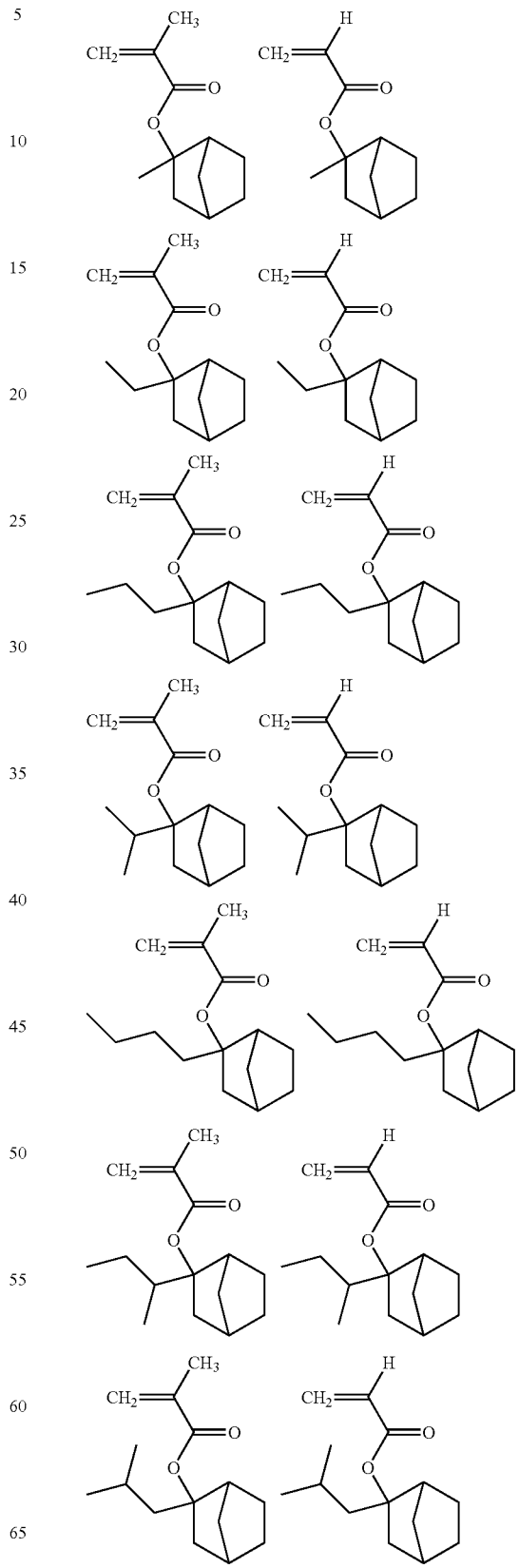

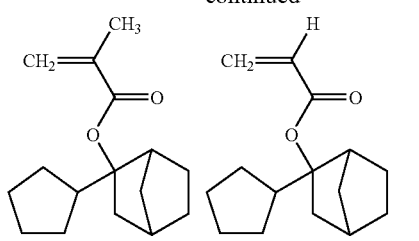
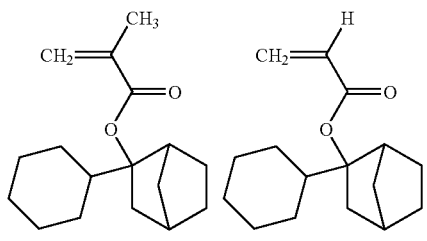
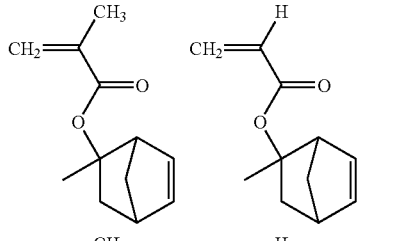
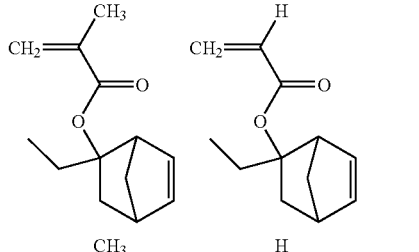
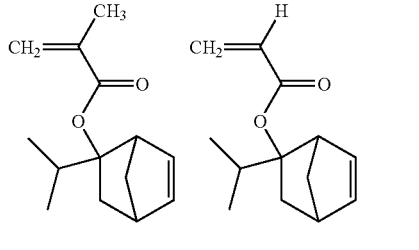
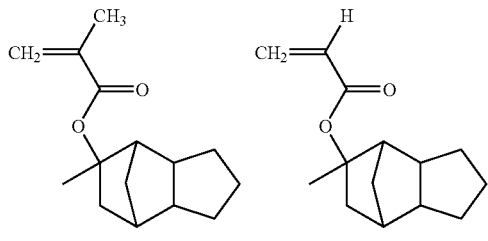
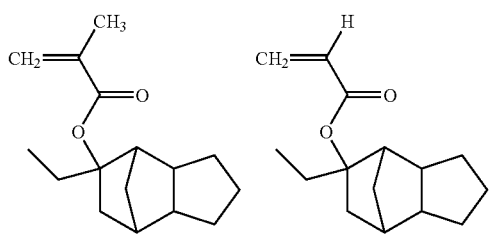
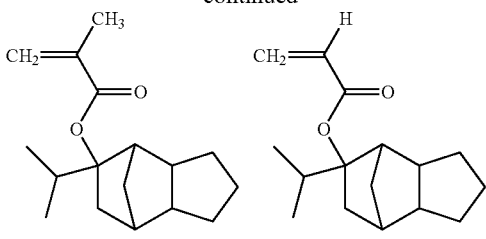
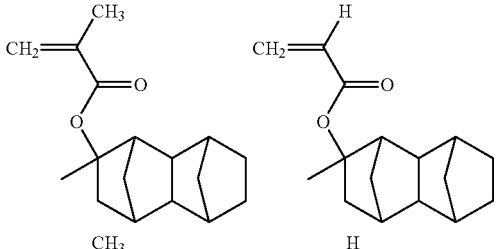
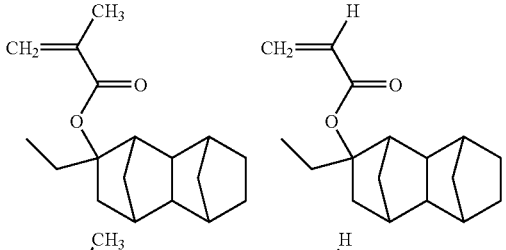
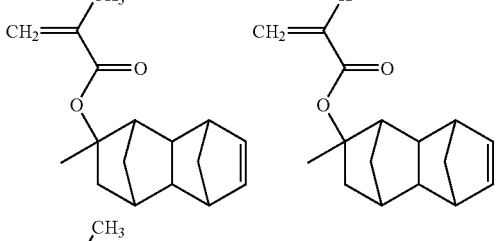
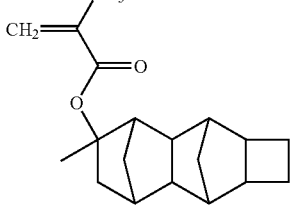
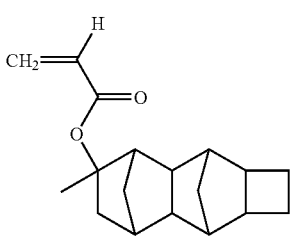
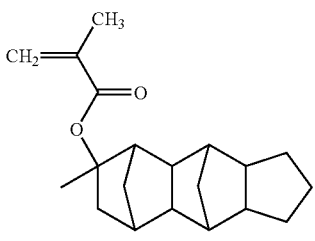

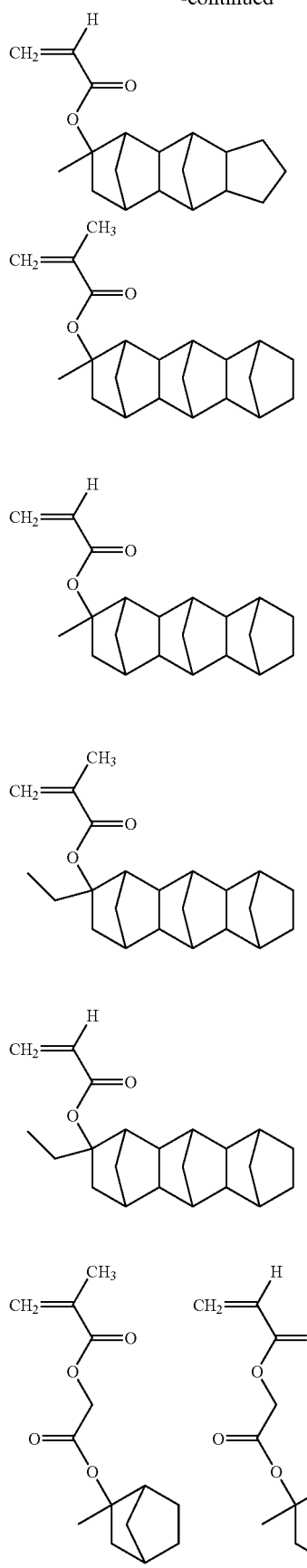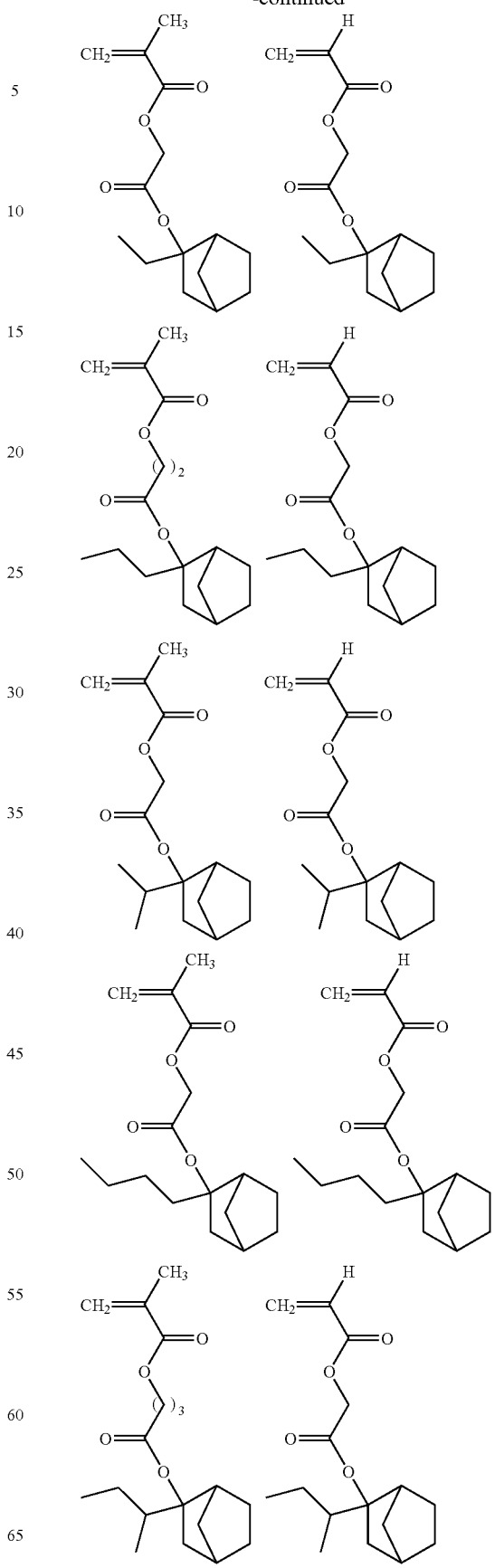

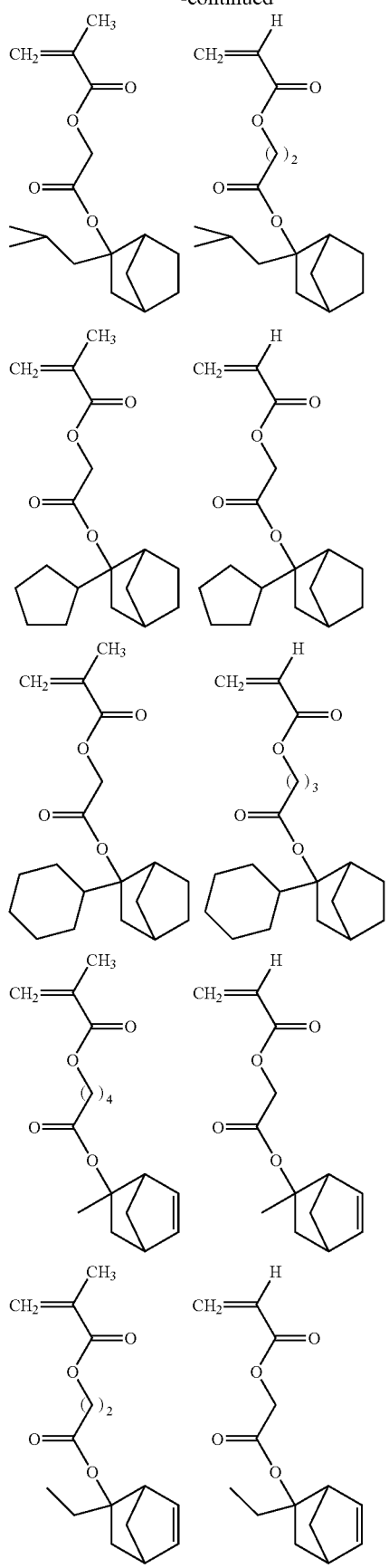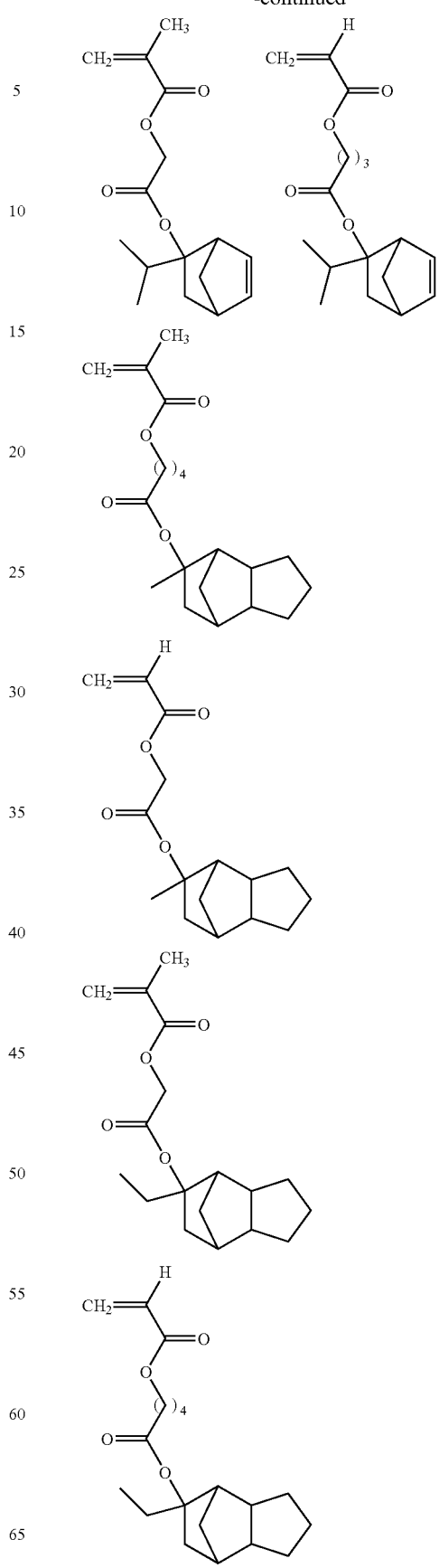

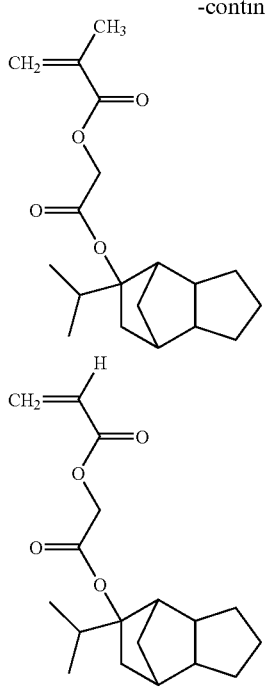

Among them, 2-methyl-2-adamantyl acrylate, 2-methyl-2-adamantyl methacrylate, 2-ethyl-2-adamantyl acrylate, 2-ethyl-2-adamantyl methacrylate, 2-isopropyl-2-adamantyl acrylate, 2-isopropyl-2-adamantyl methacrylate, (2-methyl-2-adamantyloxycarbonyl)methyl acrylate and (2-methyl-2-adamantyloxycarbonyl)methyl methacrylate are preferable, and 2-ethyl-2-adamantyl acrylate, 2-ethyl-2-adamantyl methacrylate, 2-isopropyl-2-adamantyl acrylate, 2-isopropyl-2-adamantyl methacrylate, (2-methyl-2-adamantyloxycarbonyl)methyl acrylate and (2-methyl-2-adamantyloxycarbonyl)methyl methacrylate are more preferable.

Examples of the other structural unit having an acid-labile group in its side chain include structural units represented by the formulae (IIc) and (IId).

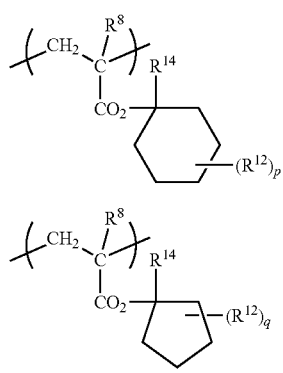

wherein $R^8$ is the same as defined above, $R^{12}$ is independently in each occurrence a C1-C8 alkyl group or a C1-C8 alkoxy group, $R^{14}$ represents a C1-C8 alkyl group, p represents an integer of 0 to 3 and q represents an integer of 0 to 3.

Examples of the C1-C8 alkyl group in $R^{12}$ and $R^{14}$ include a methyl group, an ethyl group, a propyl group, an isopropyl group, a butyl group, an isobutyl group, a sec-butyl group, a pentyl group, a hexyl group, a heptyl group and an octyl group. Examples of the C1-C8 alkoxy group in $R^{12}$ include a methoxy group, an ethoxy group, a propoxy group, an isopropoxy group, a butoxy group, an isobutoxy group, a sec-butoxy group, a pentyloxy group, a hexyloxy group, a heptyloxy group and an octyloxy group.

Examples of the monomer giving the structural unit represented by the formulae (IIc) and (IId) include the followings:

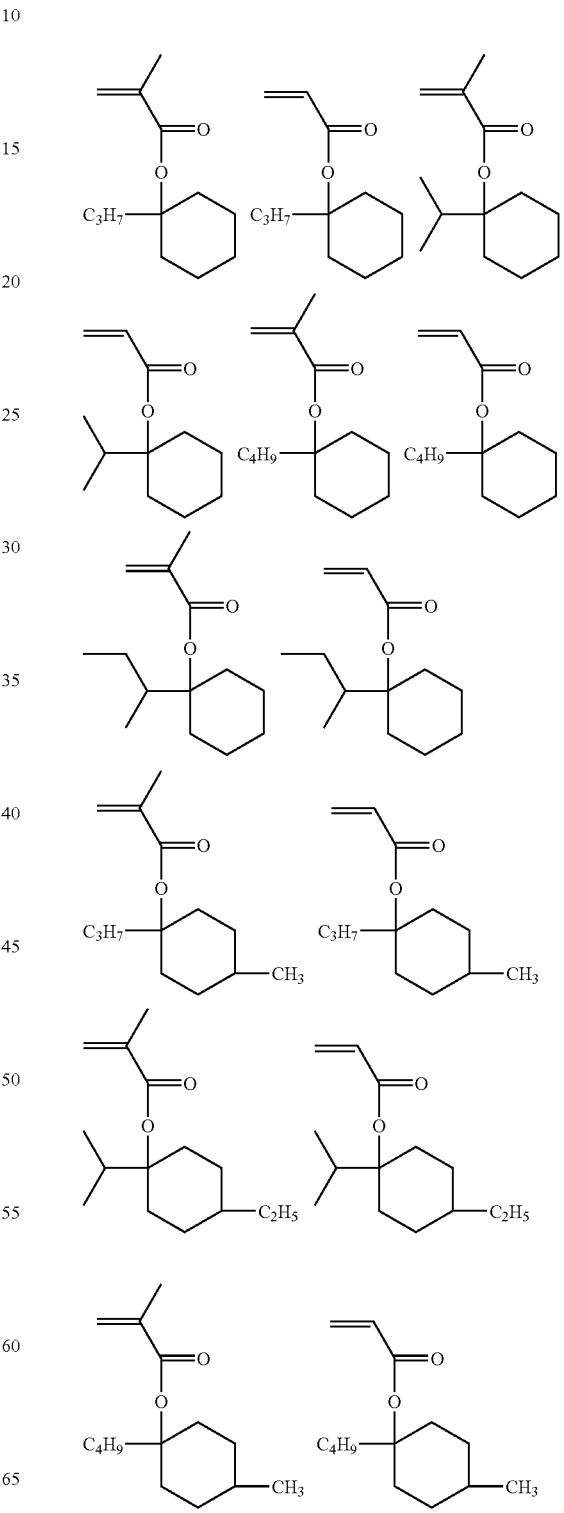

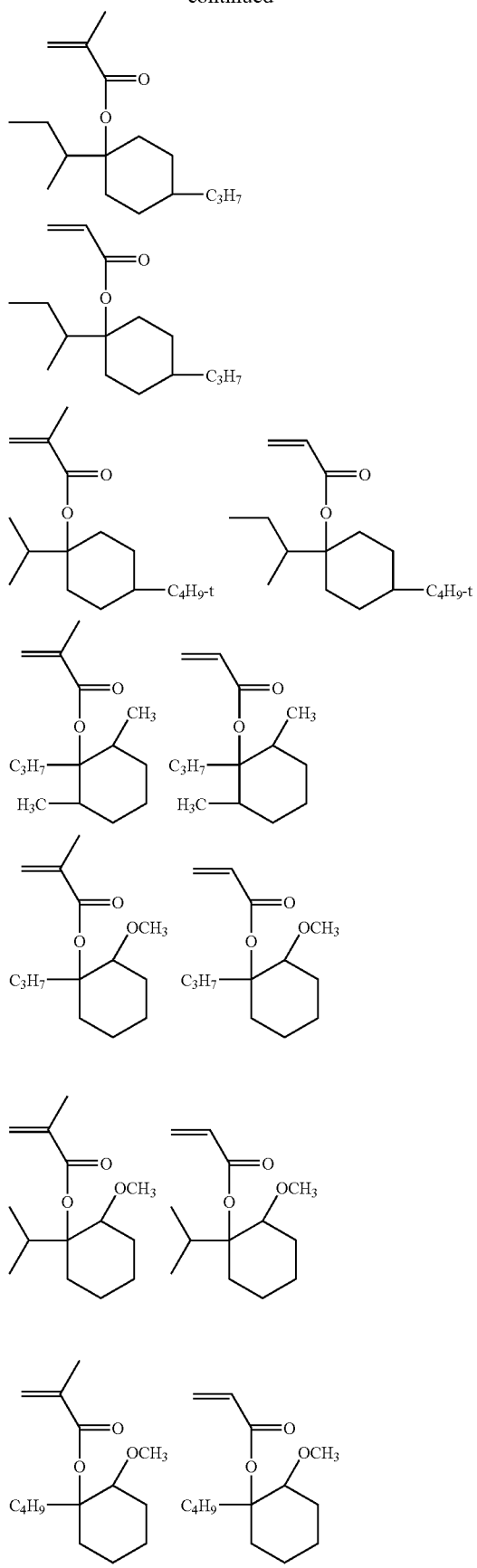
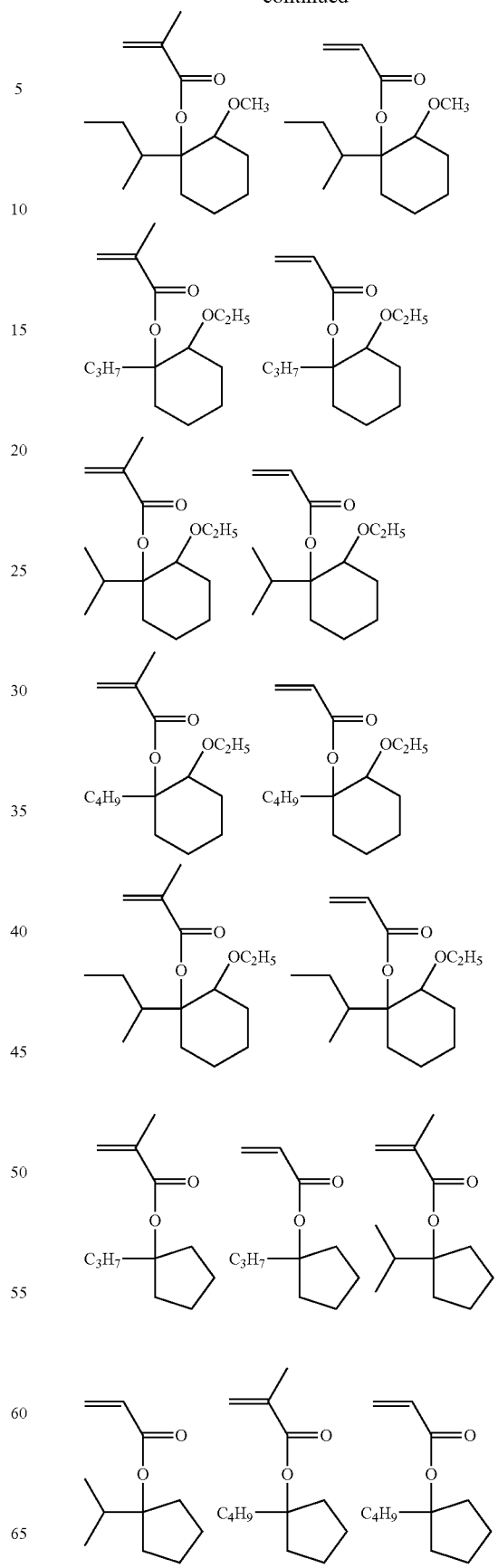

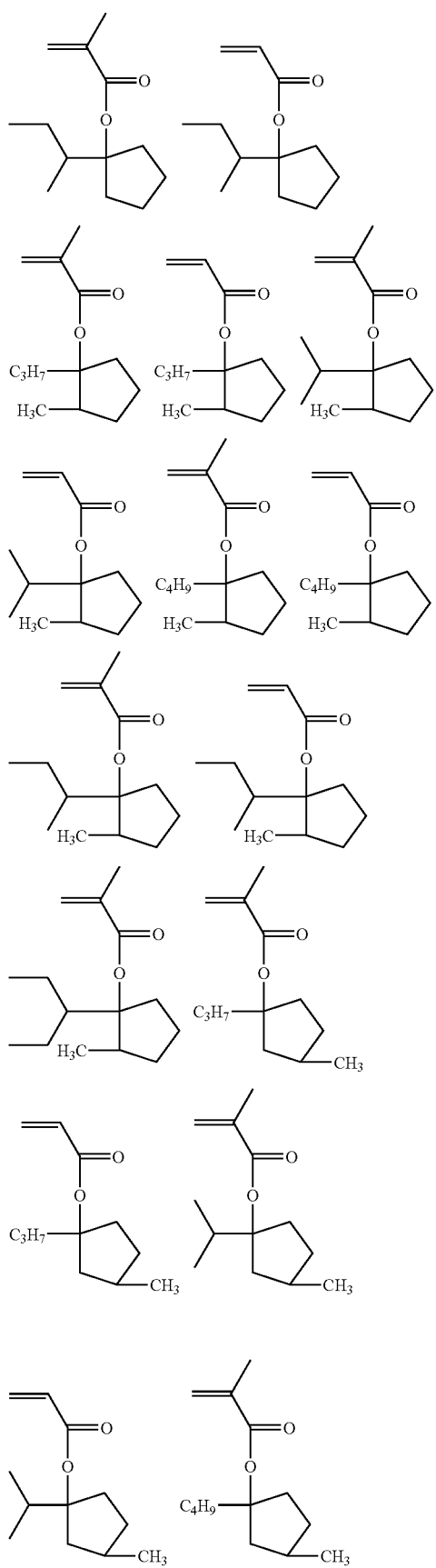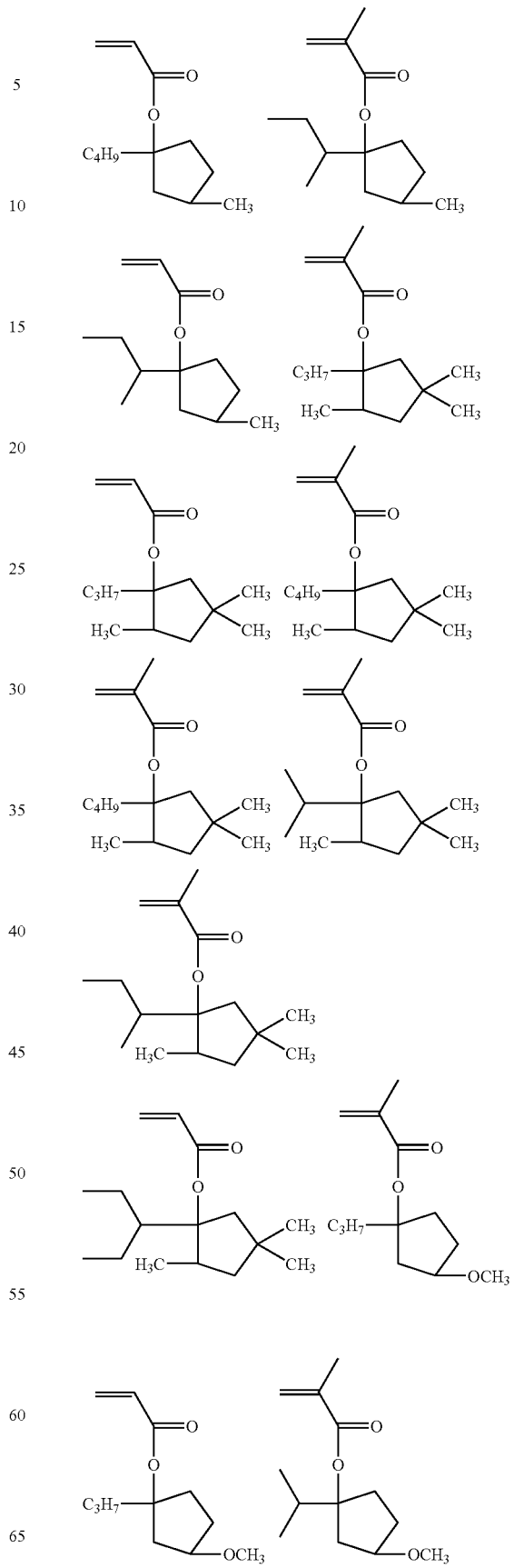

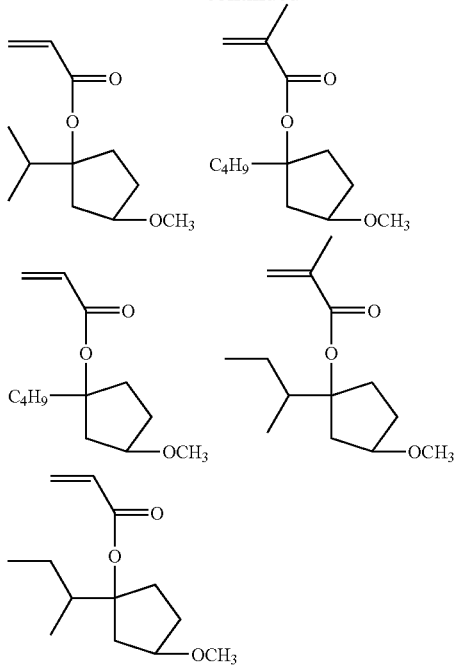

The monomers giving the structural unit represented by the formula (IIa), (IIb), (IIc) and (IId) can be produced, for example, by reacting acrylic halide or methacrylic halide with the corresponding alcohol compound or its alkali salt.

Resin (A) contains a structural unit represented by the formula (I):

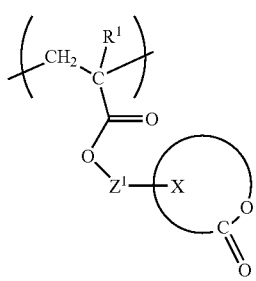

(I)

in addition to the structural unit having an acid-labile group in its side chain. Resin (A) may have two or more kinds of the structural unit represented by the formula (I).

In the formula (I), $R^1$ represents a hydrogen atom or a methyl group, $Z^1$ represents a single bond or —$(CH_2)_k$—CO—O—, and k represents an integer of 1 to 4. $Z^1$ is preferably a single bond or —$CH_2$—CO—O—, and more preferably a single bond. Ring X represents an unsubstituted or substituted C3-C30 cyclic hydrocarbon group having —COO—. Ring X has a lactone structure, and it may be a monocyclic lactone structure or a polycyclic lactone structure. Examples of the lactone structure include a β-butyrolactone structure, a γ-butyrolactone structure, a condensed lactone structure composed of a cycloalkane ring and a lactone ring, and a condensed lactone structure composed of a norbornane ring and a lactone ring.

The C3-C30 cyclic hydrocarbon group having —COO— may have one or more substituents, and examples of the substituents include a carboxyl group, a cyano group and a C1-C4 hydrocarbon group such as a methyl group.

As the structural unit represented by the formula (I), structural units represented by the formulae (Ia), (Ib) and (Ic):

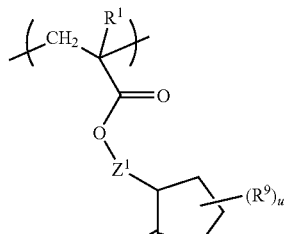

(Ia)

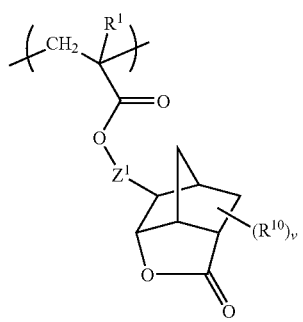

(Ib)

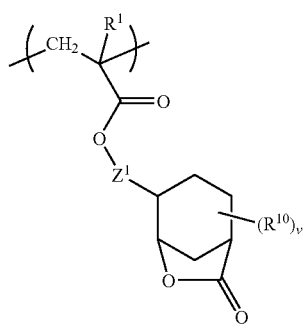

(Ic)

wherein $R^1$ and $Z^1$ are the same as defined above, $R^9$ represents a methyl group, $R^{10}$ is independently in each occurrence a carboxyl group, a cyano group or a C1-C4 hydrocarbon group, u represents an integer of 0 to 5 and v represents an integer of 0 to 3, are preferable, structural units represented by the formulae (Ia), (Ib) and (Ic) wherein $Z^1$ is a single bond or —$CH_2$—CO—O— are more preferable, and structural units represented by the formulae (Ia), (Ib) and (Ic) wherein $Z^1$ is a single bond are especially preferable.

Examples of the monomer giving the structural unit represented by the formulae (Ia), (Ib) and (Ic) include the followings:

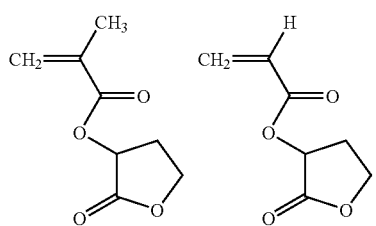

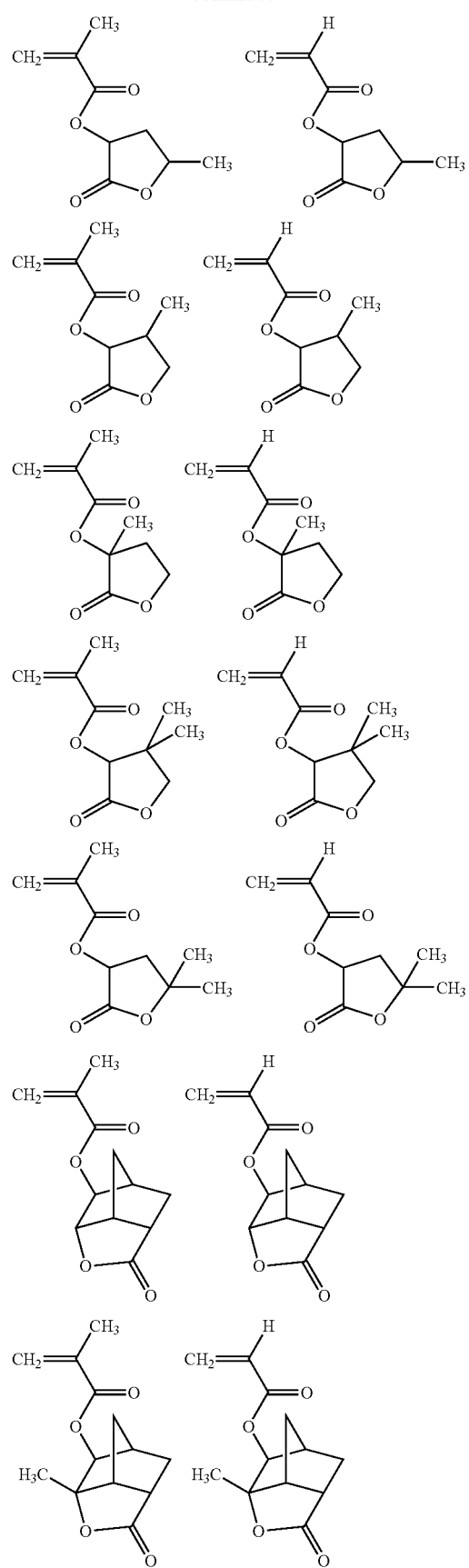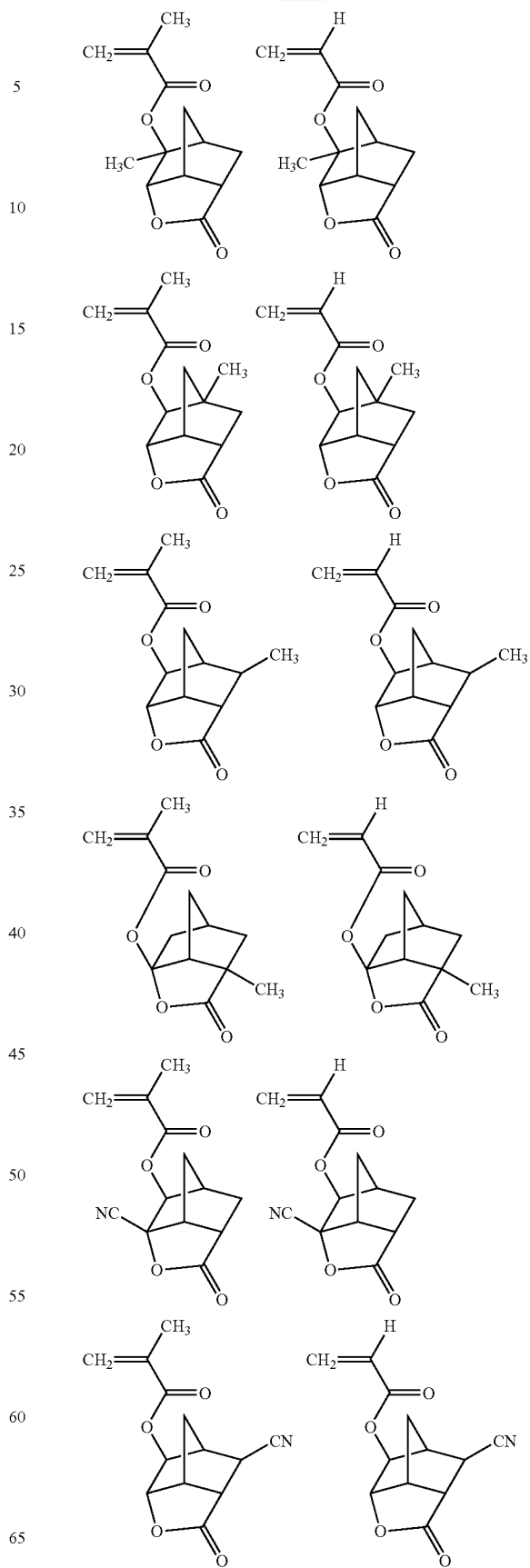

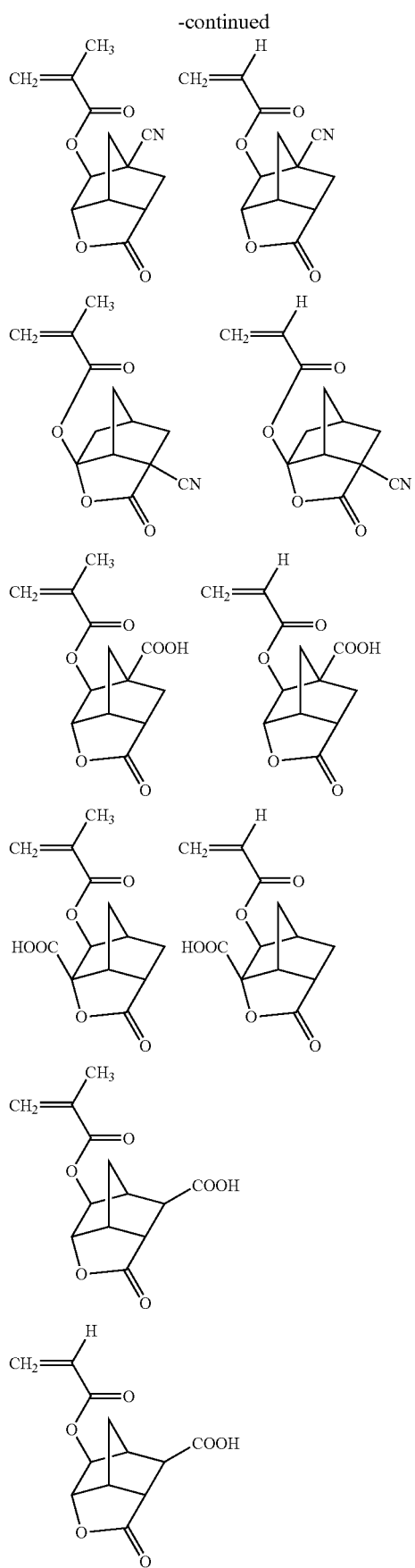
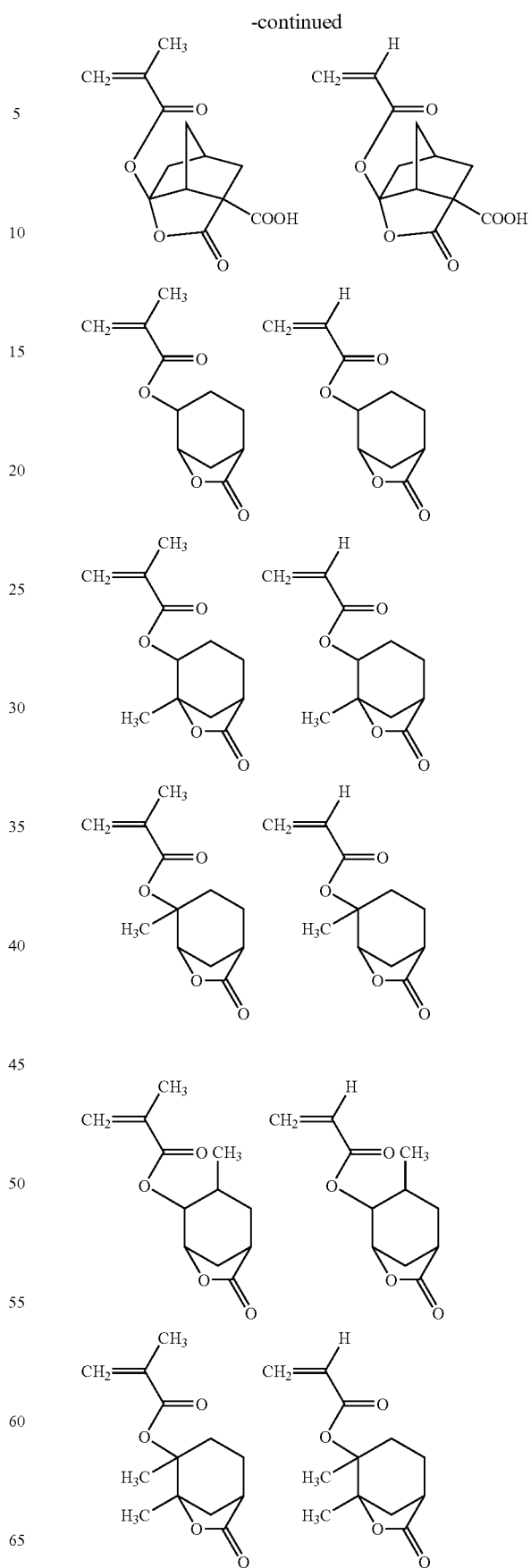

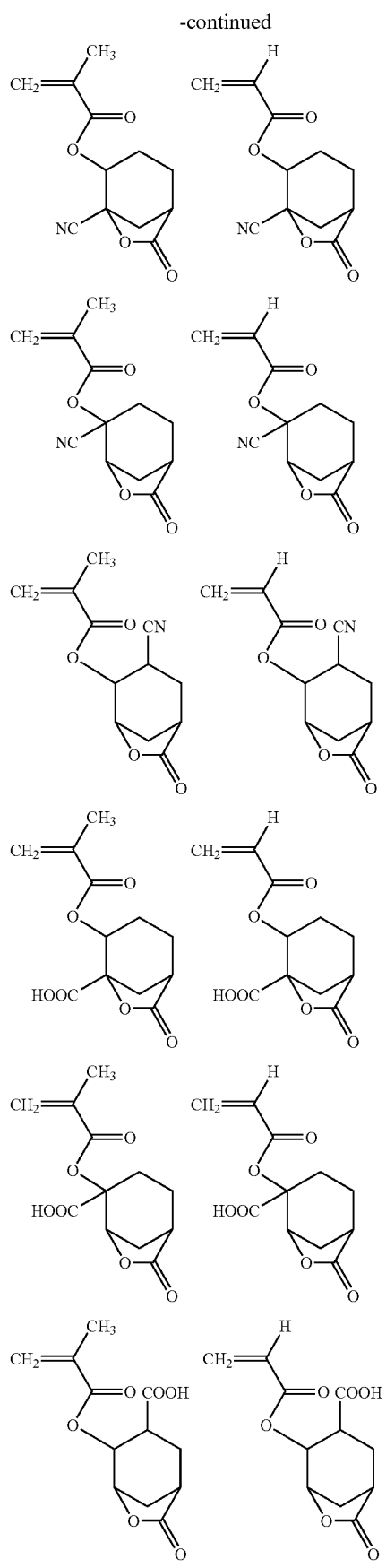
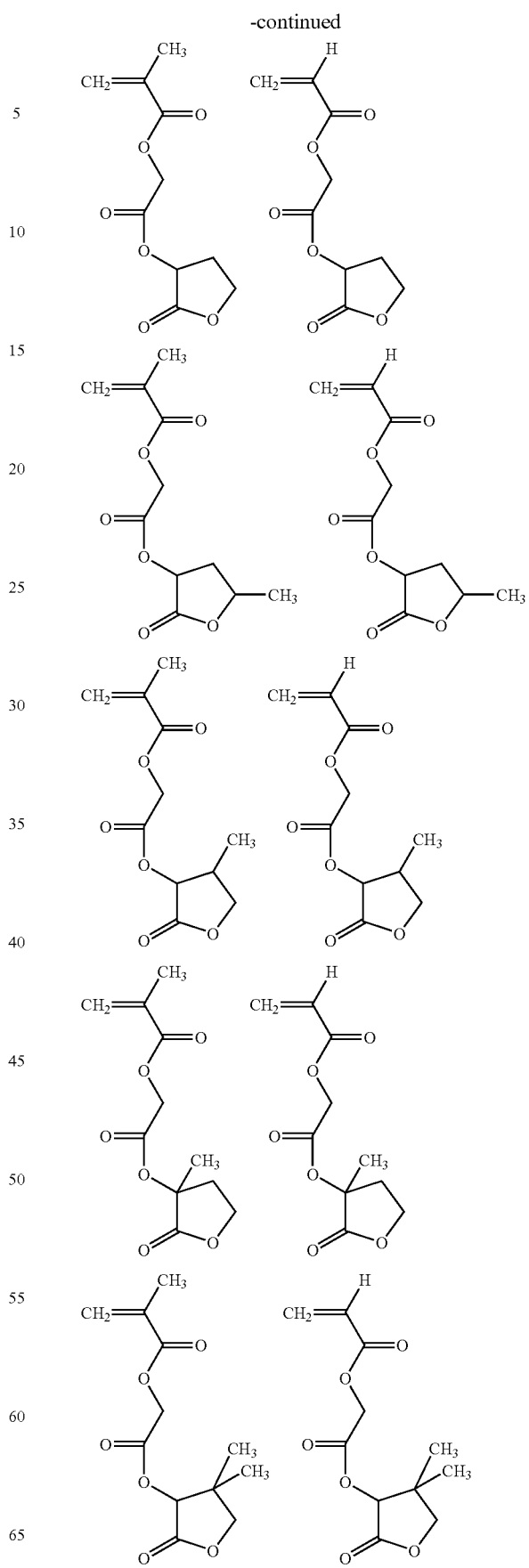

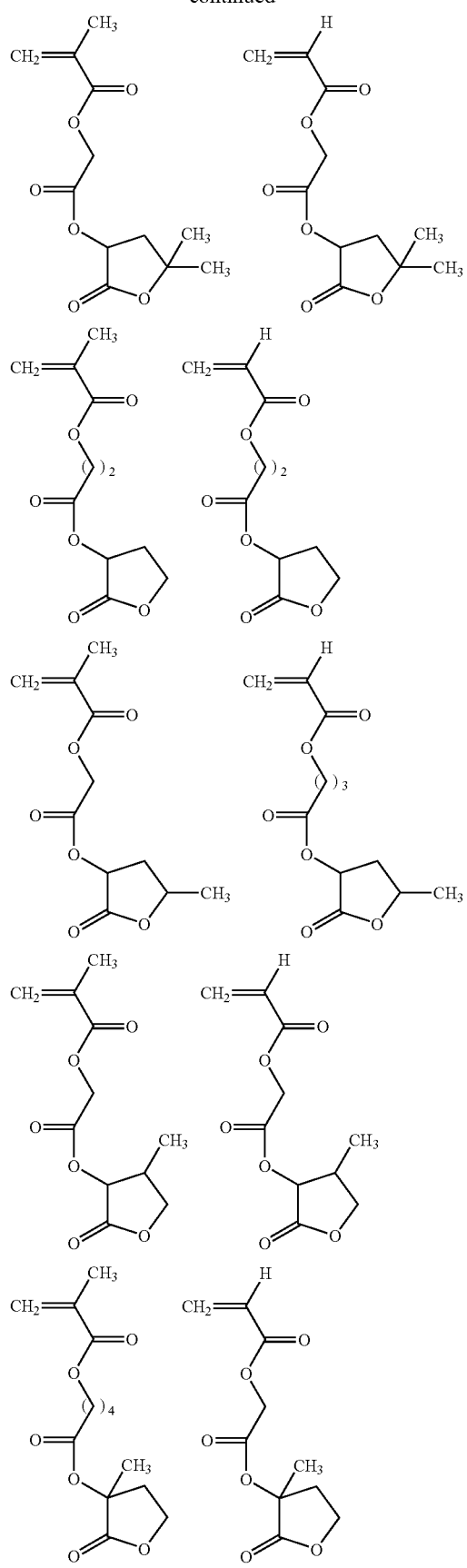
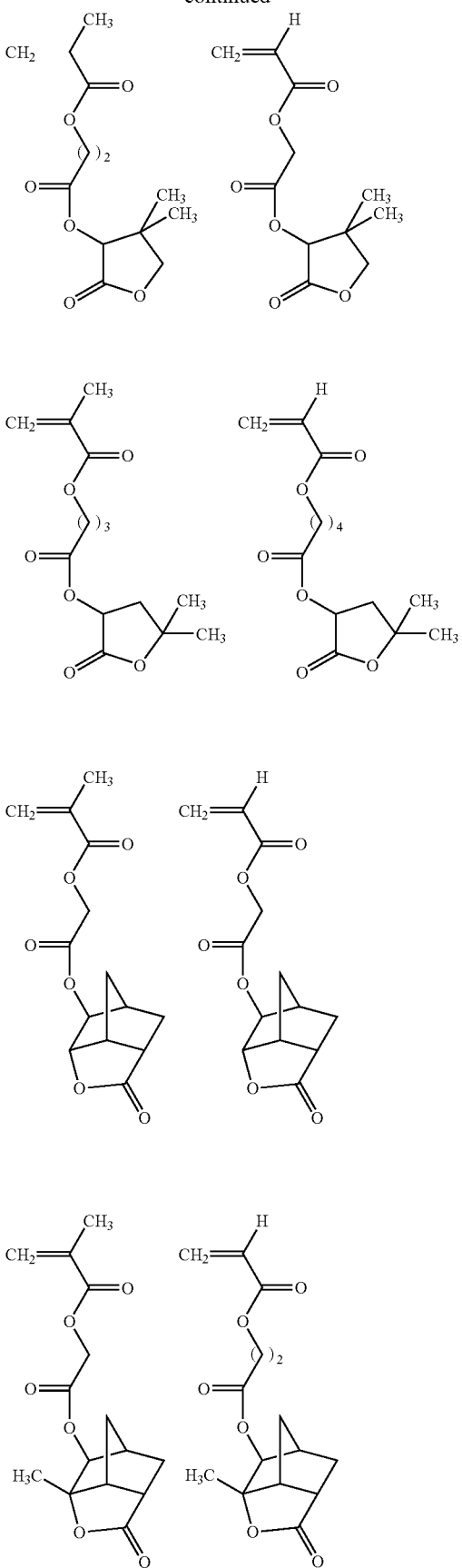

49
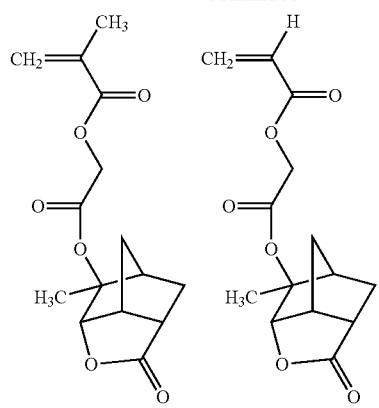
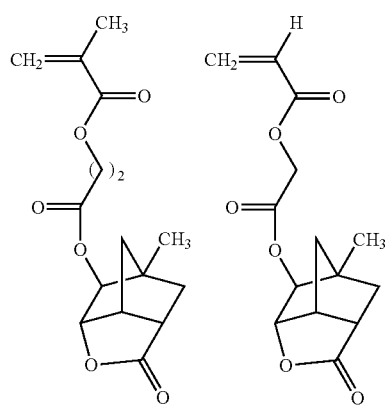
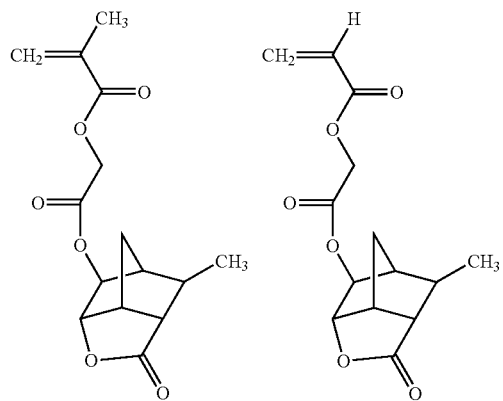
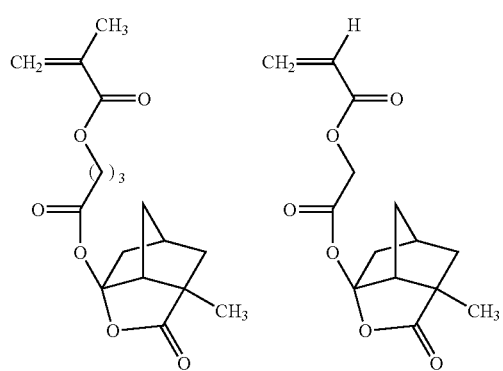
50
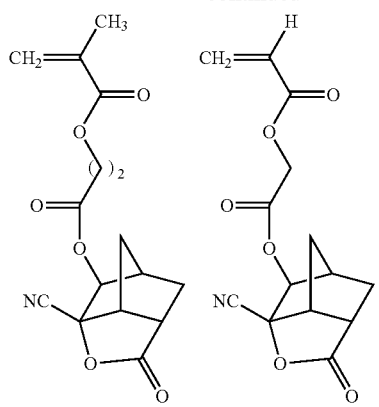
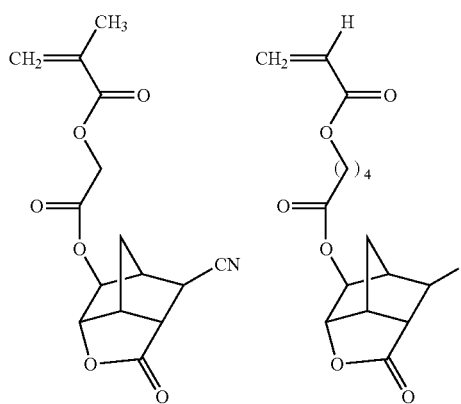
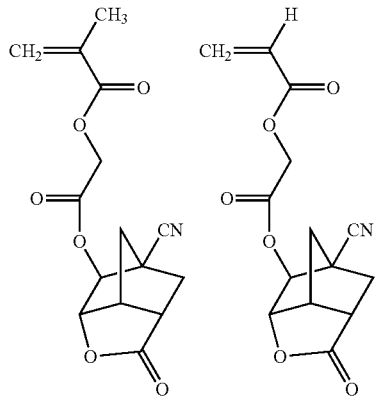
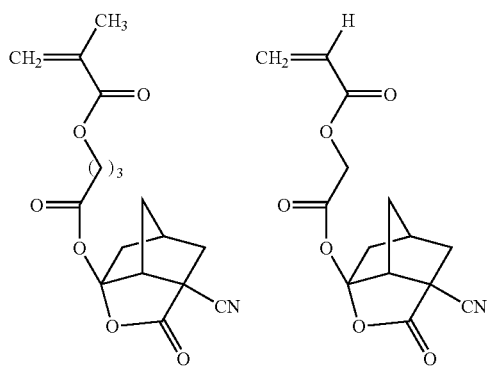

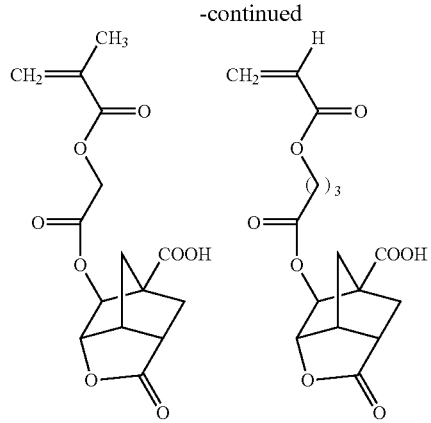
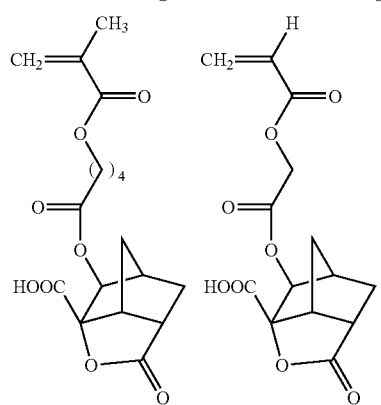
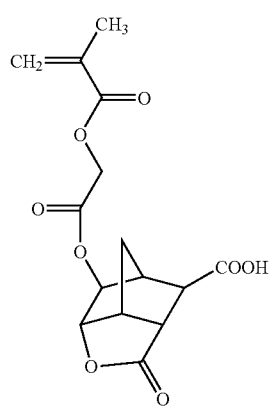
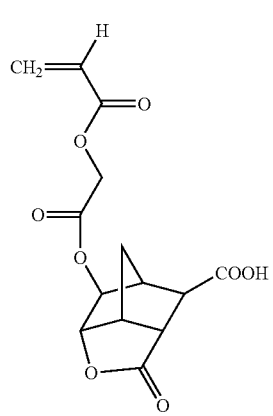
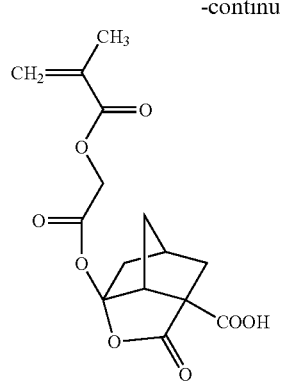
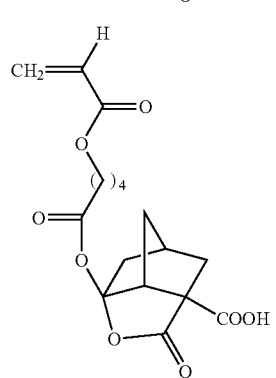
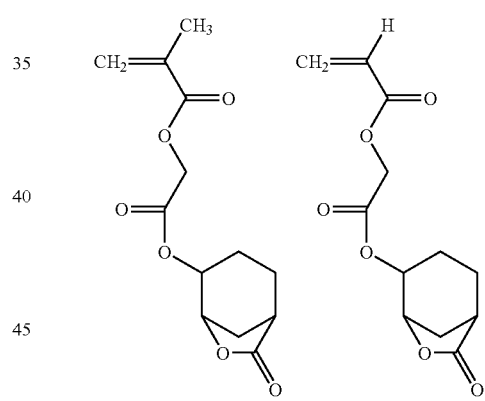
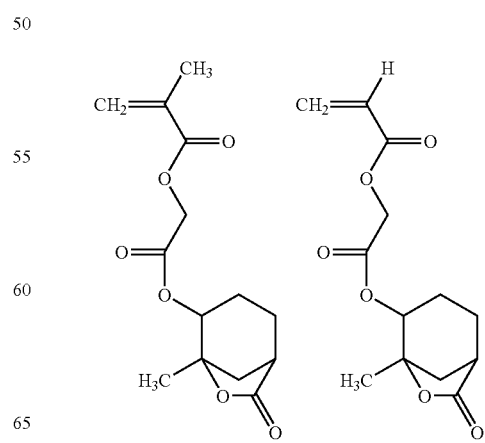

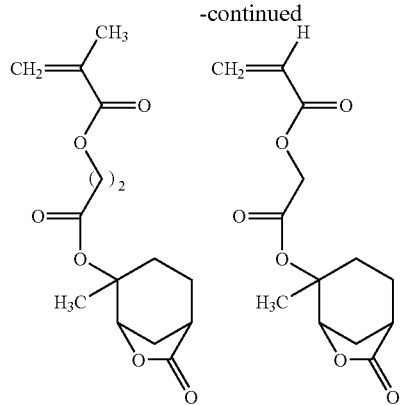
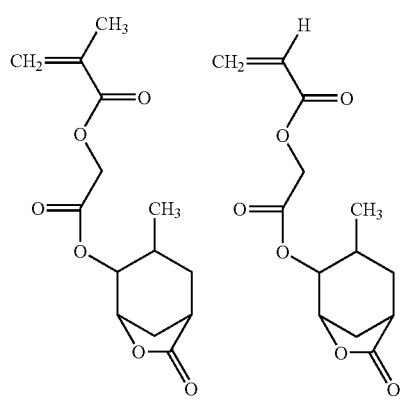
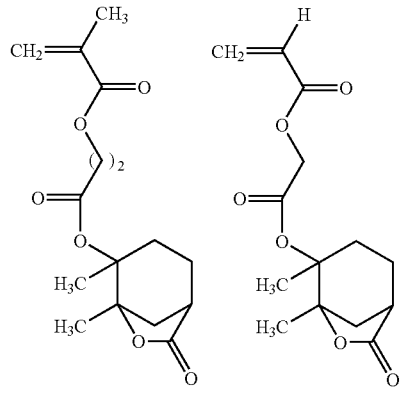
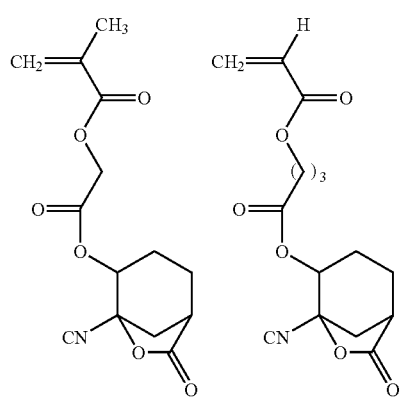
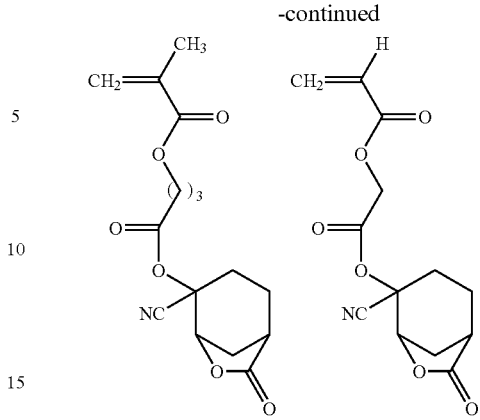
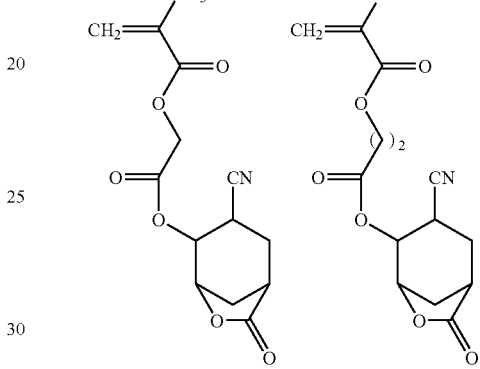
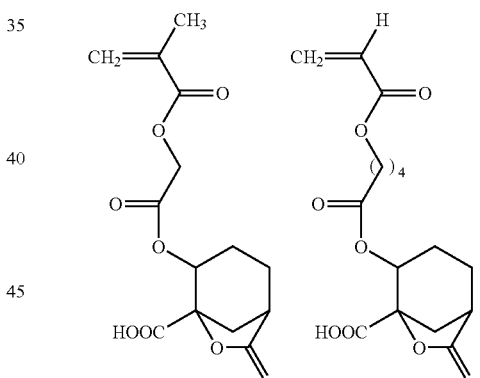
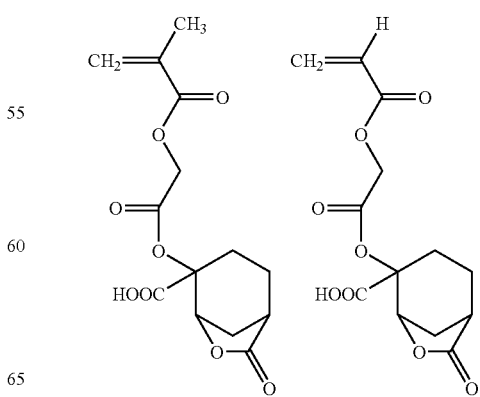

-continued

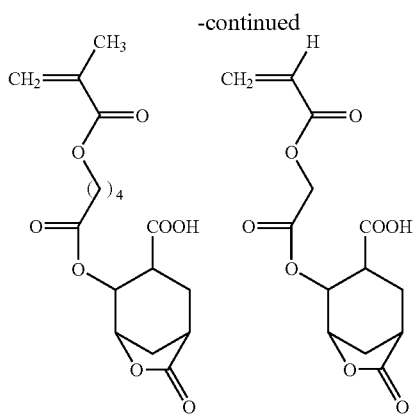

The structural units derived from hexahydro-2-oxo-3,5-methano-2H-cyclopenta[b]furan-6-ylacrylate, hexahydro-2-oxo-3,5-methano-2H-cyclopenta[b]furan-6-yl methacrylate, tetrahydro-2-oxo-3-furyl acrylate, tetrahydro-2-oxo-3-furyl methacrylate are preferable in viewpoint of the adhesiveness of resist composition to a substrate. The structural units derived from 2-(5-oxo-4-oxatricyclo[4.2.1.0$^{3.7}$]nonan-2-yloxy)-2-oxoethyl acrylate and 2-(5-oxo-4-oxatricyclo[4.2.1.0$^{3.7}$]nonan-2-yloxy)-2-oxoethyl methacrylate are preferable because the pattern having good profile can be obtained when the resin containing the above-mentioned structural unit is used in the present resist composition.

The monomers giving the structural units represented by the formula (I) can usually be produced by a reaction of the corresponding hydroxyl-containing lactone compound with an acrylic halide or methacrylic halide.

Resin (A) may contain a structural unit having one or more hydroxyl groups in its side chain other than the structural unit having an acid-labile group in its side chain and the structural unit represented by the formula (I). Resin (A) preferably contains a structural unit having one or more hydroxyl groups in its side chain. Resin (A) may contain two or more kinds of the structural unit having one or more hydroxyl groups in its side chain.

As the structural unit having one or more hydroxyl groups in its side chain, a structural unit represented by the formula (IV):

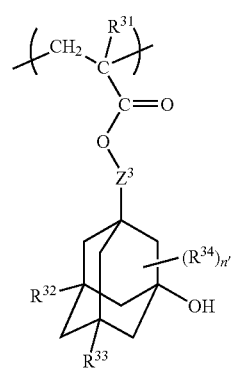

(IV)

wherein $R^{31}$ represents a hydrogen atom or a methyl group, $R^{32}$ and $R^{33}$ each independently represents a hydrogen atom, a methyl group or a hydroxyl group, $R^{34}$ represents a methyl group, n' represents an integer of 0 to 10, $Z^3$ represents a single bond or —(CH$_2$)$_y$—CO—O— and y represents an integer of 1 to 4, is preferable, and a structural unit represented by the formula (IV) wherein n' is 0 or 1 is more preferable. The structural unit represented by the formula (IV) wherein $R^{32}$ and $R^{33}$ each independently represents a hydrogen atom or a hydroxyl group is also preferable.

Examples of the monomer giving the structural unit represented by the formula (IV) include the followings.

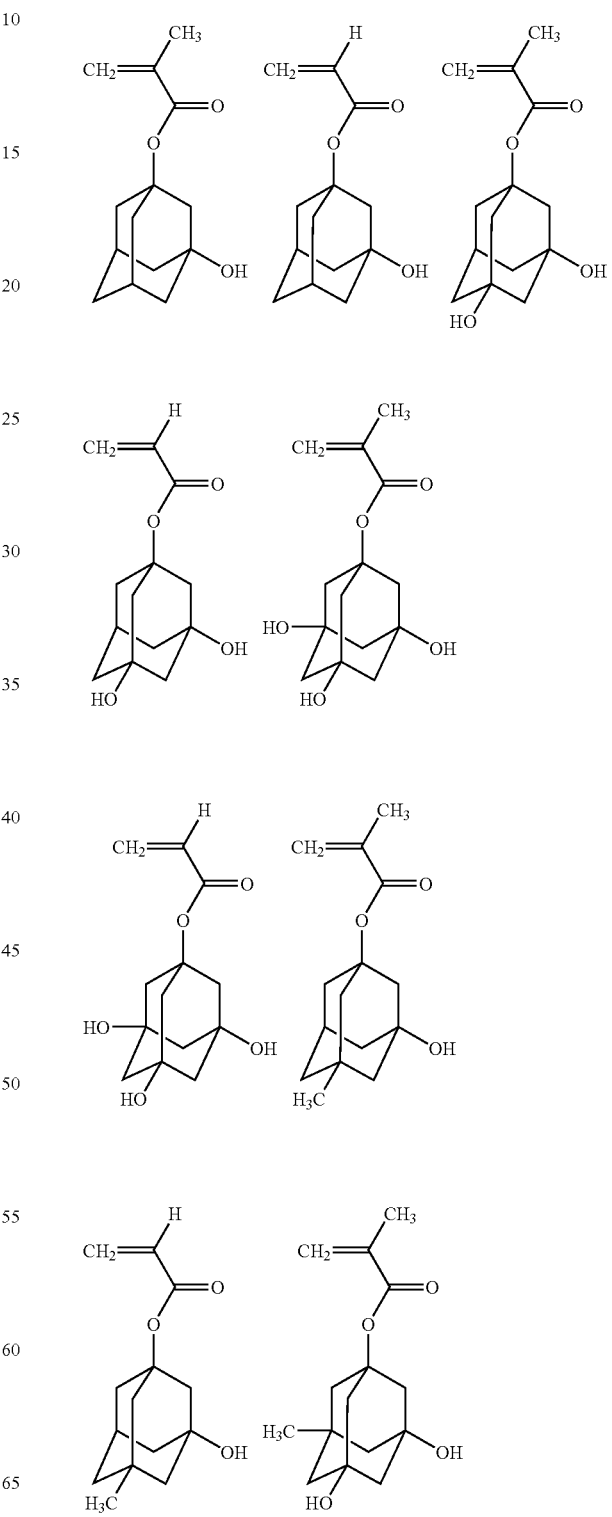

57
-continued
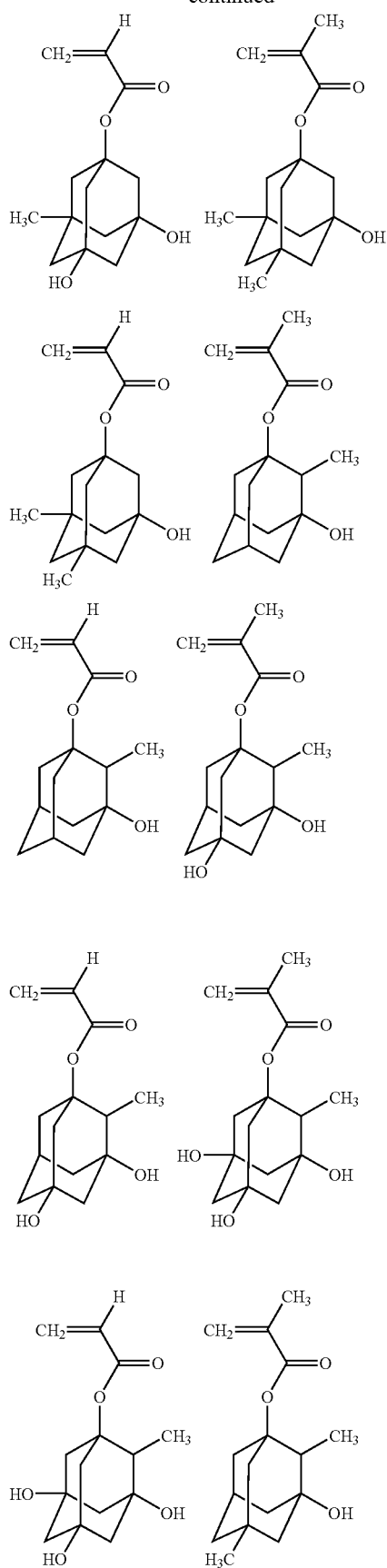
58
-continued
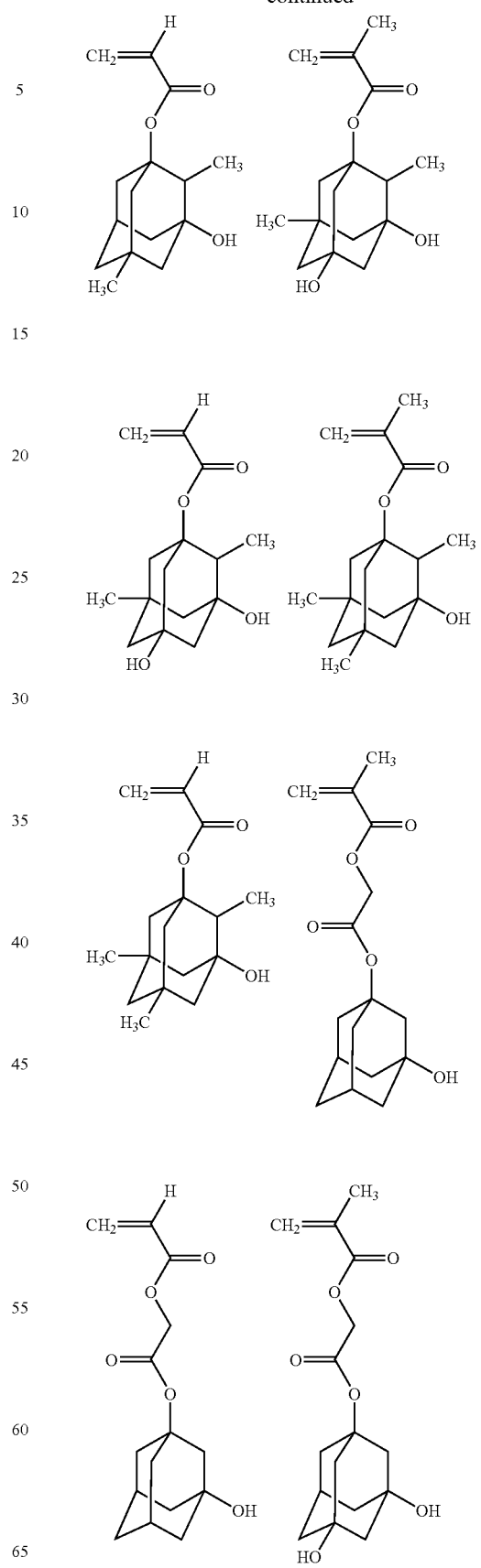

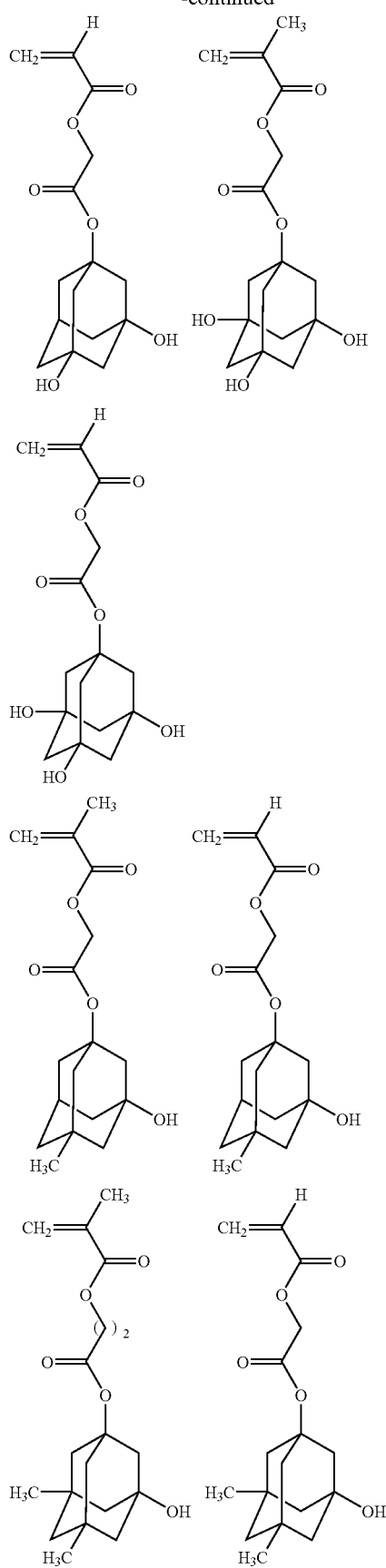
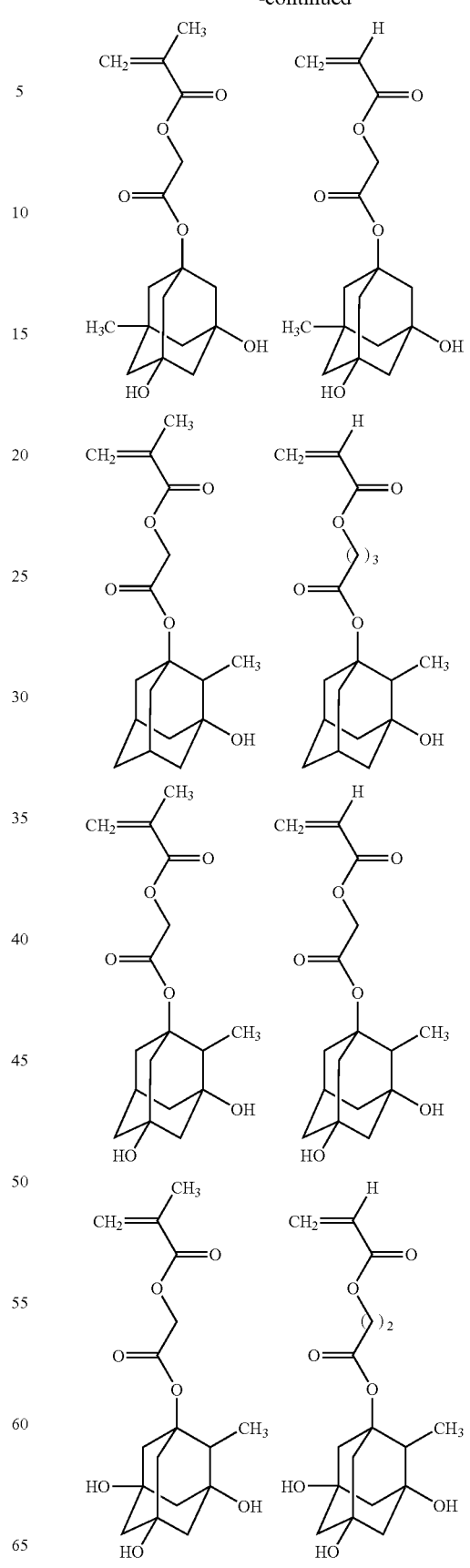

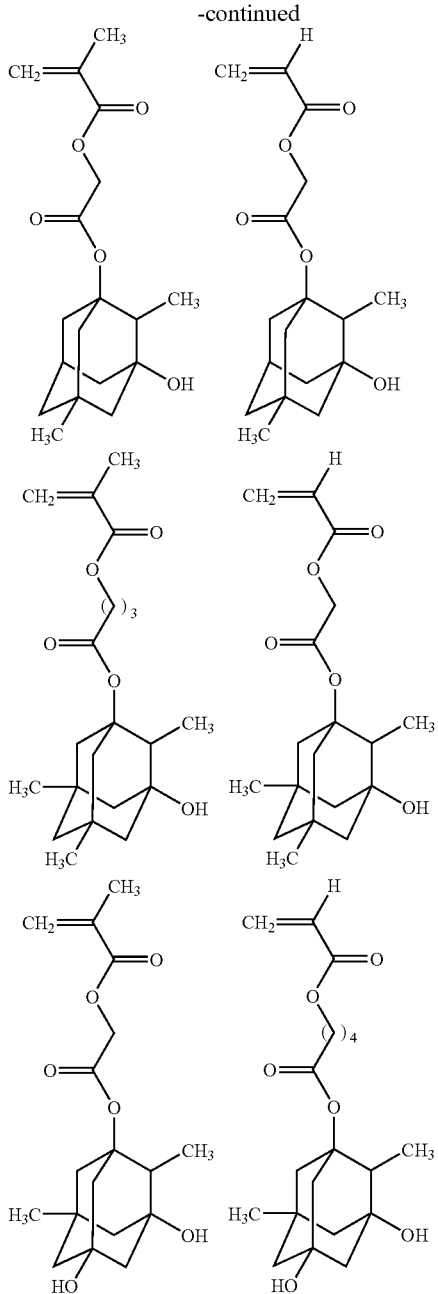

Among them, 3-hydroxy-1-adamantyl acrylate, 3-hydroxy-1-adamantyl methacrylate, 3,5-dihydroxy-1-adamantyl acrylate, 3,5-dihydroxy-1-adamantyl methacrylate, (3,5-dihydroxy-1-adamantyloxycarbonyl)methyl acrylate and (3,5-dihydroxy-1-adamantyloxycarbonyl)methyl methacrylate are preferable from the viewpoint of resolution.

The monomer giving the structural unit represented by the formula (IV) can be produced by a reaction of the corresponding hydroxyl-containing adamantane compound with an acrylic halide or a methacrylic halide.

The content of the structural unit having an acid-labile group in its side chain in Resin (A) is usually 10 to 80 mol % and preferably 15 to 45 mol %, and the content of the structural unit represented by the formula (I) in Resin (A) is usually 90 to 20 mol % and preferably 85 to 55 mol %.

The content of the structural unit having one or more hydroxyl groups in its side chain such as the structural unit represented by the formula (IV) in Resin (A) is usually 0 to 40 mol % and preferably 5 to 35 mol % based on the total molar of all structural units of Resin (A).

Resin (A) may contain a structural unit derived from an alicyclic compound having an olefinic double bond. Examples of the structural unit derived from an alicyclic compound having an olefinic double bond include a structural unit represented by the formula (d):

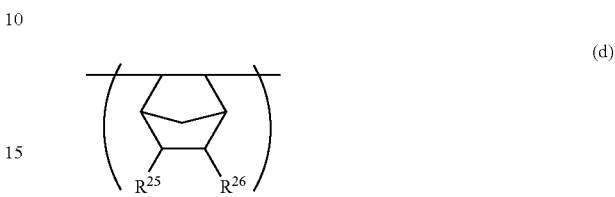

wherein $R^{25}$ and $R^{26}$ each independently represents a hydrogen atom, a C1-C3 alkyl group, a C1-C3 hydroxyalkyl group, a carboxyl group, a cyano group, a hydroxyl group or a —COOU group in which U represents an alcohol residue, or $R^{25}$ and $R^{26}$ can be bonded together to form a carboxylic anhydride residue represented by —C(=O)OC(=O)—; a structural unit derived from an aliphatic unsaturated dicarboxylic anhydride such as a structural unit represented by the formula (e):

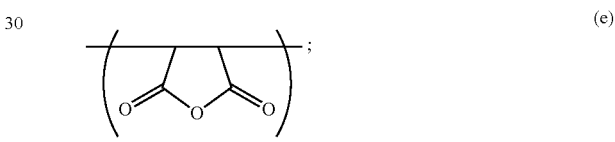

and
a structural unit represented by the formula (f):

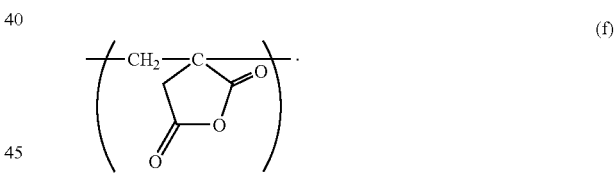

Resin (A) containing a structural unit derived from 2-norbornene shows strong structure because the alicyclic group is directly present on its main chain and shows a property that dry etching resistance is more excellent. The structural unit derived from 2-norbornene can be introduced into the main chain by radical polymerization using, for example, an aliphatic unsaturated dicarboxylic anhydride such as maleic anhydride and itaconic anhydride together in addition to corresponding 2-norbornene. The structural unit derived from 2-norbornene is formed by opening of its double bond, and can be represented by the above-mentioned formula (d). The structural units derived from maleic anhydride and from itaconic anhydride, which are the structural units derived from aliphatic unsaturated dicarboxylic anhydrides, are formed by opening of their double bonds, and can be represented by the above-mentioned formulae (e) and (f), respectively.

In $R^{25}$ and $R^{26}$, examples of the C1-C3 alkyl group include a methyl group, an ethyl group, and a propyl group, and examples of the C1-C3 hydroxyalkyl group include a hydroxymethyl group and a 2-hydroxyethyl group.

In $R^{25}$ and $R^{26}$, the —COOU group is an ester formed from the carboxyl group, and examples of the alcohol residue corresponding to U include an optionally substituted C1-C8 alkyl group, a 2-oxooxolan-3-yl group and a 2-oxooxolan-4-yl group, and examples of the substituent on the C1-C8 alkyl group include a hydroxyl group and an alicyclic hydrocarbon residue.

Specific examples of the monomer giving the structural unit represented by the above-mentioned formula (d) include 2-norbornene, 2-hydroxy-5-norbornene, 5-norbornene-2-carboxylic acid, methyl 5-norbornene-2-carboxylate, 2-hydroxyethyl 5-norbornene-2-carboxylate, 5-norbornene-2-methanol and 5-norbornene-2,3-dicarboxylic anhydride.

When U in the —COOU group is the acid-labile group, the structural unit represented by the formula (d) is a structural unit having the acid-labile group even if it has the norbornane structure. Examples of monomers giving structural unit having the structural unit represented by the above-mentioned formula (d) and the acid-labile group include tert-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl)-1-methylethyl 5-norbornene-2-carboxylate, 1-(4-hydroxylcyclohexyl)-1-methylethyl 5-norbornene-2-carboxylate, 1-methyl-1-(4-oxocyclohexyl)ethyl 5-norbornene-2-carboxylate, and 1-(1-adamantyl)-1-methylethyl 5-norbornene-2-carboxylate.

Resin (A) has usually polystyrene-equivalent weight-average molecular weight of about 1,000 to 500,000, and preferably of 4,000 to 50,000.

Resin (B) contains a structural unit represented by the formula (III):

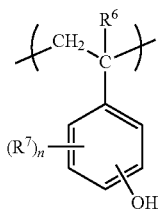
(III)

in addition to the structural unit having an acid-labile group in its side chain. Resin (B) may have two or more kinds of the structural unit represented by the formula (III).

In the formula (III), $R^6$ represents a hydrogen atom or a methyl group, $R^7$ is independently in each occurrence a linear or branched chain C1-C6 alkyl group. Examples of the linear or branched chain C1-C6 alkyl group include a methyl group, an ethyl group, a propyl group, an isopropyl group, a butyl group, a isobutyl group, a pentyl group and a hexyl group, and a methyl group is preferable. In the formula (III), n represents an integer of 0 to 4, and n is preferably 0 or 1, and more preferably 0.

In the formula (III), a hydroxyl group may be bonded at ortho-position, meta-position or para-position.

The structural unit represented by the following formula:

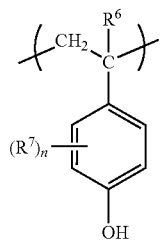

wherein $R^6$, $R^7$ and n are the same meanings as defined above, is preferable.

Examples of the structural unit represented by the formula (III) include the followings.

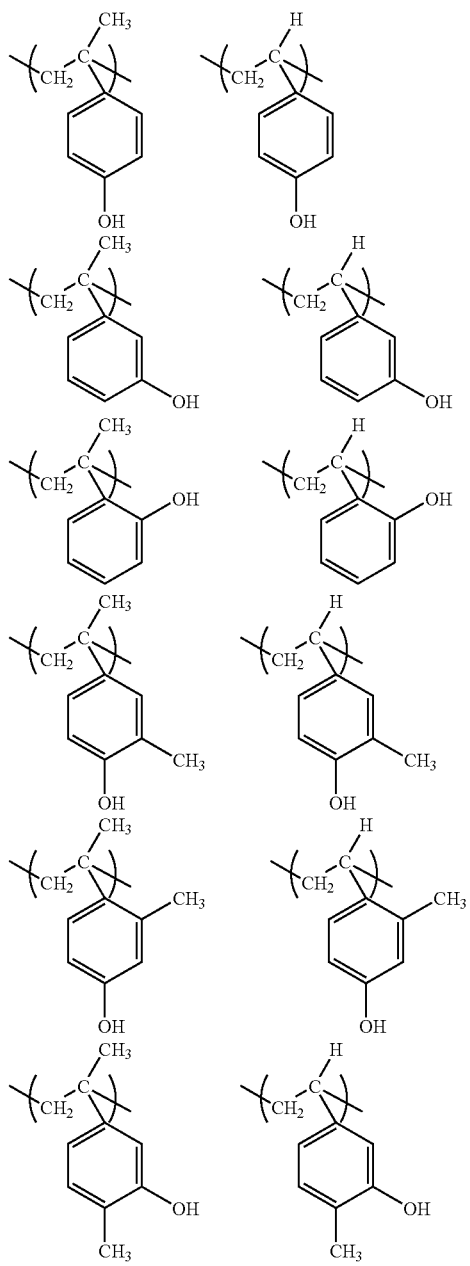

-continued

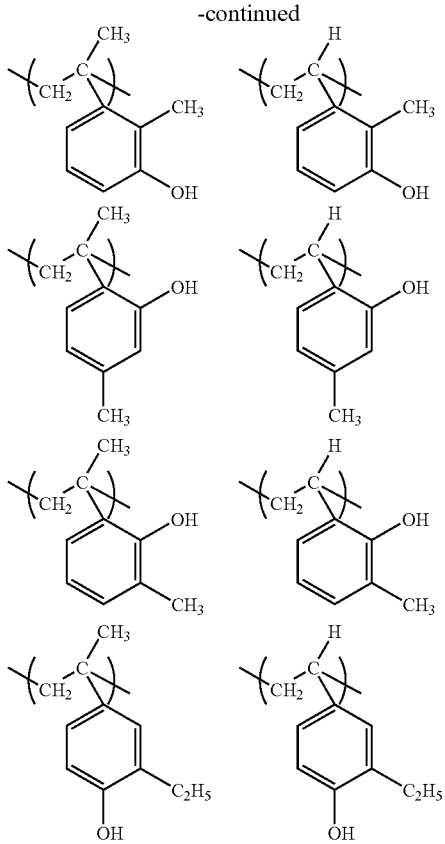

Among them, a structural unit derived from 4-hydroxystyrene and a structural unit derived from 4-hydroxy-α-styrene are preferable.

The structural unit represented by the formula (III) can be derived from a monomer represented by the formula:

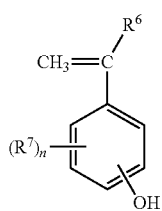

wherein $R^6$, $R^7$ and n are the same as defined above.

The molar ratio of the structural unit having an acid-labile group in its side chain to the structural unit represented by the formula (III) (the structural unit having an acid-labile group in its side chain/the structural unit represented by the formula (III)) in Resin (B) is usually 10/90 to 90/10 and preferably 65/35 to 85/15 from the viewpoint of resolution and pattern profile.

Resin (B) has usually polystyrene-equivalent weight-average molecular weight of about 1,000 to 500,000, and preferably of 4,000 to 50,000.

Resin (A) and Resin (B) can be produced by conducting the polymerization reaction of the corresponding monomers, respectively. Resin (A) and Resin (B) can be also produced by conducting the oligomerization reaction of the corresponding monomers followed by polymerizing the obtained oligomer, respectively.

The polymerization reaction is preferably carried out the presence of a radical initiator.

The radical initiator is not limited and examples thereof include an azo compound such as 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile), 2,2'-azobis(2,4-dimethyl-4-methoxyvaleronitrile), dimethyl-2,2'-azobis(2-methylpropionate) and 2,2'-azobis(2-hydroxymethylpropionitrile); an organic hydroperoxide such as lauroyl peroxide, tert-butyl hydroperoxide, benzoyl peroxide, tert-butyl peroxybenzoate, cumene hydroperoxide, diisopropyl peroxydicarbonate, di-n-propyl peroxydicarbonate, tert-butyl peroxyneodecanoate, tert-butyl peroxypivalate and 3,5,5-trimethylhexanoyl peroxide; and an inorganic peroxide such as potassium peroxodisulfate, ammoniumperoxodisulfate and hydrogen peroxide. Among them, the azo compound is preferable.

These radical initiators may be used alone or in a form of a mixture of two or more kinds thereof. When the mixture of two or more kinds thereof is used, the mixed ratio is not limited.

The amount of the radical initiator is preferably 1 to 20% by mole based on total molar amounts of all monomers or oligomers.

The polymerization temperature is usually 0 to 150° C., and preferably 40 to 100° C.

The polymerization reaction is usually carried out in the presence of a solvent and it is preferred to use a solvent which is sufficient to dissolve the monomer, the radical initiator, Resin (A) and Resin (B). Examples thereof include hydrocarbons such as toluene; ethers such as 1,4-dioxane and tetrahydrofuran; ketones such as methyl isobutyl ketone; alcohols such as isopropyl alcohol; cyclic esters such as γ-butyrolactone; glycol ether esters such as propylene glycol monomethyl ether acetate; and acyclic esters such as ethyl lactate. These solvents may be used alone and a mixture thereof may be used.

The amount of the solvent is not limited, and practically, it is preferably 1 to 5 parts by weight per 1 part of all monomers or oligomers.

After completion of the polymerization reaction, the produced polymer can be isolated, for example, by adding a solvent in which the present polymer is insoluble or poorly soluble to the reaction mixture obtained and filtering the precipitated resin. If necessary, the isolated polymer may be purified, for example, by washing with a suitable solvent.

Alternatively, Resin (B) can be also produced by using a polyvinylphenol. Examples of the polyvinylphenol include a commercially available polyvinylphenol, a polyvinylphenol produced according to the methods described in JP 2000-178325 A or the like.

The present resist composition comprises Resin (A), Resin (B) and an acid generator.

The present resist composition may contain two or more kinds of Resin (A), and may contain two or more kinds of Resin (B).

The weight ratio of Resin (A) to Resin (B) (Resin (A)/Resin (B)) is usually 1/10 to 10/1 and preferably 1/3 to 3/1.

The present resist composition may contain two or more kinds of an acid generator.

The acid generator is a substance which is decomposed to generate an acid by applying a radiation such as a light, an electron beam or the like on the substance itself or on a resist composition containing the substance. The acid generated from the acid generator acts on Resin (A) and Resin (B) resulting in dissolving Resin (A) and Resin (B) in an alkali aqueous solution.

Examples of the acid generator include an onium salt compound, an organo-halogen compound, a sulfone compound, a sulfonate compound, and the like. The onium salt compound is preferable. The acid generators described in JP 2003-5374 A can be used.

Examples of the preferable acid generator include a salt represented by the formula (V):

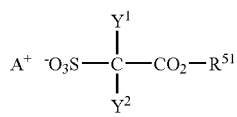

wherein A' represents an organic counter ion, $Y^1$ and $Y^2$ each independently represent a fluorine atom or a C1-C6 perfluoroalkyl group, $R^{51}$ represents a C1-C30 hydrocarbon group which may have one or more substituents selected from the group consisting of a C1-C6 alkoxy group, a C1-C4 perfluoroalkyl group, a C1-C6 hydroxyalkyl group, a hydroxyl group and a cyano group, and in which one or more —$CH_2$— may be replace by —CO— or —O— (hereinafter, simply referred to as Salt (V)).

Examples of the C1-C6 perfluoroalkyl group represented by $Y^1$ and $Y^2$ include a trifluoromethyl group, a pentafluoroethyl group, a heptafluoropropyl group, a nonafluorobutyl group, an undecafluoropentyl group and a tridecafluorohexyl group, and a trifluoromethyl group is preferable. $Y^1$ and $Y^2$ each independently is preferably a fluorine atom or a trifluoromethyl group, and $Y^2$ are more preferably fluorine atoms.

Examples of the C1-C30 hydrocarbon group include a linear or branched chain C1-C30 hydrocarbon group such as a methyl group, an ethyl group, a propyl group, an isopropyl group, a butyl group, an isobutyl group, a sec-butyl group, a tert-butyl group, a pentyl group and a hexyl group, and a C3-C30 monocyclic or polycyclic hydrocarbon group such as a hydrocarbon group having a cyclobutane ring, a hydrocarbon group having a cyclopentane ring, a hydrocarbon group having a cyclohexane ring, a hydrocarbon group having a cyclobutane ring, a hydrocarbon group having an adamantane ring, a hydrocarbon group having a benzene ring and a hydrocarbon group having a norbornane ring. The C3-C30 monocyclic or polycyclic hydrocarbon group may have an alicyclic structure or structures and may have an aromatic group or groups. The C3-C30 monocyclic or polycyclic hydrocarbon group may have a carbon-carbon double bond or bonds.

The C1-C30 hydrocarbon group may have one or more substituents selected from the group consisting of a C1-C6 alkoxy group, a C1-C4 perfluoroalkyl group, a C1-C6 hydroxyalkyl group, a hydroxyl group and a cyano group. Examples of the C1-C6 alkoxy group include a methoxy group, an ethoxy group, a propoxy group, an isopropoxy group, a butoxy group, an isobutoxy group, a sec-butoxy group, a tert-butoxy group, a pentyloxy group and a hexyloxy group. Examples of the C1-C4 perfluoroalkyl group include a trifluoromethyl group, a pentafluoroethyl group, a heptafluoropropyl group and a nonafluorobutyl group. Examples of the C1-C6 hydroxyalkyl group include a hydroxymethyl group, a 2-hydroxyethyl group, a 3-hydroxypropyl group, a 4-hydroxybutyl group and a 6-hydroxyhexyl group.

Specific examples of the anion part of Salt (V) include the followings.

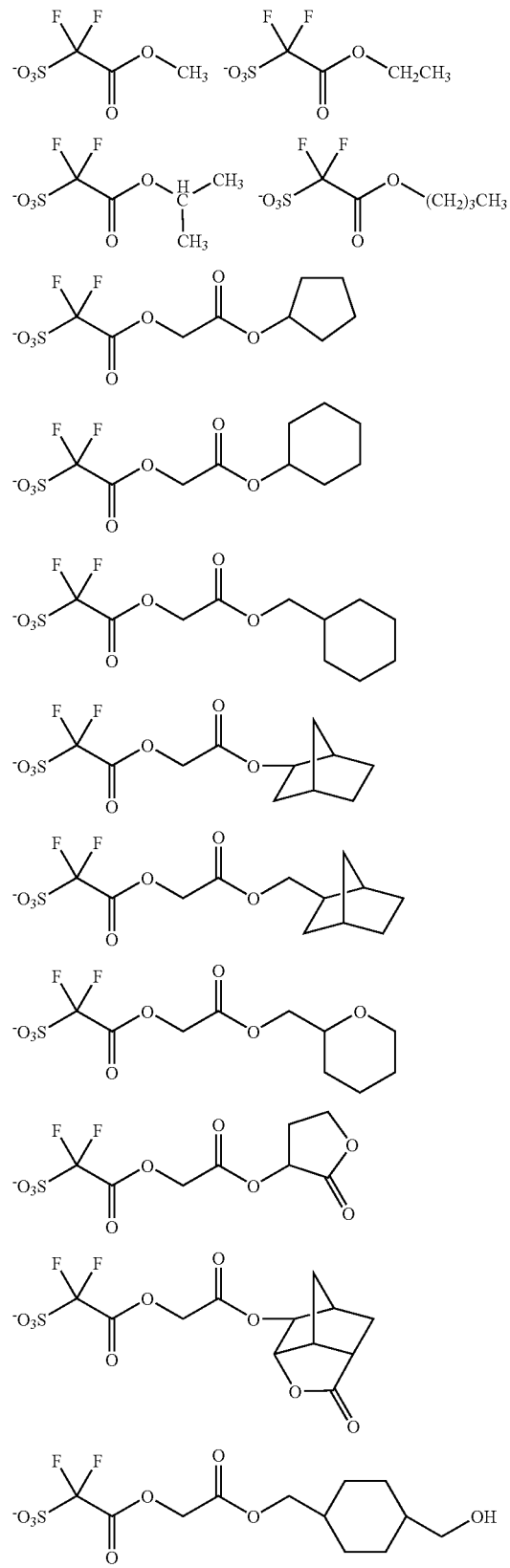

69
-continued
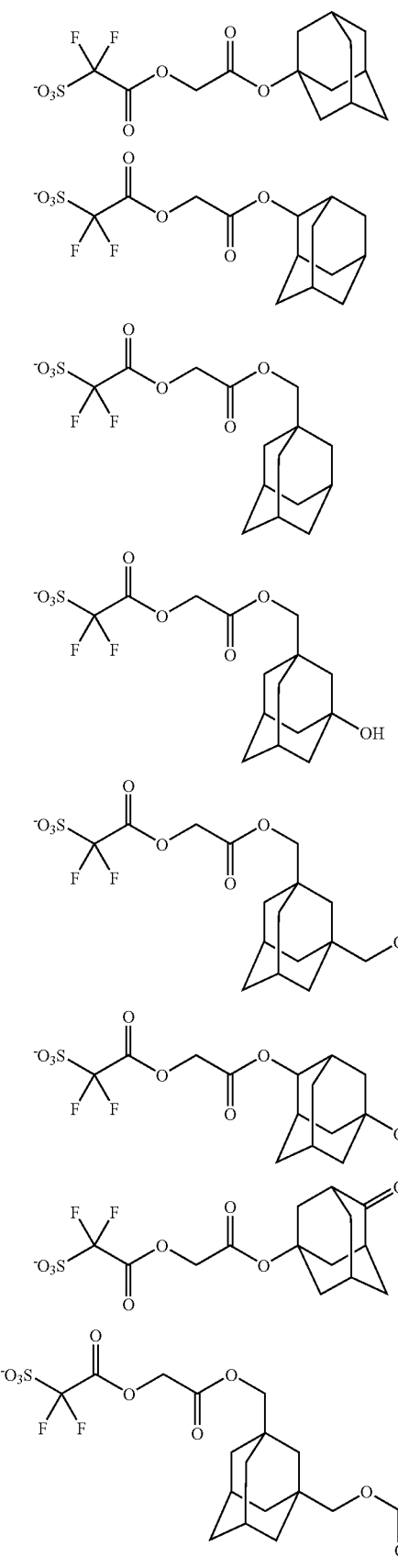
70
-continued
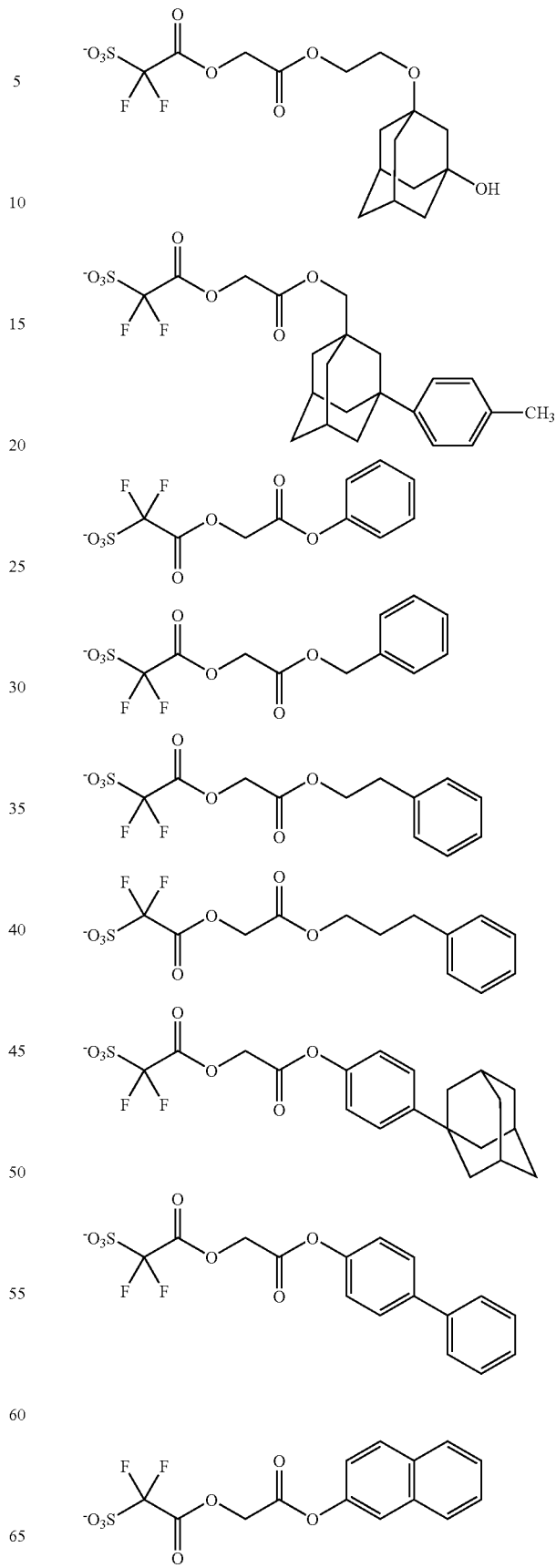

71
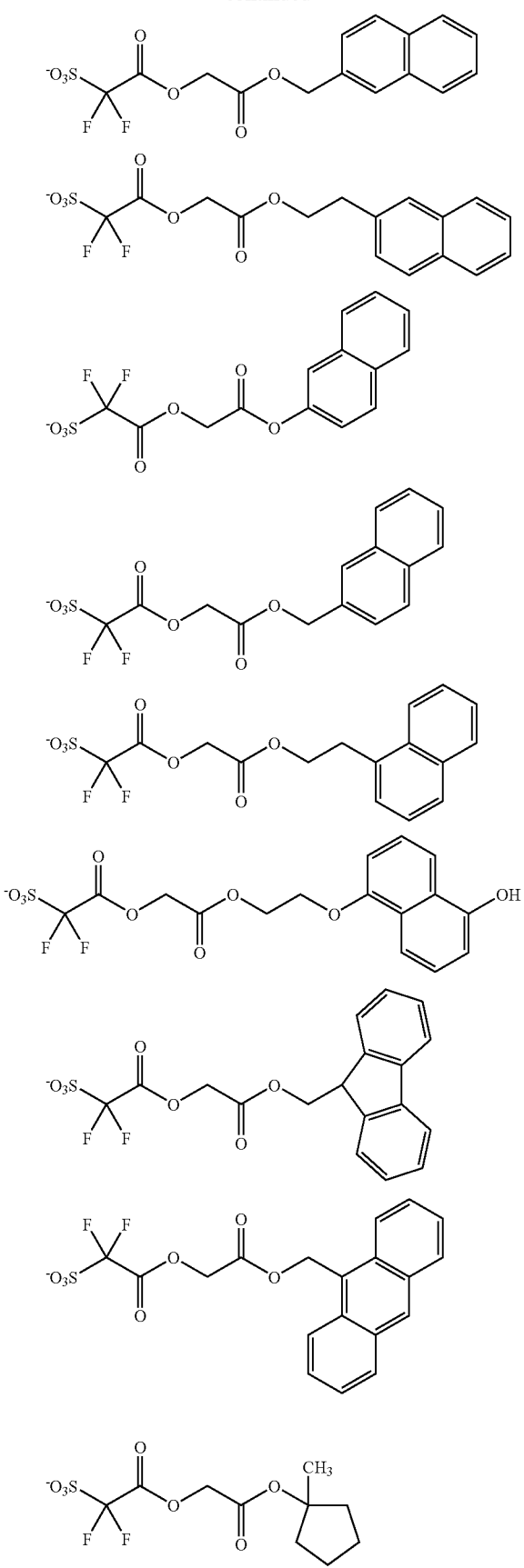
72
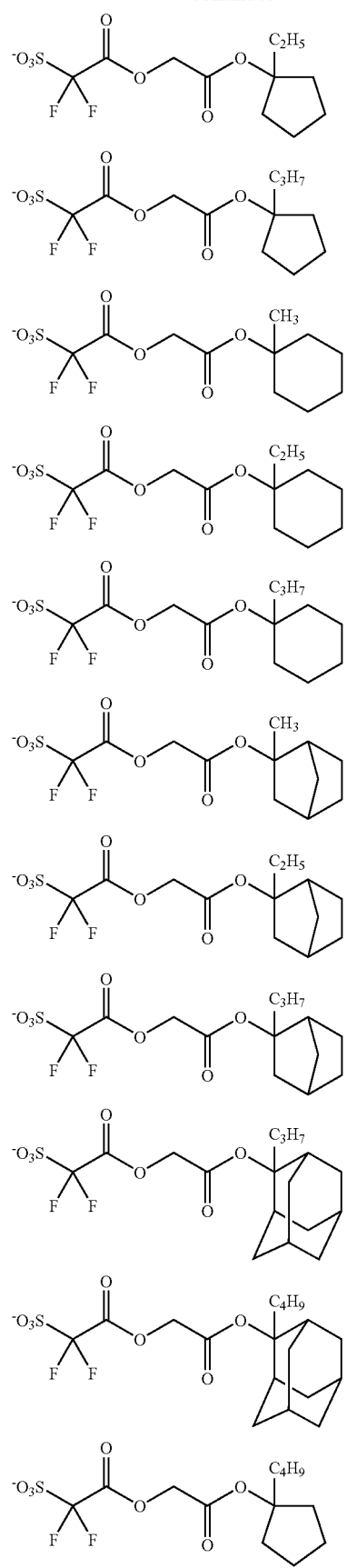

73
-continued
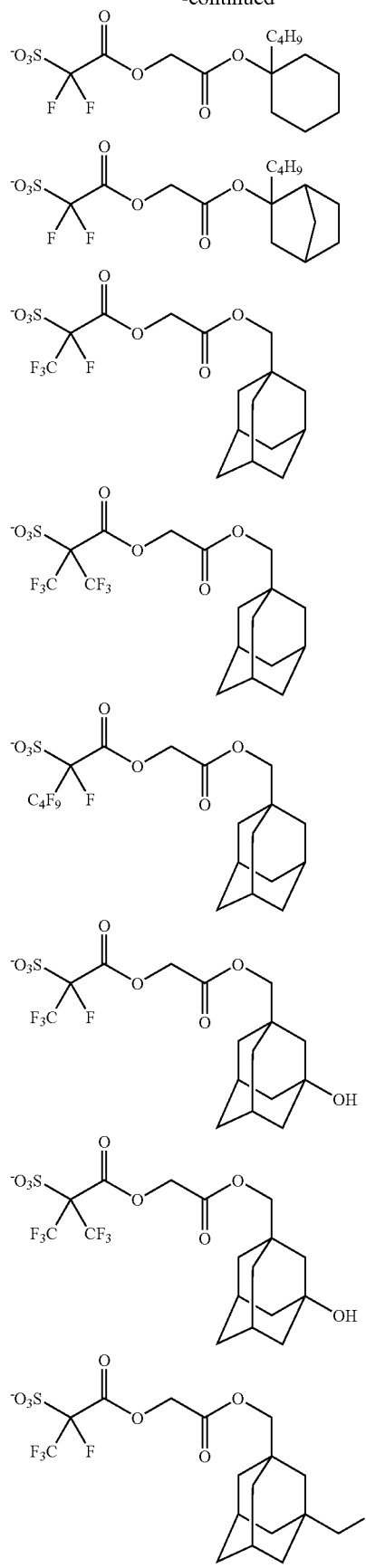
74
-continued
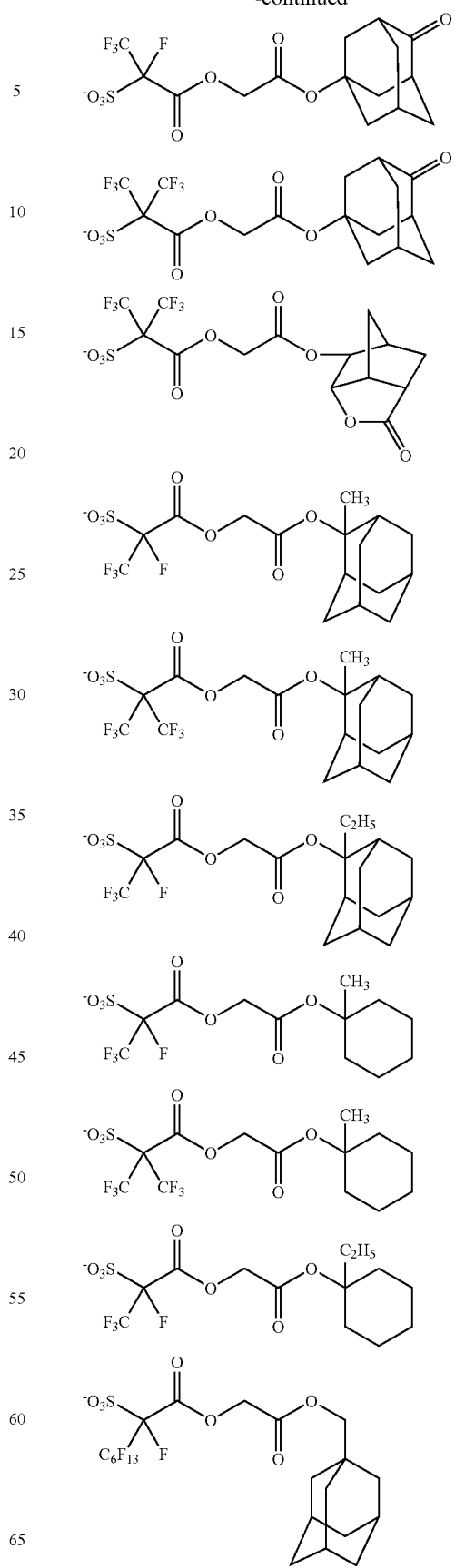

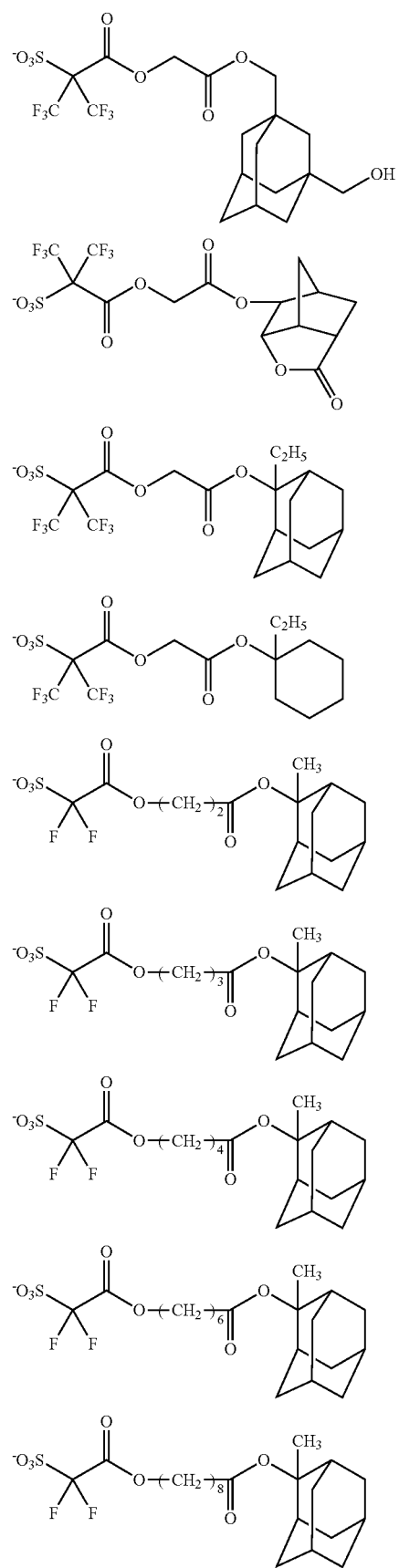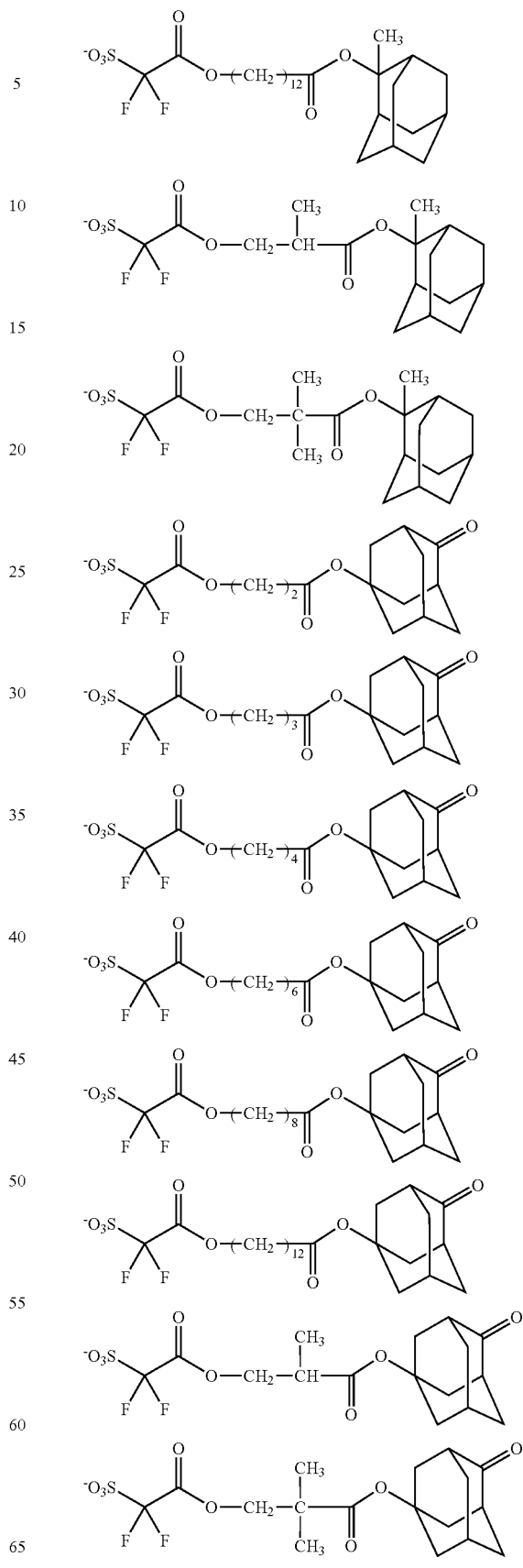

77
-continued
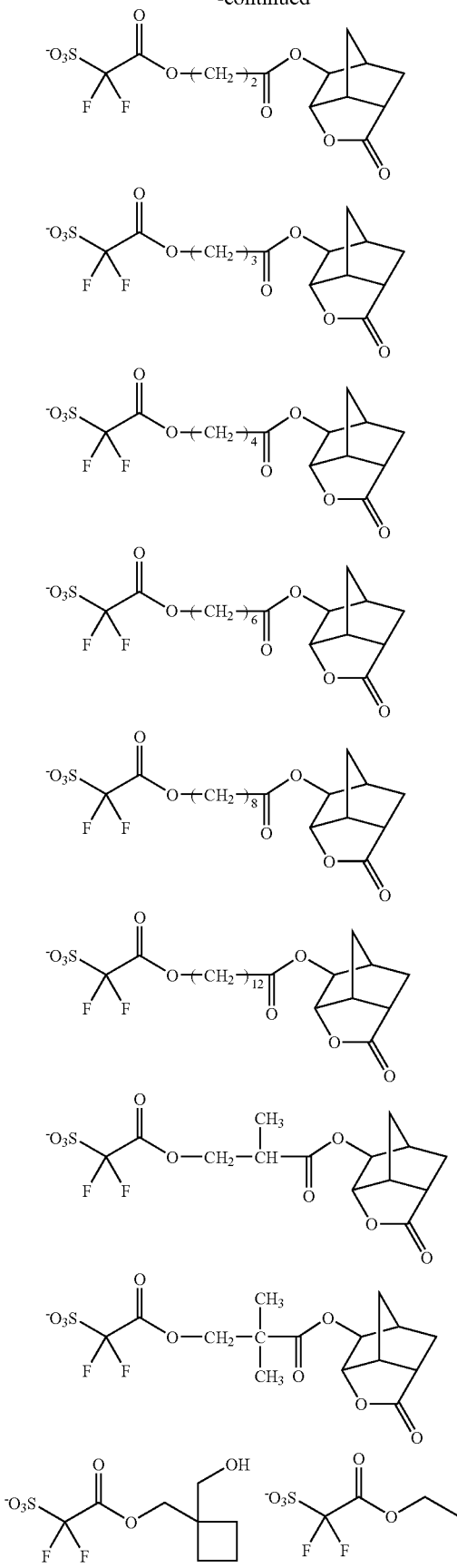
78
-continued
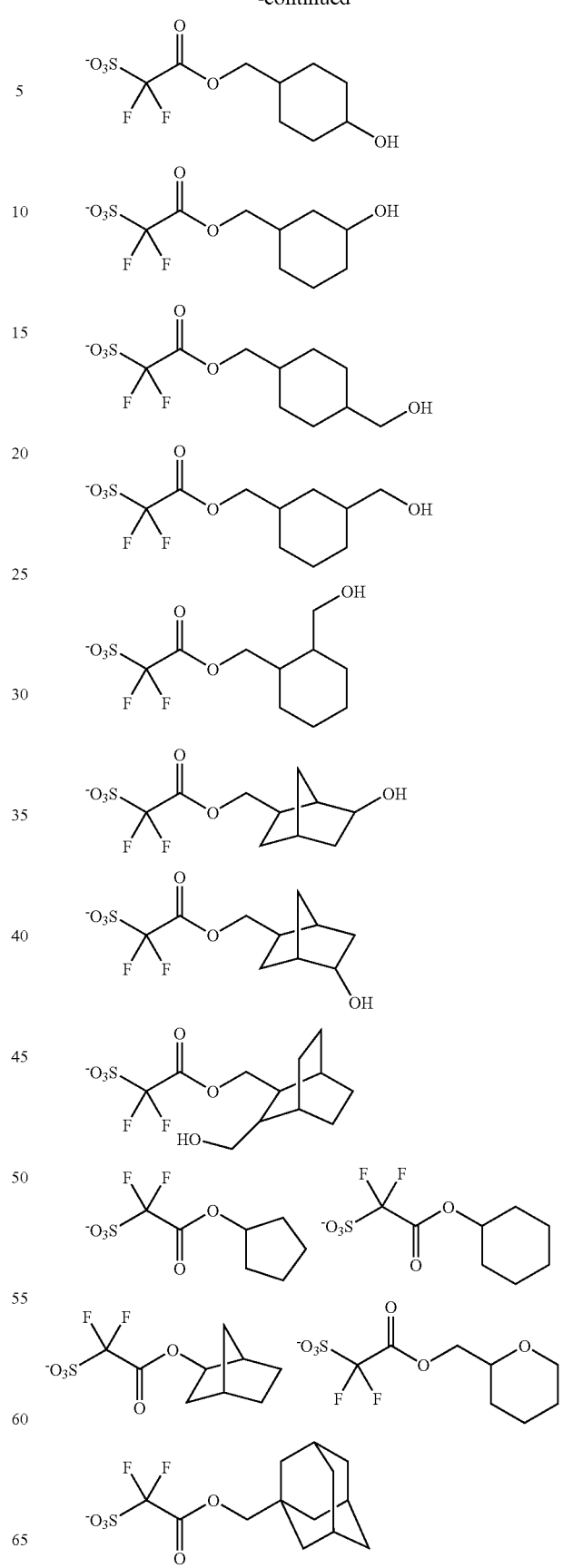

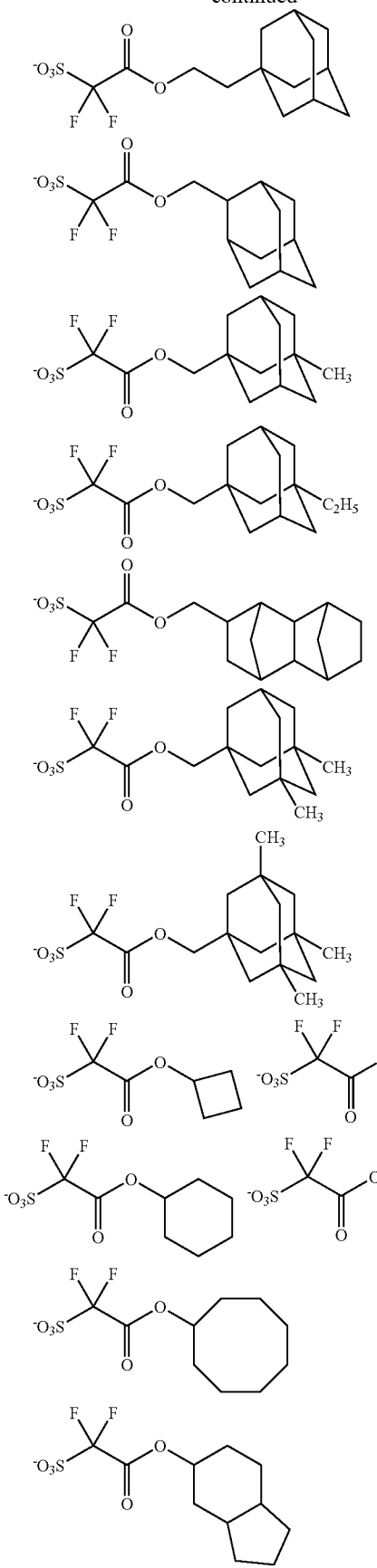
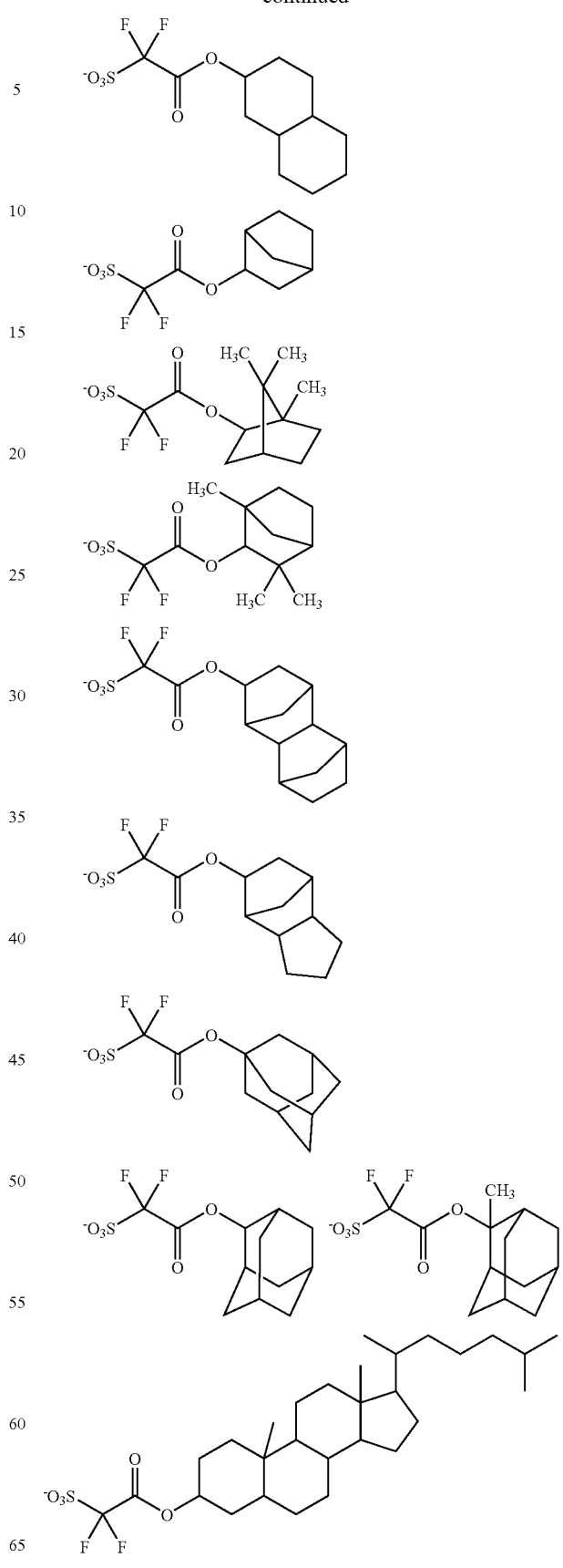

81
-continued
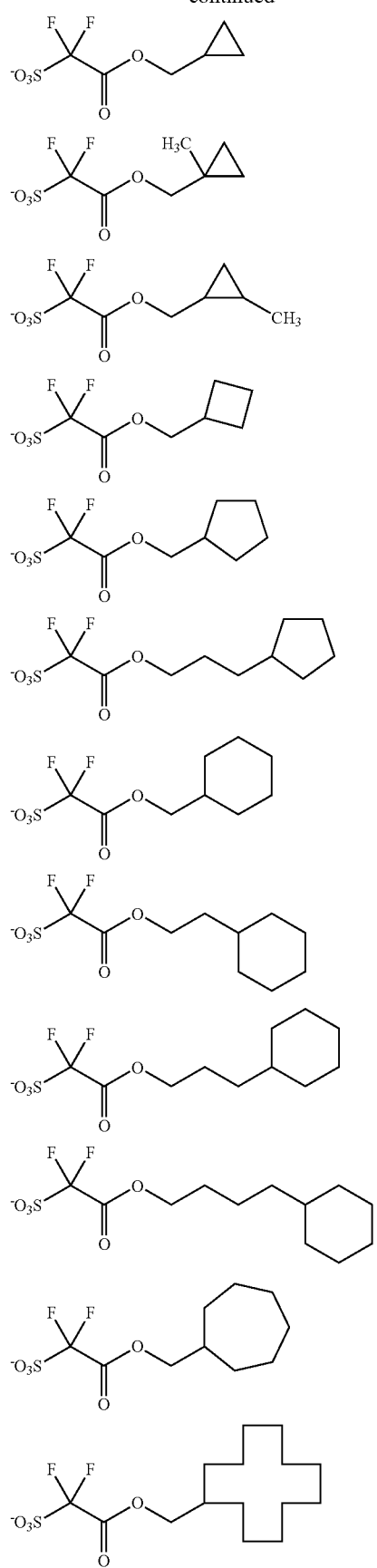
82
-continued
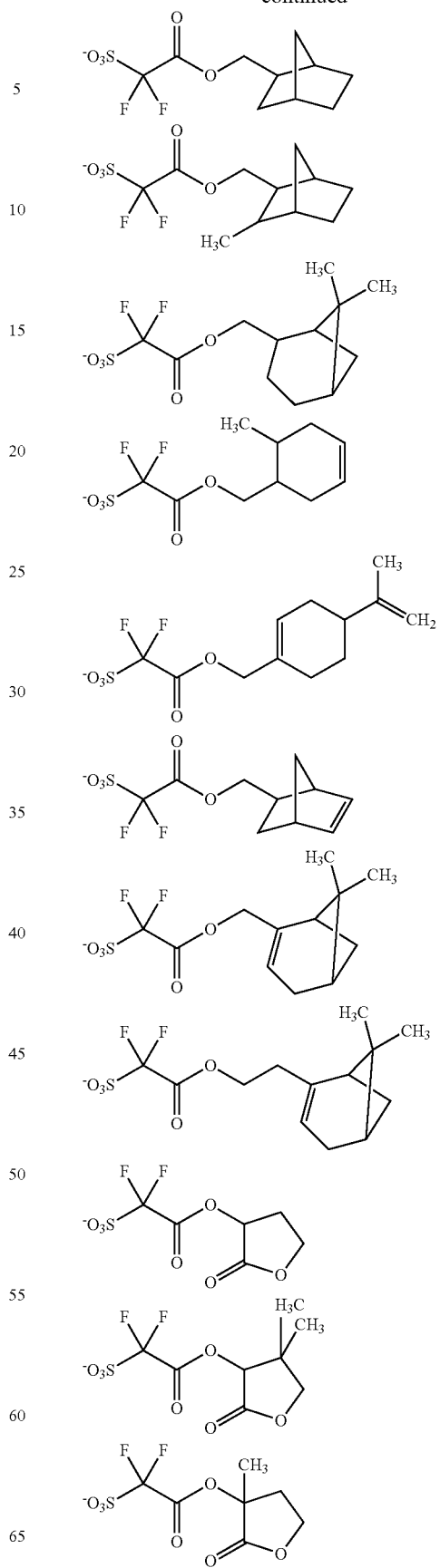

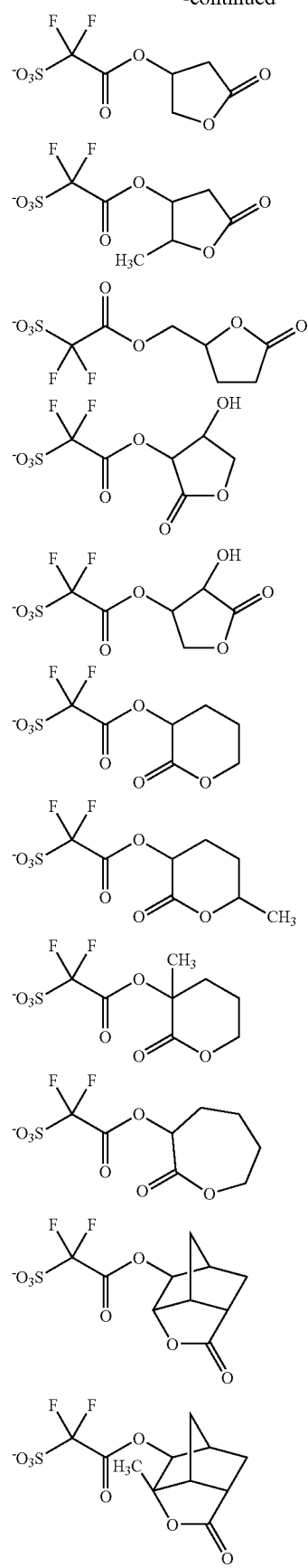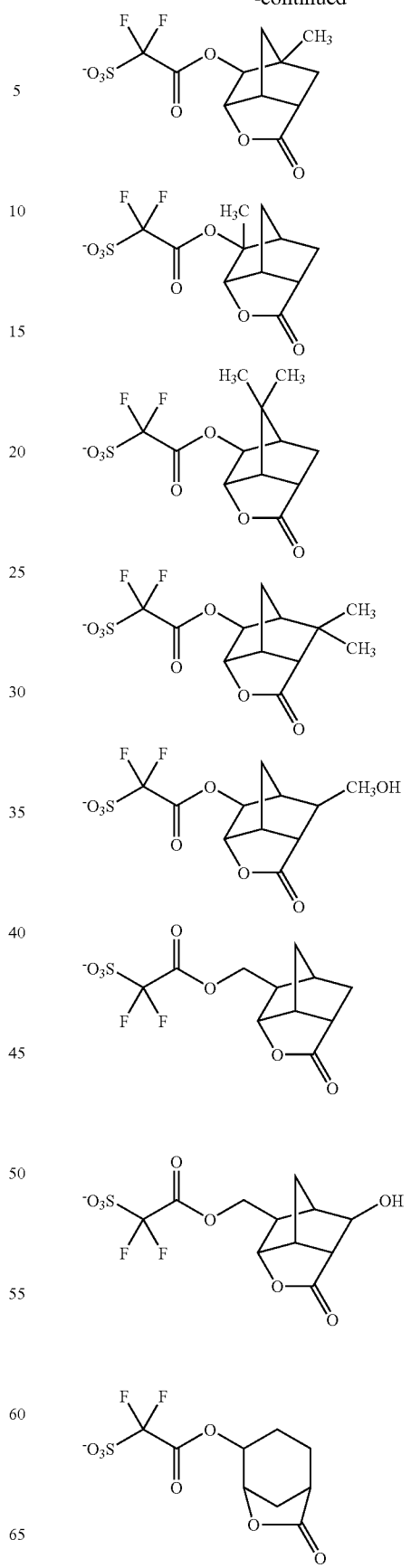

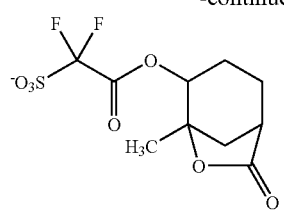
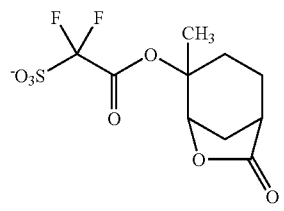
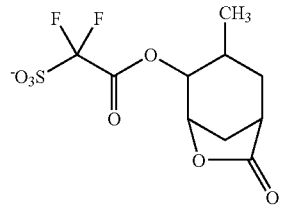
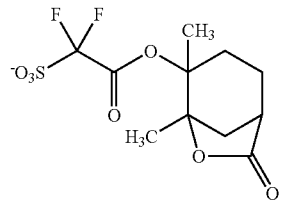
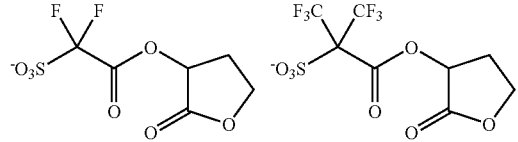
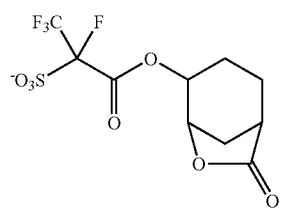
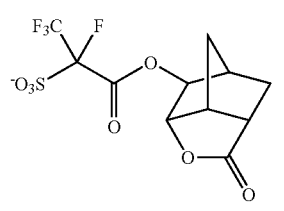
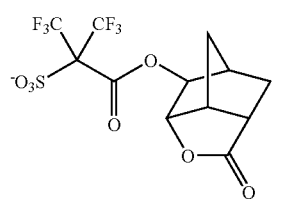
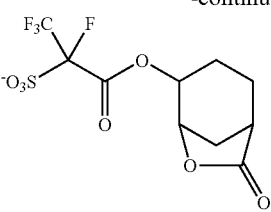
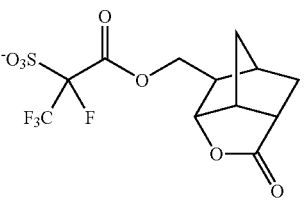
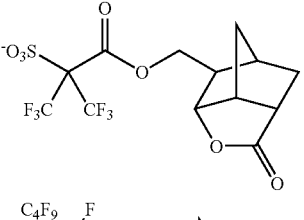
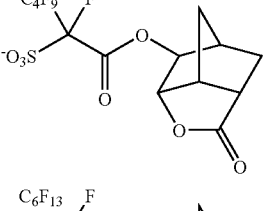
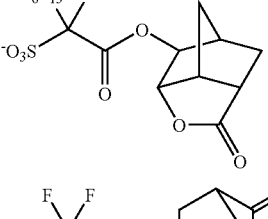
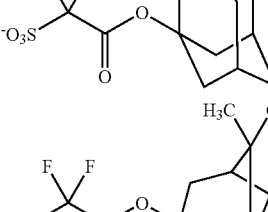
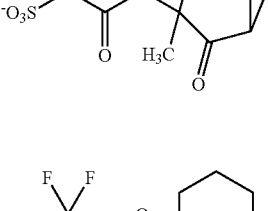
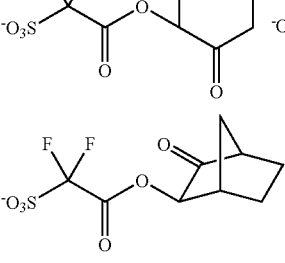

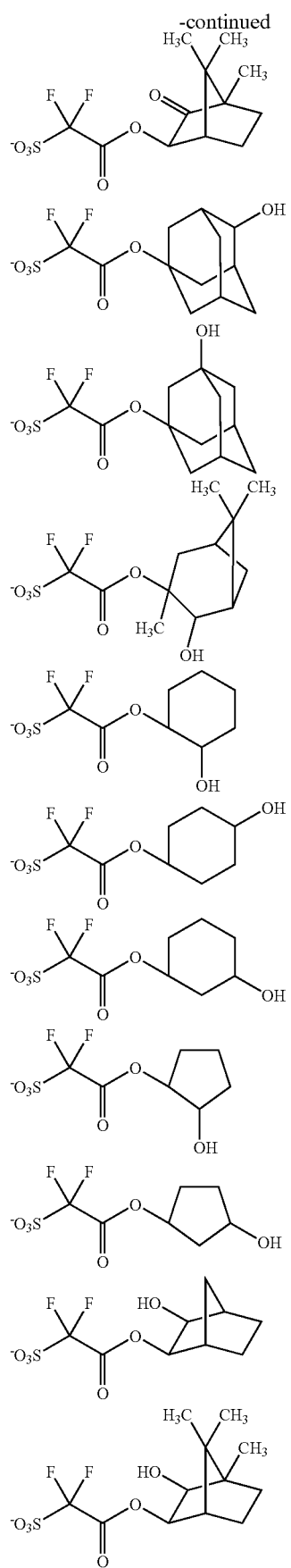
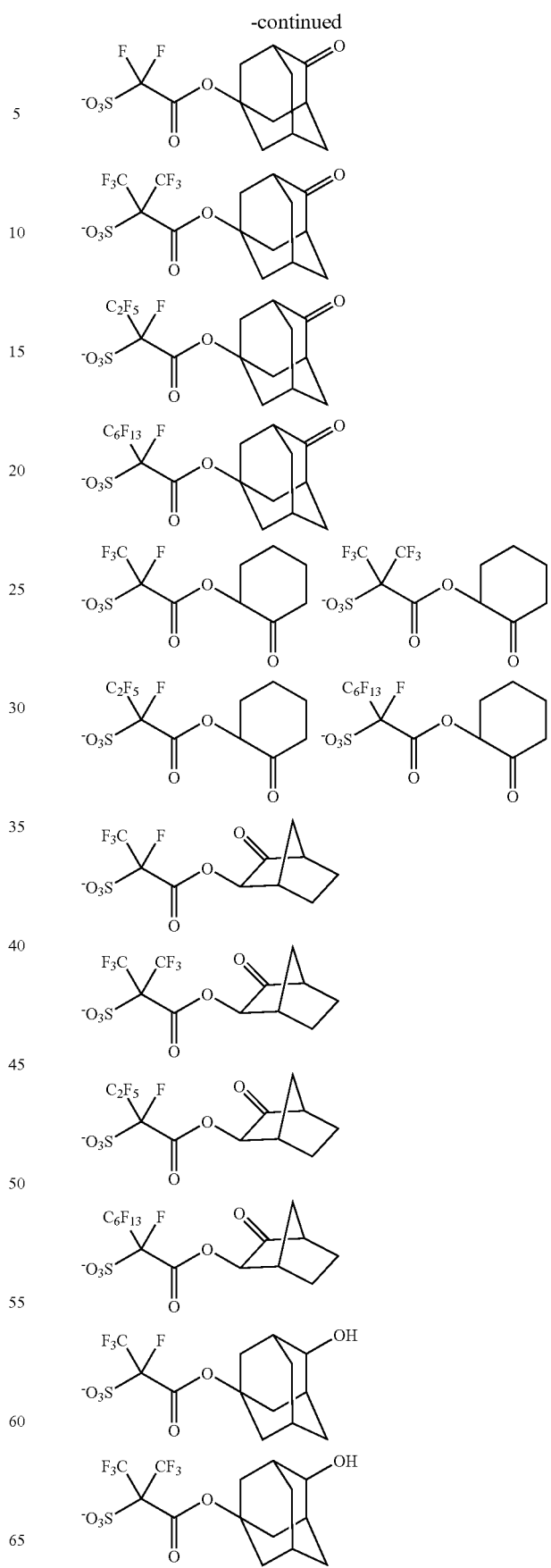

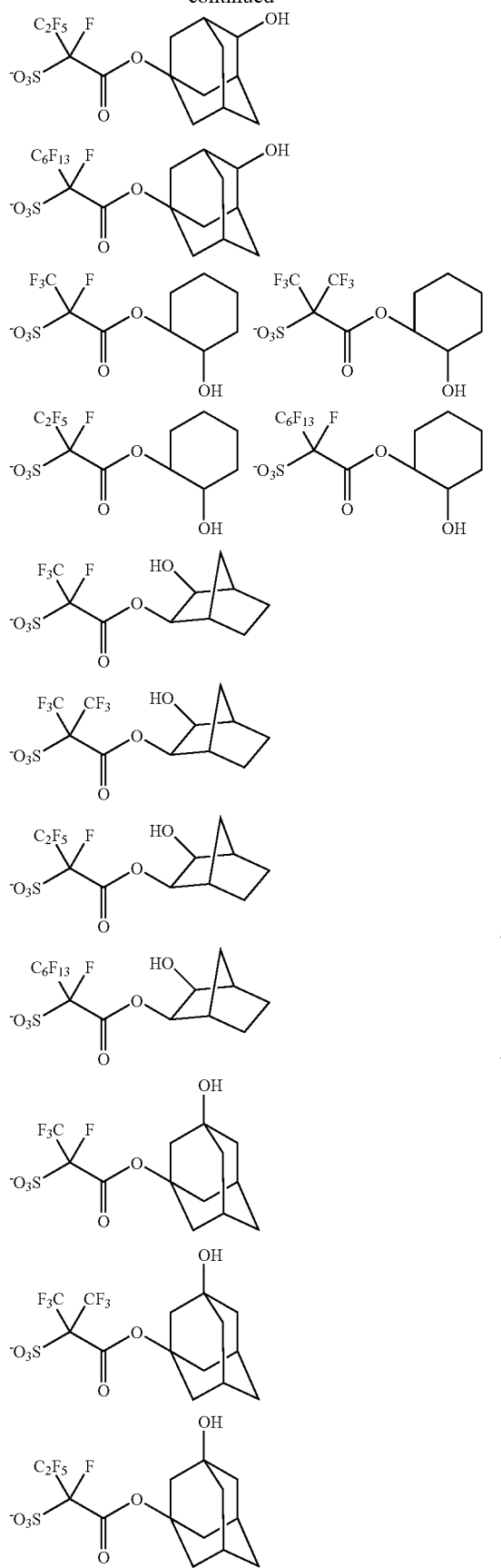
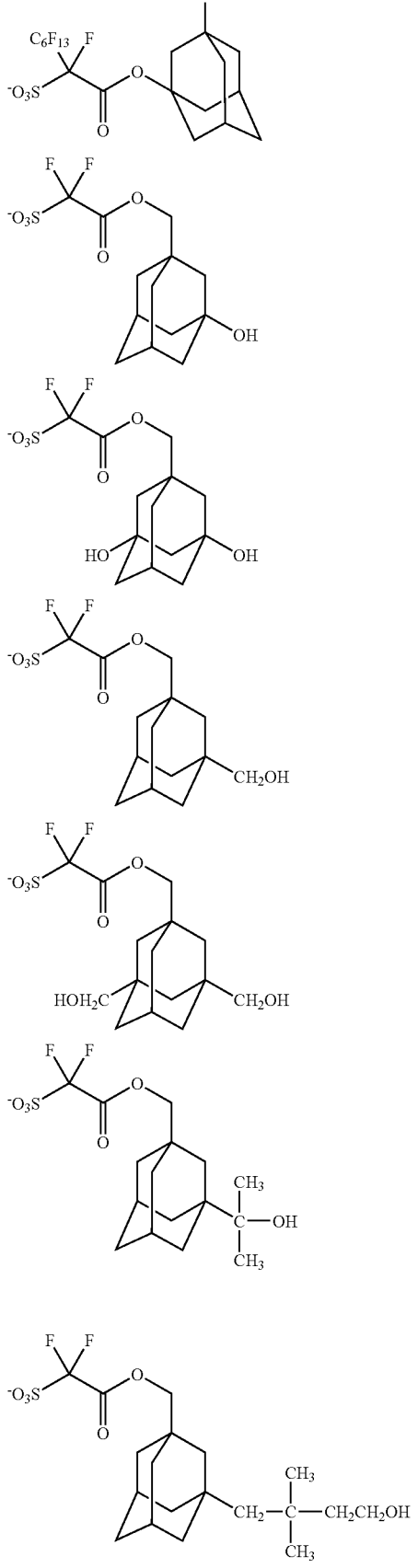

-continued
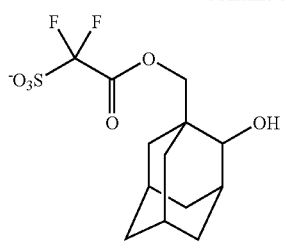
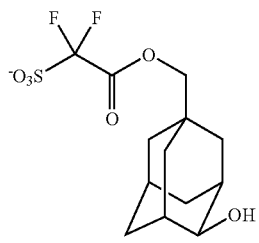
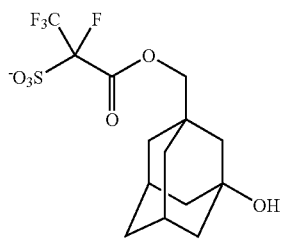
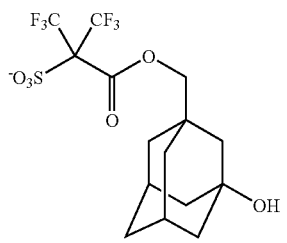
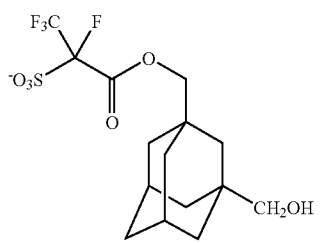
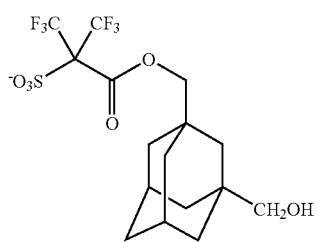
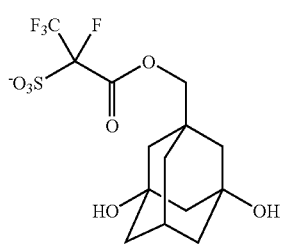
-continued
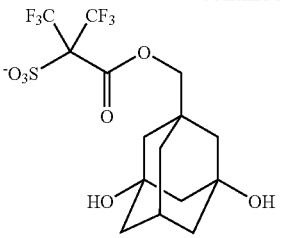
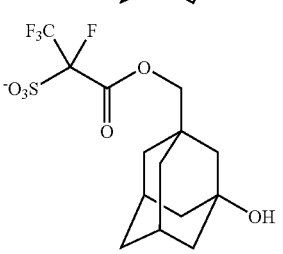
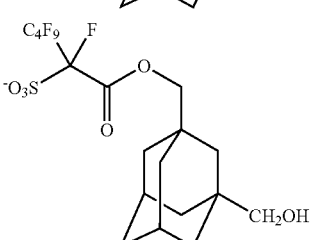
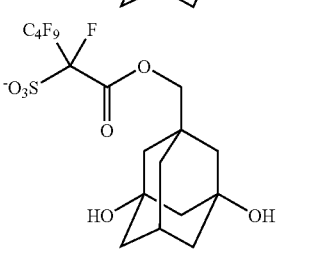
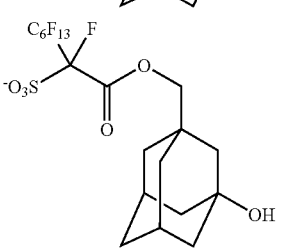
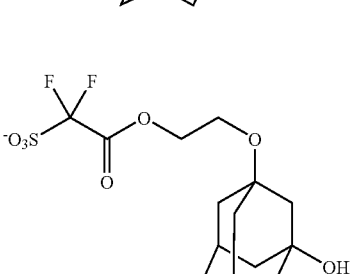
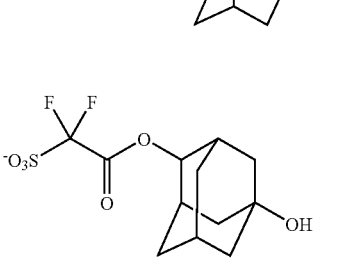

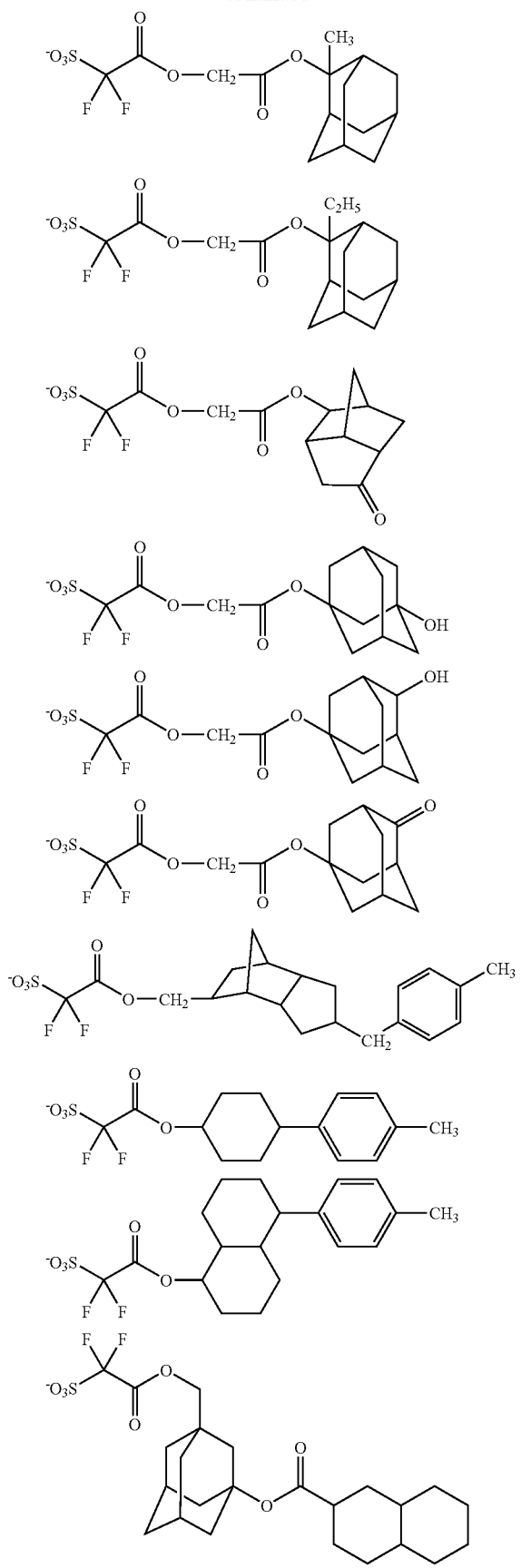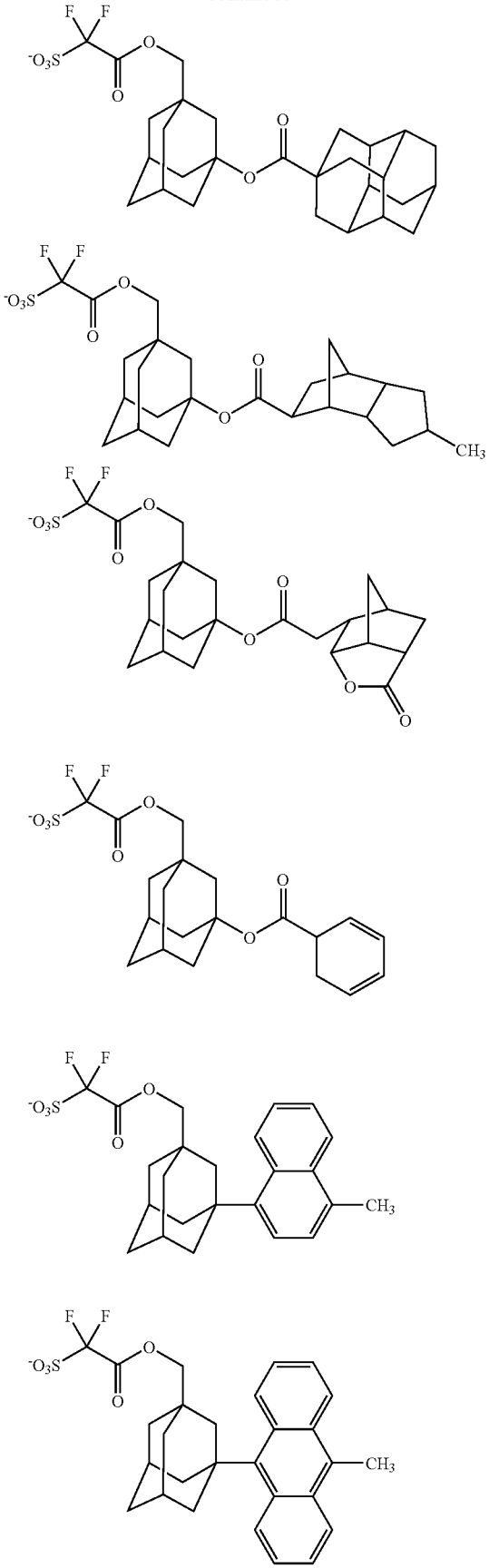

95
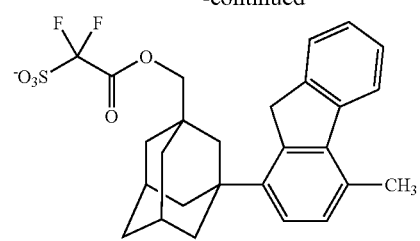
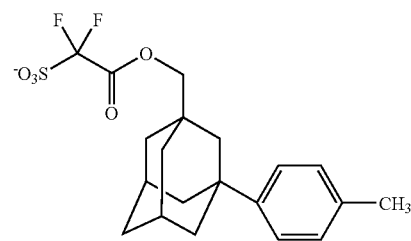
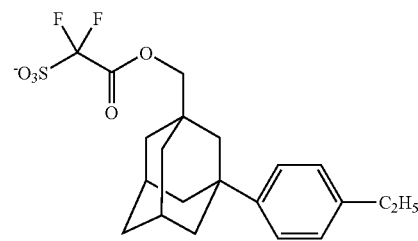
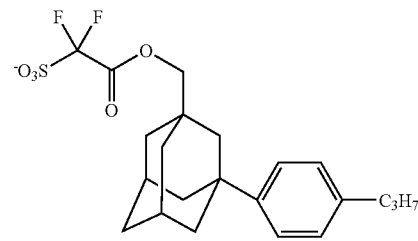
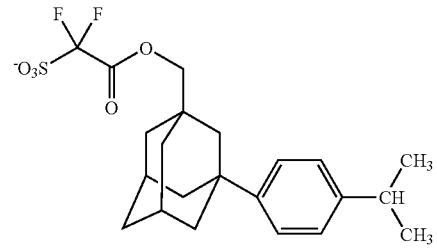
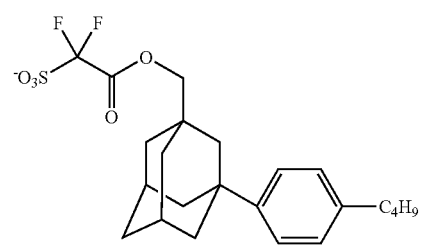
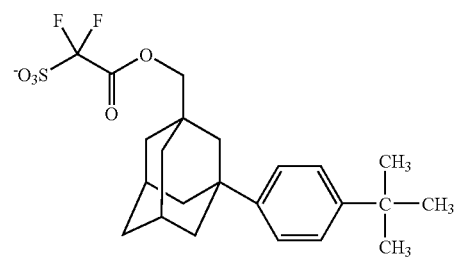
96
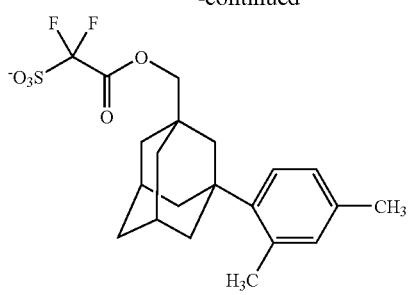
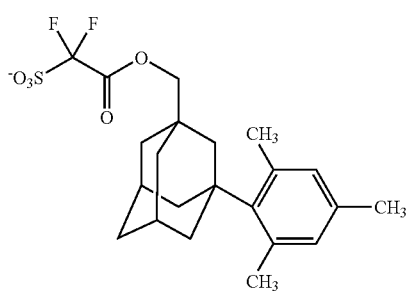
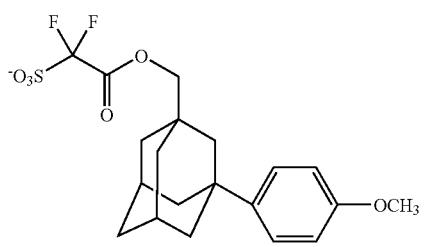
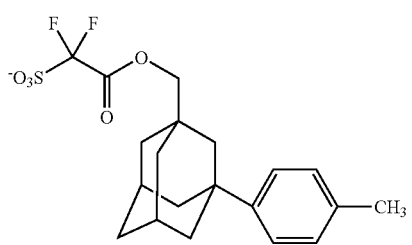
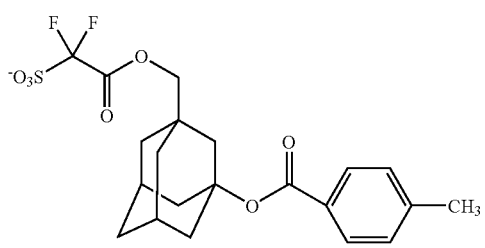
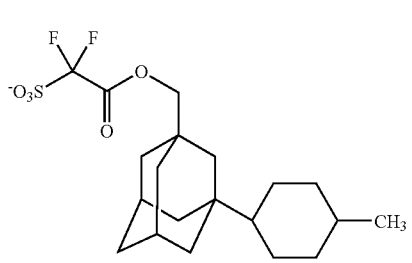

97
-continued
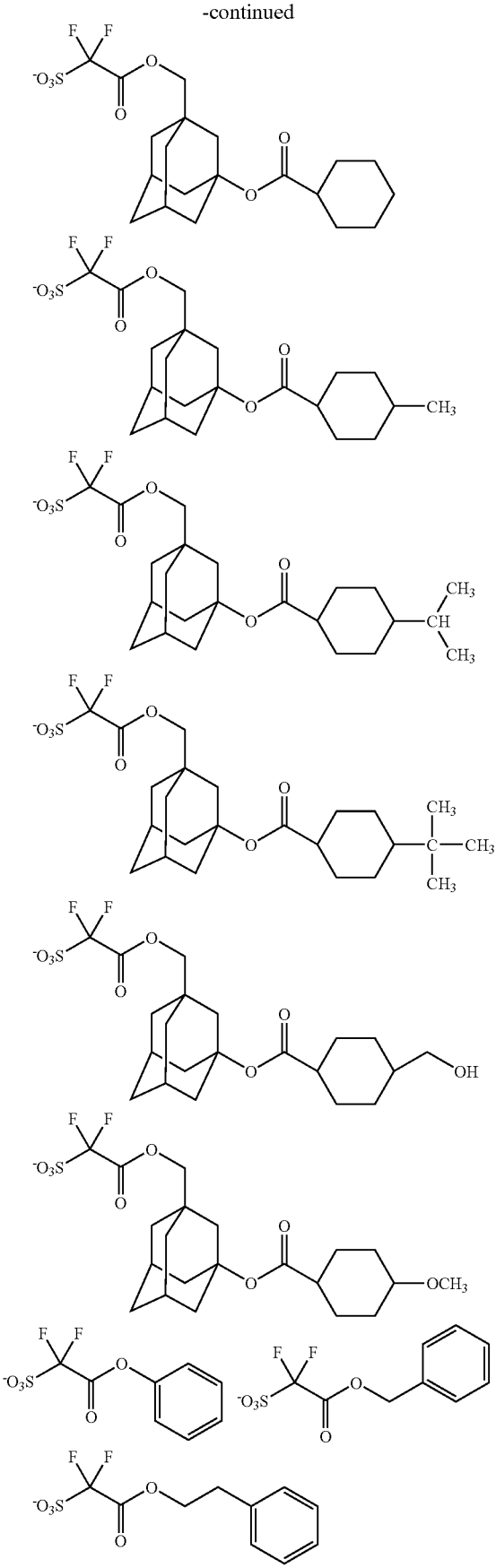
98
-continued
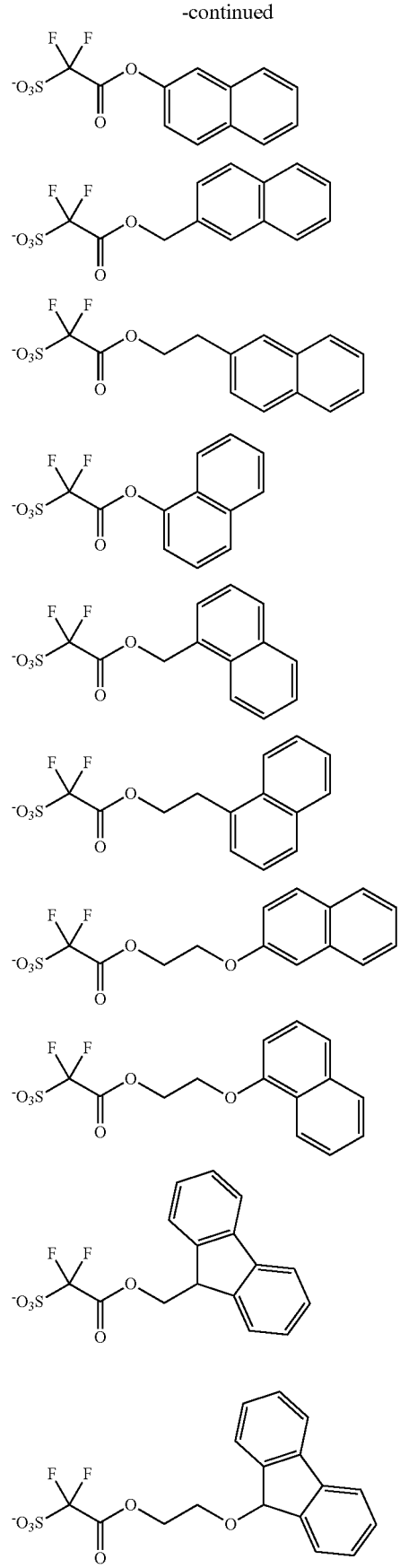

99
-continued
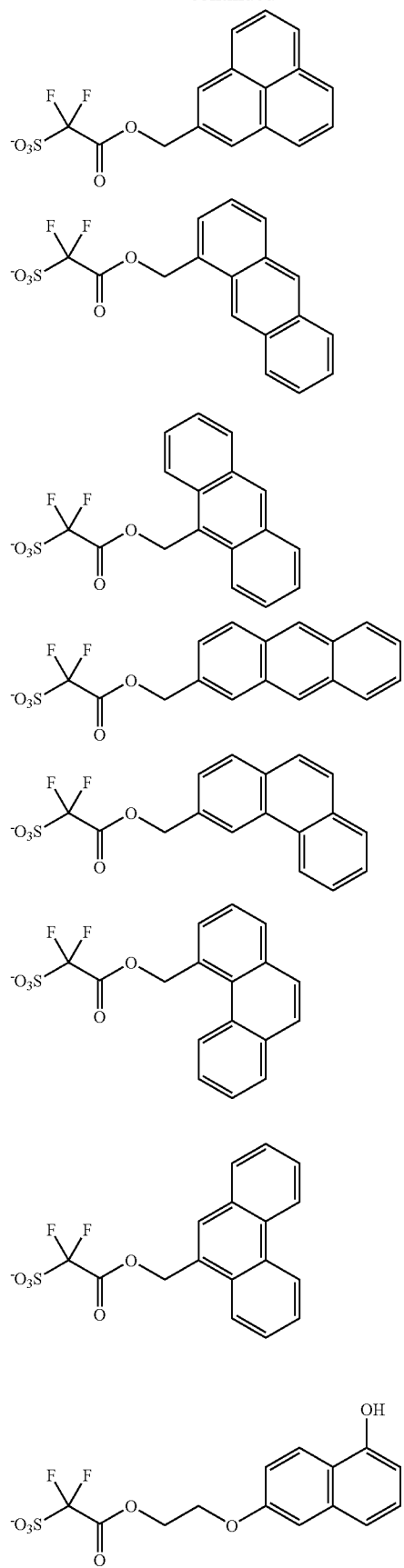
100
-continued
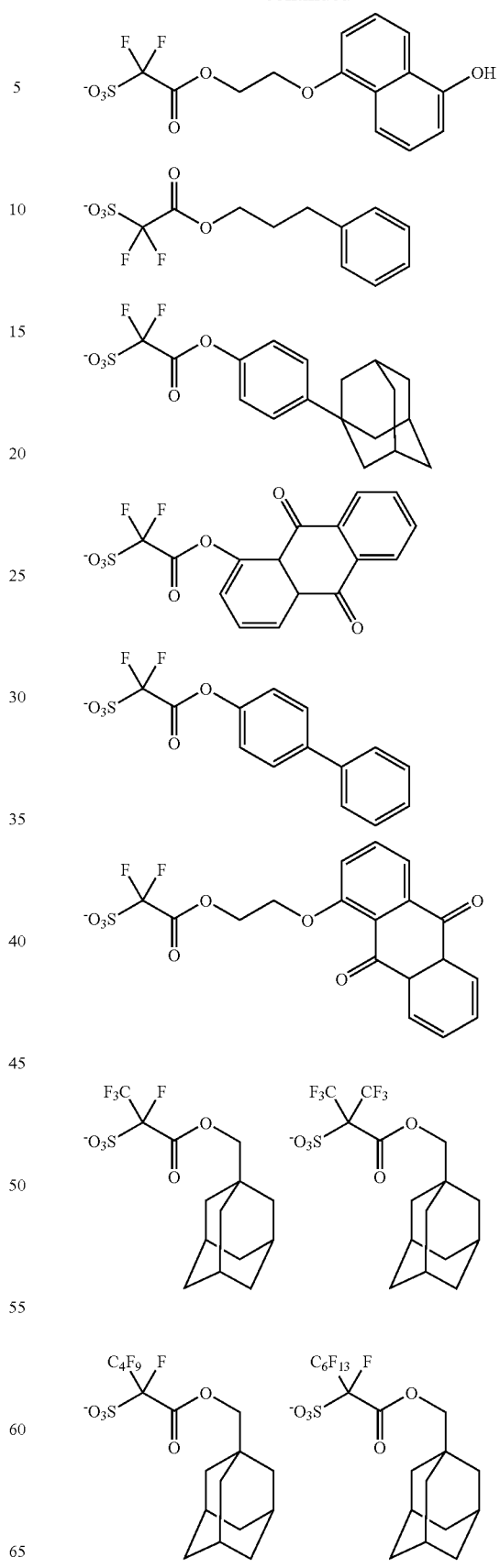

Among Salt (V), a salt represented by the formula (VI):

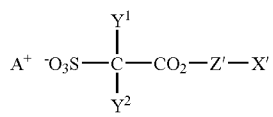

(VI)

wherein $Y^1$, $Y^2$ and $A^+$ are the same meanings as defined above, Z' represents a single bond or a C1-C4 alkylene group, and X' represents a C3-C30 monocyclic or polycyclic hydrocarbon group having a hydroxyl group or a carbonyl group, and one or more hydrogen atoms in the monocyclic or polycyclic hydrocarbon group may be replaced by a C1-C6 alkoxy group, a C1-C4 perfluoroalkyl group, a C1-C6 hydroxyalkyl group, a hydroxyl group or a cyano group (hereinafter, simply referred to as Salt (VI)) is preferable.

Examples of the C1-C6 alkoxy group, the C1-C4 perfluoroalkyl group and the C1-C6 hydroxyalkyl group in X' include the same groups as described above, respectively.

Examples of the C1-C4 alkylene group in Z' include a methylene group, an ethylene group, a trimethylene group and a tetramethylene group. Z' is preferably a single bond, a methylene group or an ethylene group, and is more preferable a single bond or a methylene group.

Examples of X' include a C4-C8 cycloalkyl group such as a cyclobutyl group, a cyclopentyl group, a cyclohexyl group and a cyclooctyl group, an adamantyl group, and a norbornyl group, in all of which one or more hydrogen atoms may be replaced by the C1-C6 alkoxy group, the C1-C4 perfluoroalkyl group, the C1-C6 hydroxyalkyl group, a hydroxyl group or a cyano group.

Specific examples of X' include a 2-oxocyclopentyl group, a 2-oxocyclohexyl group, a 3-oxocyclopentyl group, a 3-oxocyclohexyl group, a 4-oxocyclohexyl group, a 2-hydroxycyclopentyl group, a 2-hydroxycyclohexyl group, a 3-hydroxycyclopentyl group, a 3-hydroxycyclohexyl group, a 4-hydroxycyclohexyl group, a 4-oxo-2-adamantyl group, a 3-hydroxy-1-adamantyl group, a 4-hydroxy-1-adamantyl group, a 5-oxonorbornan-2-yl group, a 1,7,7-trimethyl-2-oxonorbornan-2-yl group, a 3,6,6-trimethyl-2-oxo-bicyclo[3.1.1]heptan-3-yl group, a 2-hydroxy-norbornan-3-yl group, a 1,7,7-trimethyl-2-hydroxynorbornan-3-yl group, a 3,6,6-trimethyl-2-hydroxybicyclo[3.1.1]heptan-3-yl group, and the following groups (in the following formulae, straight line with an open end shows a bond which is extended from an adjacent group).

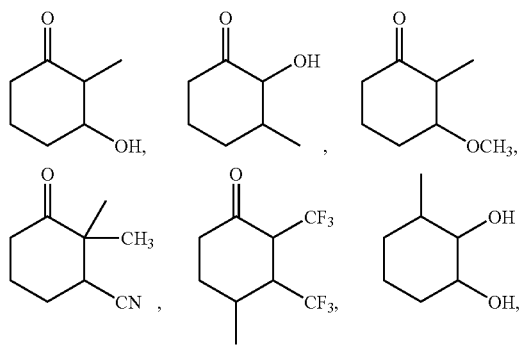

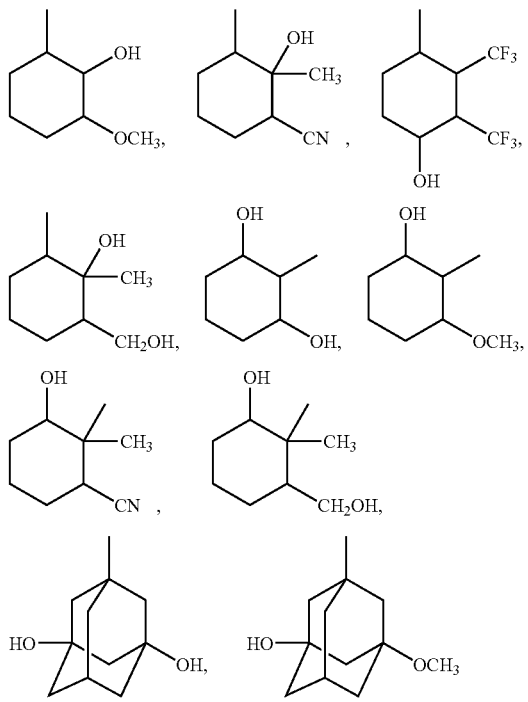

Specific examples of the anion part of Salt (VI) include the followings.

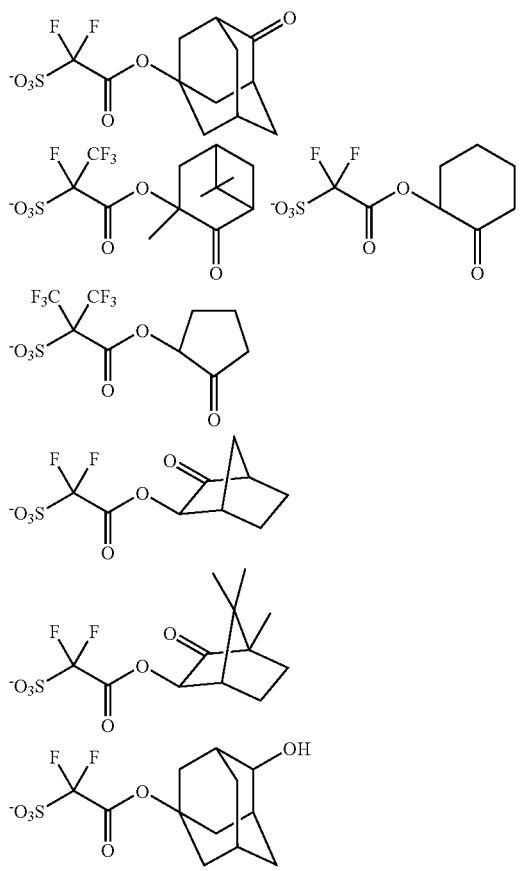

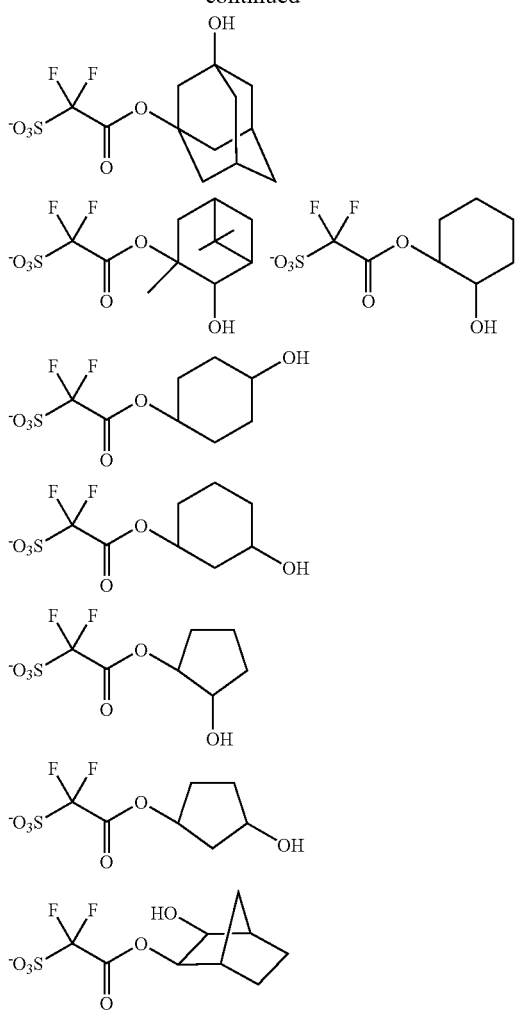

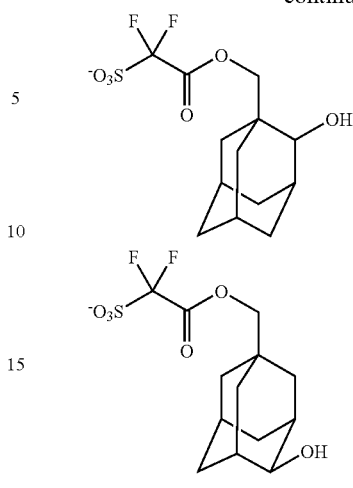

Other examples of the acid generator include a salt represented by the formula (VIII):

$$A^+ {}^-O_3S—R^{52} \quad \text{(VIII)}$$

wherein $R^{52}$ represents a linear or branched chain C1-C6 perfluoroalkyl group and $A^+$ is the same as defined above (hereinafter, simply referred to as Salt (VIII)).

In Salt (VIII), examples of the linear or branched chain C1-C6 perfluoroalkyl group include a trifluoromethyl group, a pentafluoroethyl group, a heptafluoropropyl group, a nonafluorobutyl group and a tridecafluorohexyl group.

Specific examples of the anion part of Salt (VIII) include the followings.

$$CF_3—SO_3^-$$

$$CF_3CF_2CF_2—SO_3^-$$

$$CF_3CF_2CF_2CF_2—SO_3^-$$

$$CF_3CF_2CF_2CF_2CF_2CF_2—SO_3^-$$

In Salt (V), Salt (VI) and Salt (VIII), $A^+$ represents an organic counter ion. Examples of the organic counter ion include a cation represented by the formula (IXz):

(IXz)

wherein $P^a$, $P^b$ and $P^c$ each independently represent a C1-C30 linear or branched chain alkyl group which may behave at least one substituent selected from the group consisting of a hydroxyl group, a C3-C12 cyclic hydrocarbon group and a C1-C12 alkoxy group, or a C3-C30 cyclic hydrocarbon group which may have at least one substituent selected from the group consisting of a hydroxyl group and a C1-C12 alkoxy group (hereinafter, simply referred to as the cation (IXz)), a cation represented by the formula (IXb):

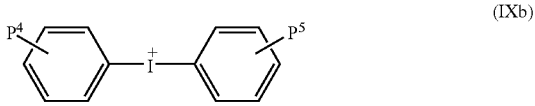

wherein P⁴ and P⁵ each independently represent a hydrogen atom, a hydroxyl group, a C1-C12 alkyl group or a C1-C12 alkoxy group (hereinafter, simply referred to as the cation (IXb)),
a cation represented by the formula (IXc):

wherein $P^6$ and $P^7$ each independently represent a C1-C12 alkyl group or a C3-C12 cycloalkyl group, or $P^6$ and $P^7$ are bonded to form a C3-C12 divalent acyclic hydrocarbon group which forms a ring together with the adjacent S⁺, and one or more —CH₂— in the divalent acyclic hydrocarbon group may be replaced by —CO—, —O— or —S—, $P^8$ represents a hydrogen atom, $P^9$ represents a C1-C12 alkyl group, a C3-C12 cycloalkyl group or an aromatic group which may have one or more substituents, or $P^8$ and $P^9$ are bonded to form a divalent acyclic hydrocarbon group which forms a 2-oxocycloalkyl group together with the adjacent —CHCO—, and one or more —CH₂— in the divalent acyclic hydrocarbon group may be replaced by —CO—, —O— or —S— (hereinafter, simply referred to as the cation (IXc)); and
a cation represented by the formula (IXd):

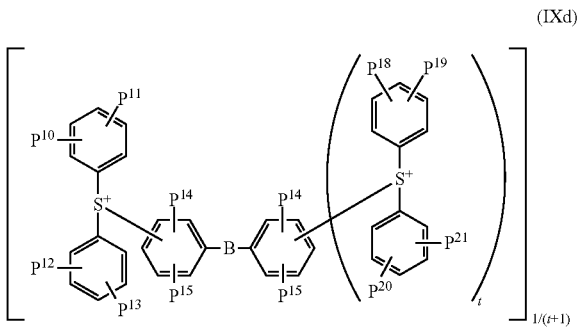

wherein $P^{10}, P^{11}, P^{12}, P^{13}, P^{14}, P^{15}, P^{16}, P^{17}, P^{18}, P^{19}, P^{20}$ and $P^{21}$ each independently represent a hydrogen atom, a hydroxyl group, a C1-C12 alkyl group or a C1-C12 alkoxy group, B represents a sulfur or oxygen atom and t represents 0 or 1 (hereinafter, simply referred to as the cation (IXd)).

Examples of the C1-C12 alkoxy group in the cations (IXz), (IXb) and (IXd) include a methoxy group, an ethoxy group, a propoxy group, an isopropoxy group, a butoxy group, an isobutoxy group, a sec-butoxy group, a tert-butoxy group, a pentyloxy group, a hexyloxy group, a octyloxy group and a 2-ethylhexyloxy group.

Examples of the C3-C12 cyclic hydrocarbon group in the cation (IXz) include a cyclopentyl group, a cyclohexyl group, a 1-adamantyl group, a 2-adamantyl group, a phenyl group, a 2-methylphenyl group, a 4-methylphenyl group, a 1-naphthyl group and a 2-naphthyl group.

Examples of the C1-C30 alkyl group which may have at least one substituent selected from the group consisting of a hydroxyl group, a C3-C12 cyclic hydrocarbon group and a C1-C12 alkoxy group in the cation (IXz) include a methyl group, an ethyl group, a propyl group, an isopropyl group, a butyl group, an isobutyl group, a sec-butyl group, a tert-butyl group, a pentyl group, a hexyl group, a octyl group, a 2-ethylhexyl group and a benzyl group.

Examples of the C3-C30 cyclic hydrocarbon group which may have at least one substituent selected from the group consisting of a hydroxyl group and a C1-C12 alkoxy group in the cation (IXz) include a cyclopentyl group, a cyclohexyl group, a 1-adamantyl group, a 2-adamantyl group, a bicyclohexyl group, a phenyl group, a 2-methylphenyl group, a 4-methylphenyl group, a 4-ethylphenyl group, a 4-isopropylphenyl group, a 4-tert-butylphenyl group, a 2,4-dimethylphenyl group, a 2,4,6-trimethylphenyl group, a 4-hexylphenyl group, a 4-octylphenyl group, a 1-naphthyl group, a 2-naphthyl group, a fluorenyl group, a 4-phenylphenyl group, a 4-hydroxyphenyl group, a 4-methoxyphenyl group, a 4-tert-butoxyphenyl group and a 4-hexyloxyphenyl group.

Examples of the C1-C12 alkyl group in the cations (IXb), (Ixc) and (IXd) include a methyl group, an ethyl group, a propyl group, an isopropyl group, a butyl group, an isobutyl group, a sec-butyl group, a tert-butyl group, a pentyl group, a hexyl group, a octyl group and a 2-ethylhexyl group.

Examples of the C3-C12 cycloalkyl group in the cation (IXc) include a cyclopropyl group, a cyclobutyl group, a cyclopentyl group, a cyclohexyl group, a cycloheptyl group, a cyclooctyl group and a cyclodecyl group. Examples of the C3-C12 divalent acyclic hydrocarbon group formed by bonding $P^6$ and $P^7$ include a trimethylene group, a tetramethylene group and a pentamethylene group. Examples of the ring group formed together with the adjacent S⁺ and the divalent acyclic hydrocarbon group include a tetramethylenesulfonio group, a pentamethylenesulfonio group and oxybisethylenesulfonio group.

Examples of the aromatic group in the cation (IXc) include a phenyl group, a tolyl group, a xylyl group, a 4-butylphenyl group, a 4-isobutylphenyl group, a 4-tert-butylphenyl group, a 4-cyclohexylphenyl group, a 4-phenylphenyl group, a 1-naphthyl group and a 2-naphthyl group. The aromatic group may have one or more substituents, and examples of the substituents include a C1-C6 alkoxy group such as a methoxy group, an ethoxy group, a propoxy group, a butoxy group, a tert-butoxy group and a hexyloxy group; a C2-C12 acyloxy group such as an acetyloxy group and a 1-adamantylcarbonyloxy group; and a nitro group.

Examples of the divalent acyclic hydrocarbon group formed by bonding $P^8$ and $P^9$ include a methylene group, an ethylene group, a trimethylene group, a tetramethylene group and a pentamethylene group and examples of the 2-oxocycloalkyl group formed together with the adjacent —CHCO— and the divalent acyclic hydrocarbon group include a 2-oxocyclopentyl group and a 2-oxocyclohexyl group.

Examples of the cation (Ixz) include the followings:

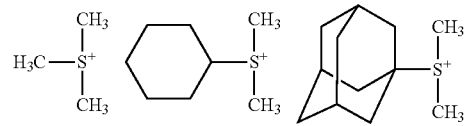

107
-continued
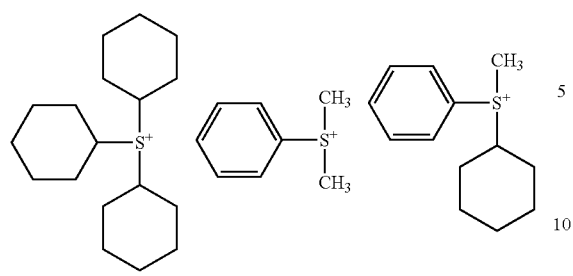
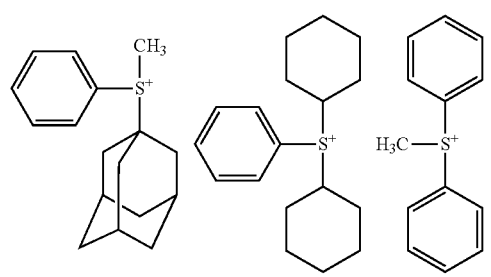
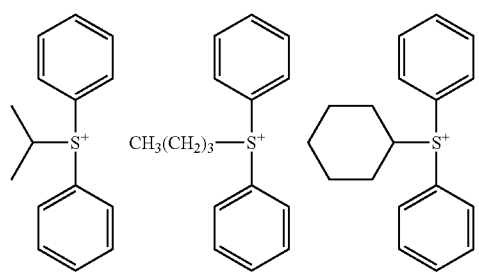
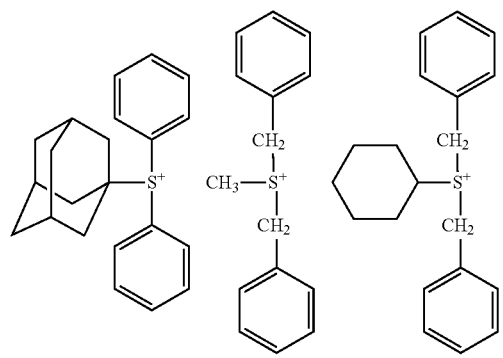
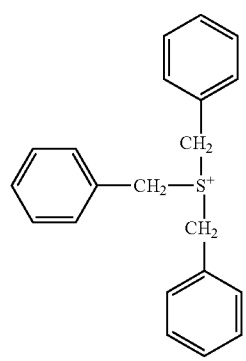
108
-continued
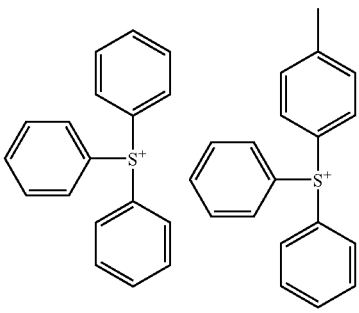
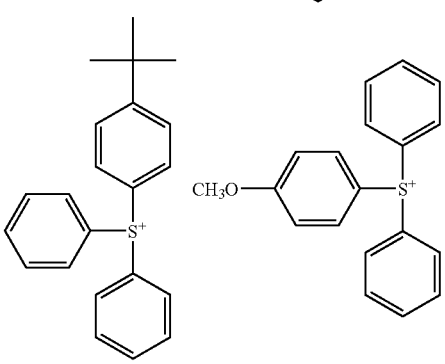
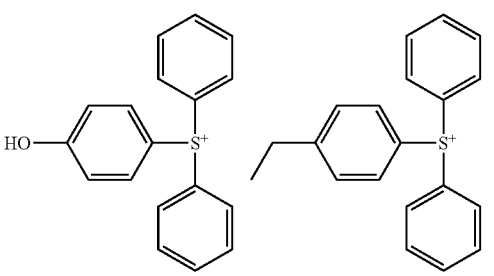
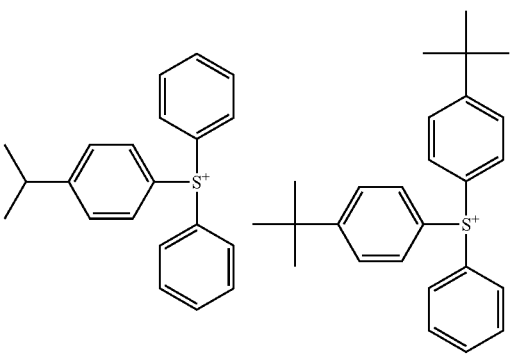
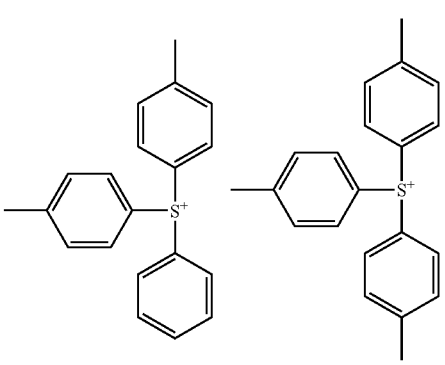

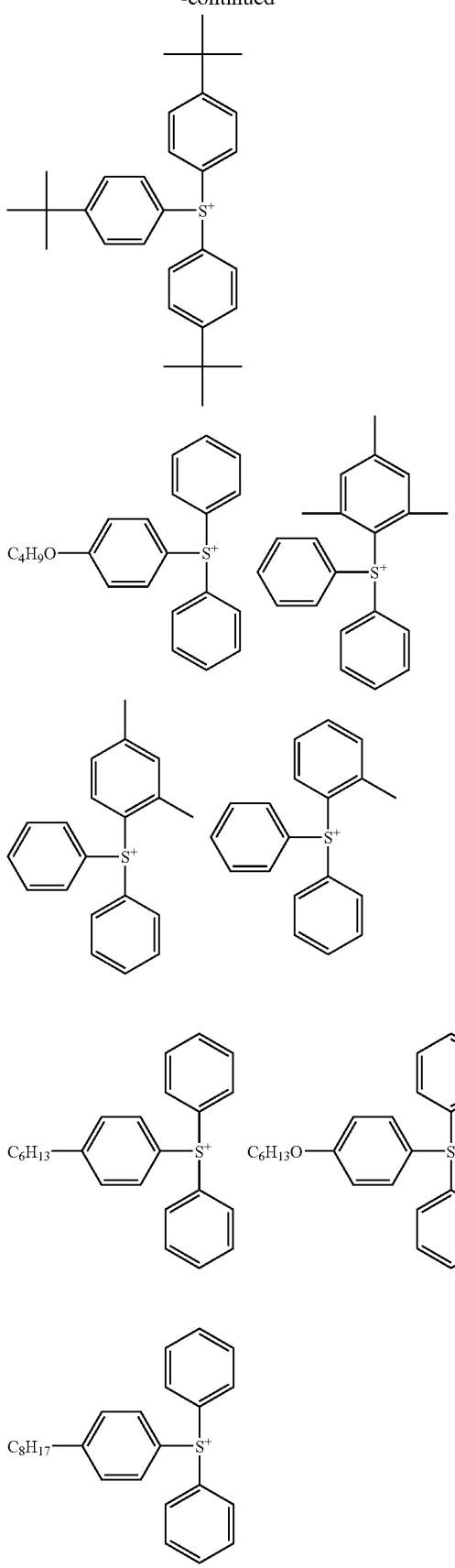
Specific examples of the cation (IXb) include the following:
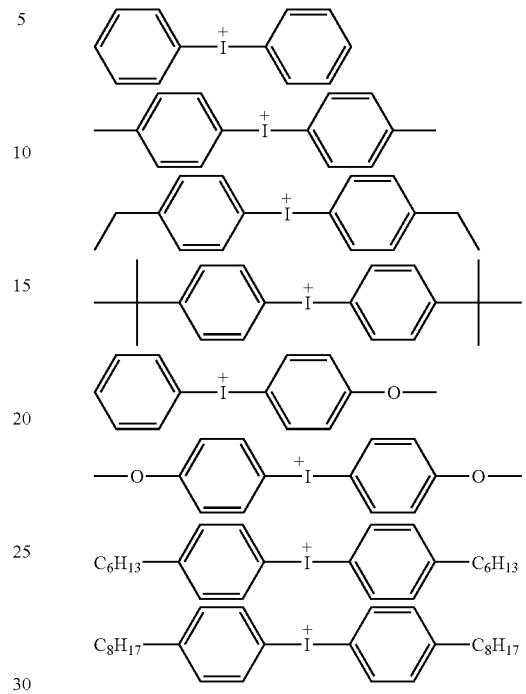
Specific examples of the cation (IXc) include the following:
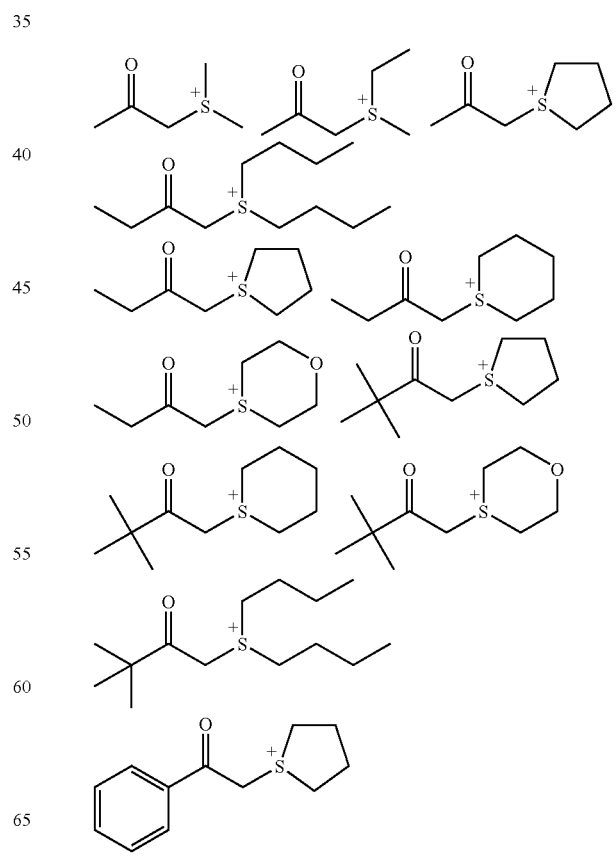

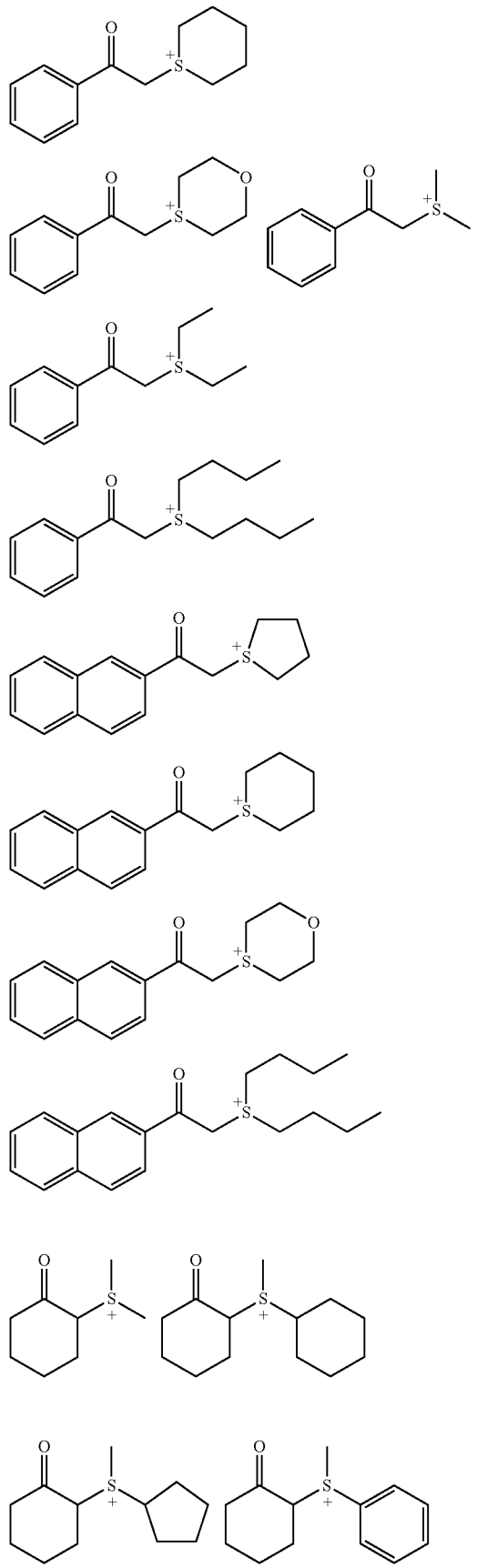
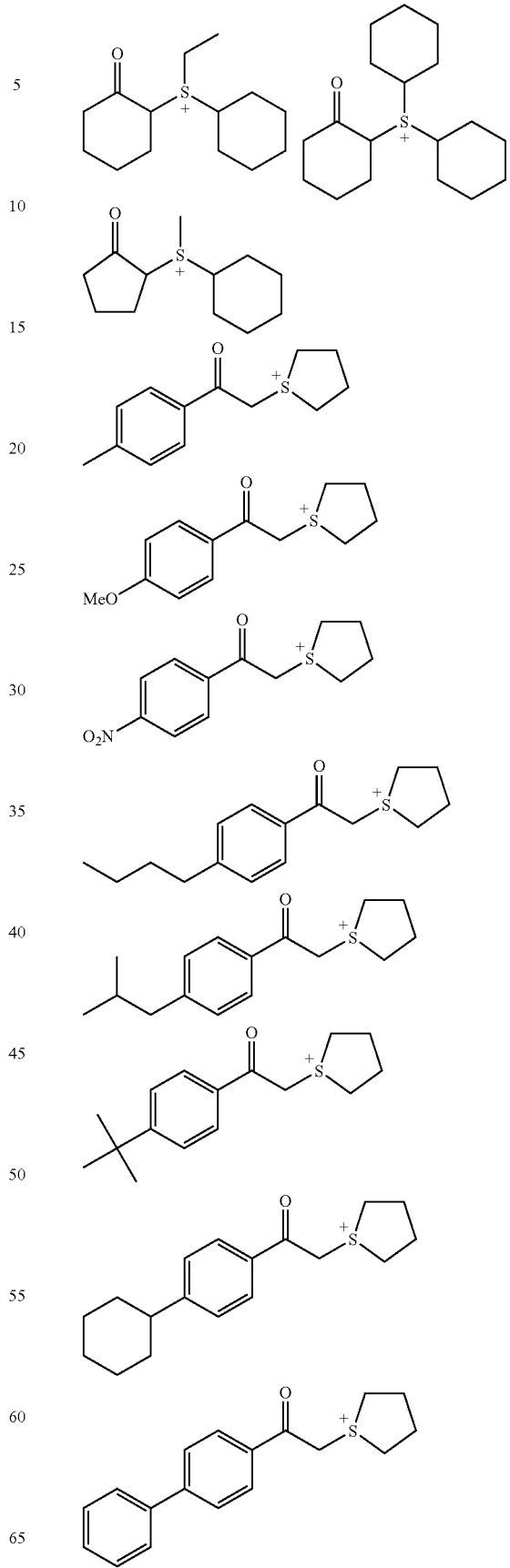

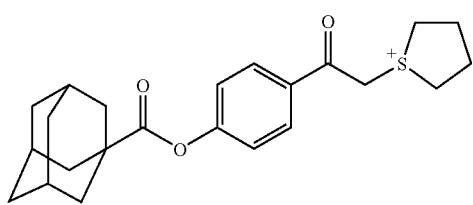
Specific examples of the cation (IXd) include the following:
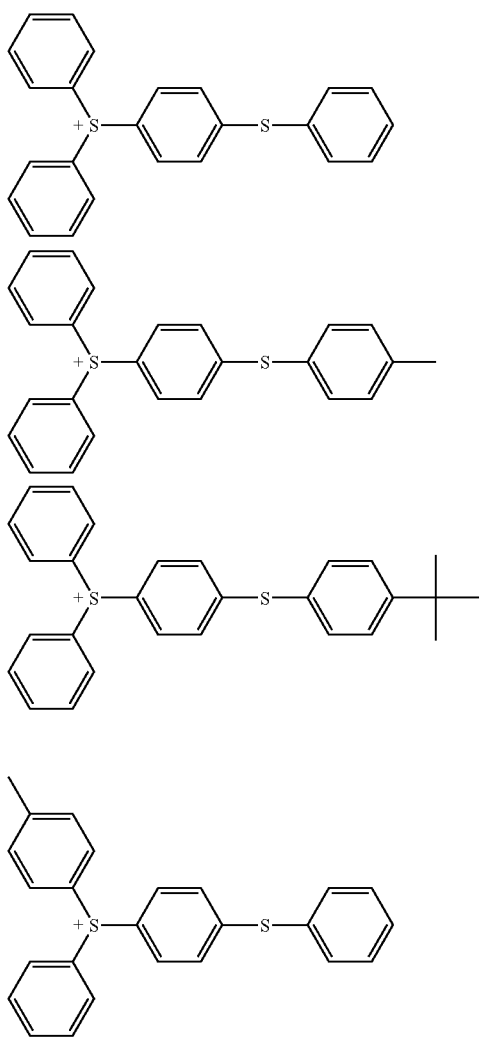
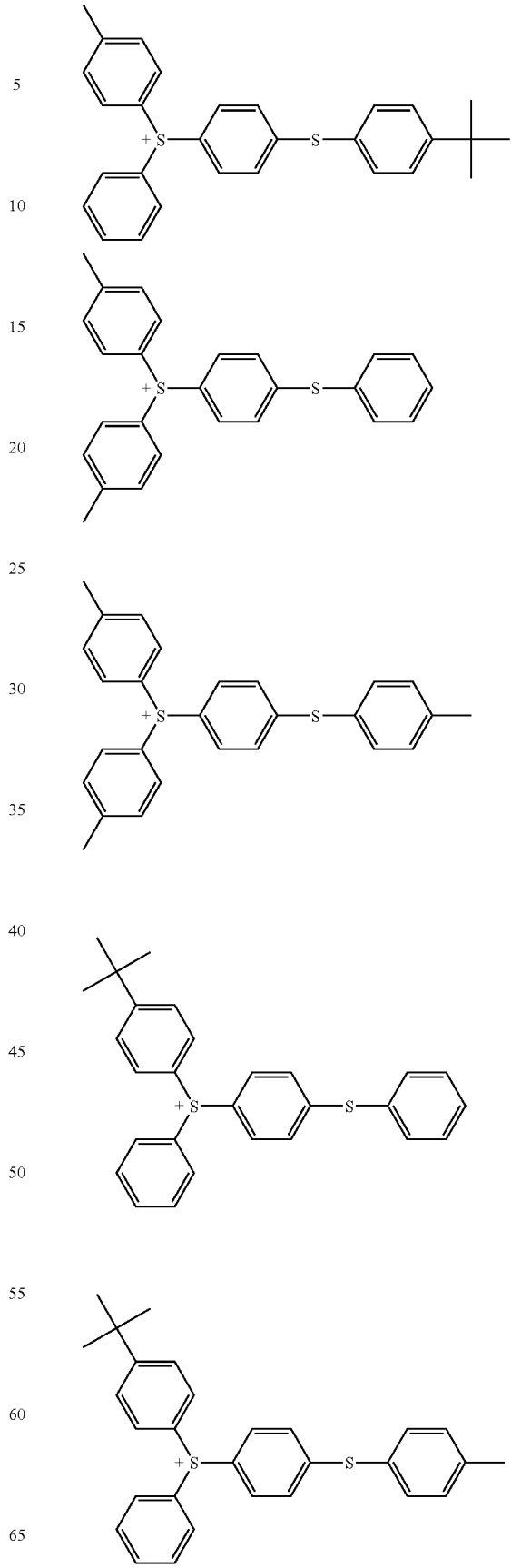

115
-continued
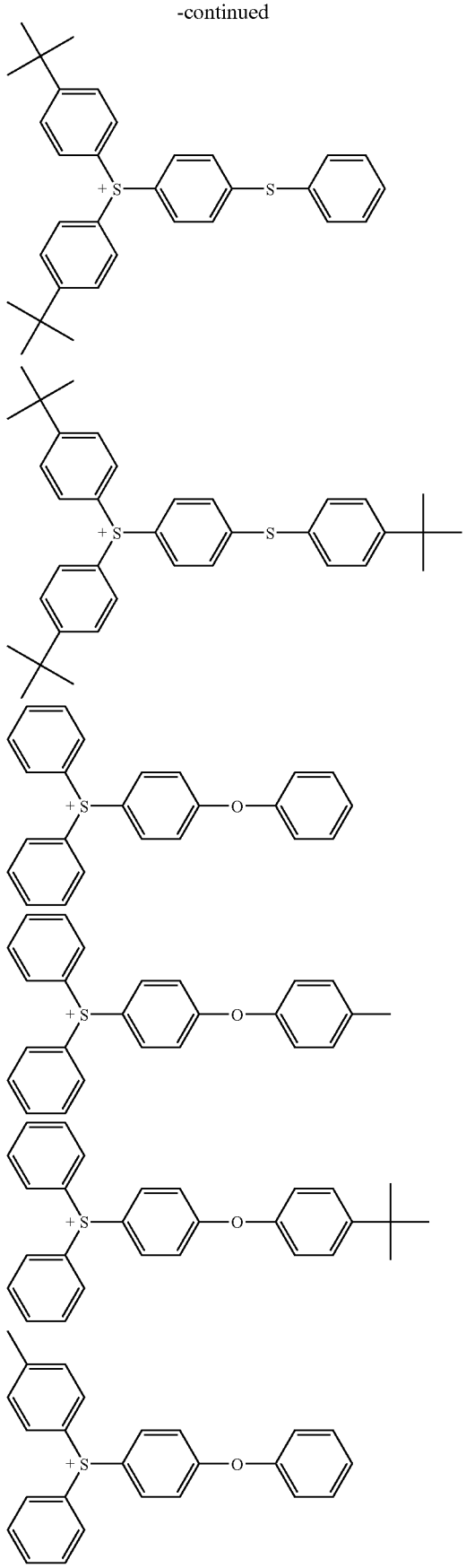
116
-continued
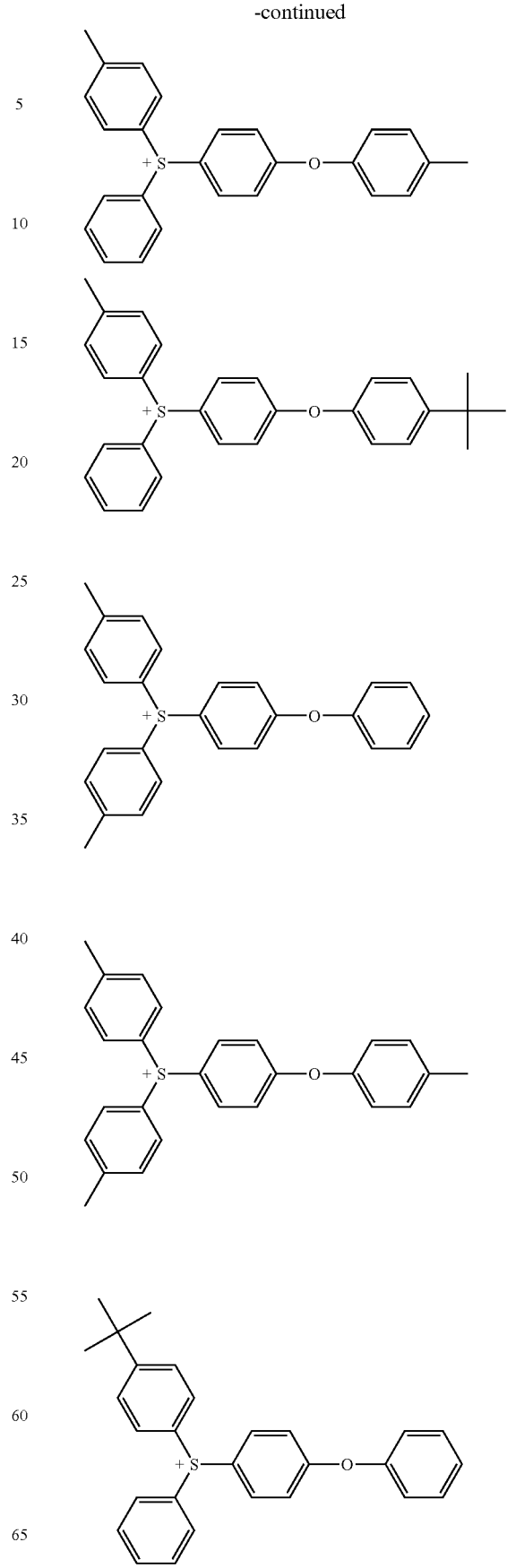

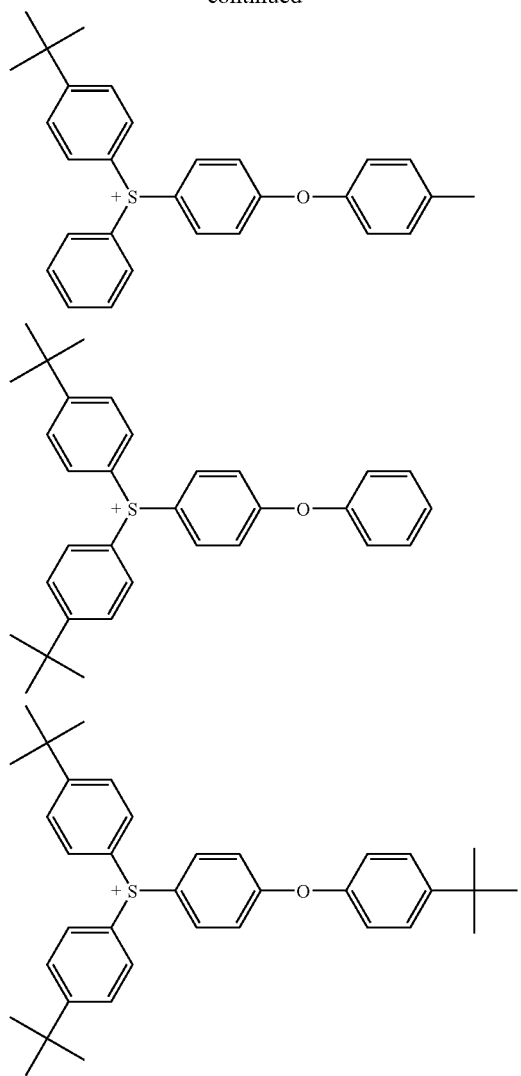
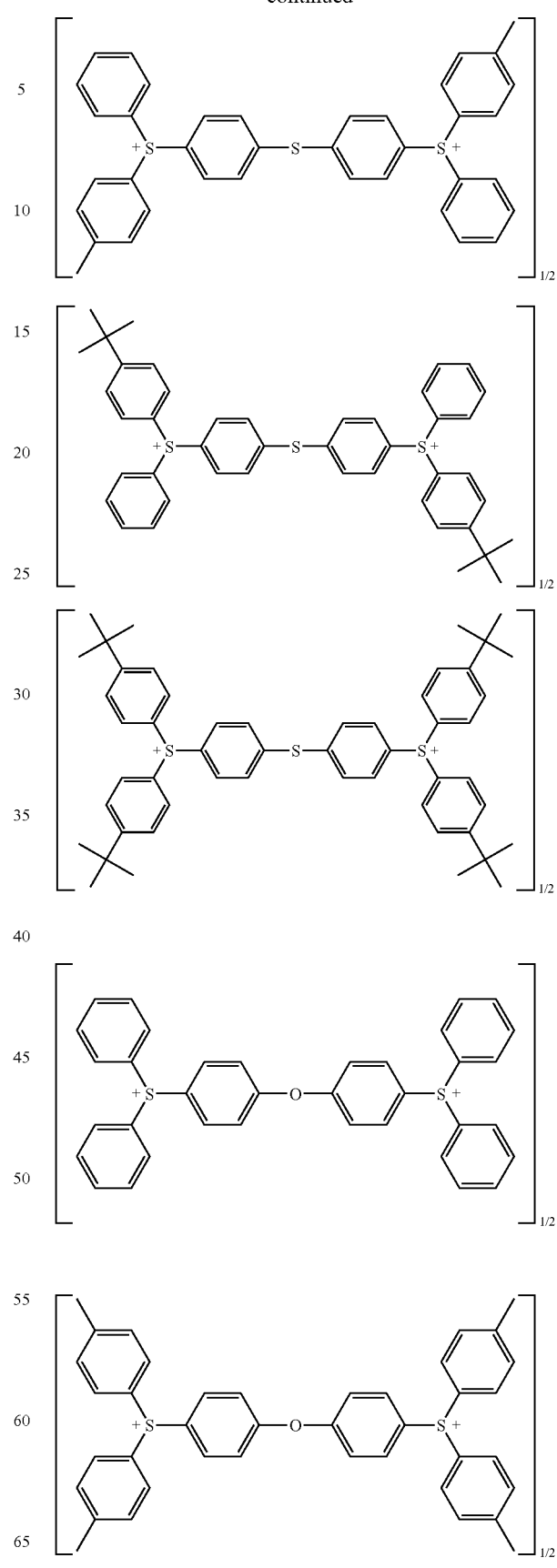

-continued

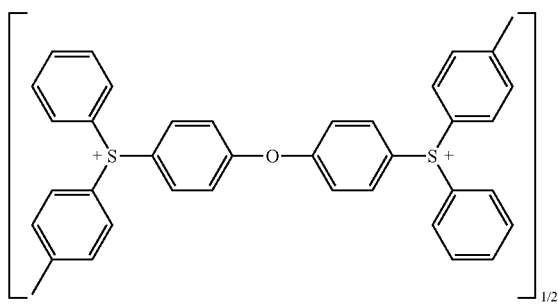

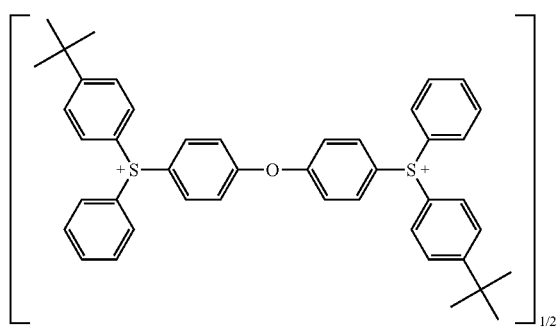

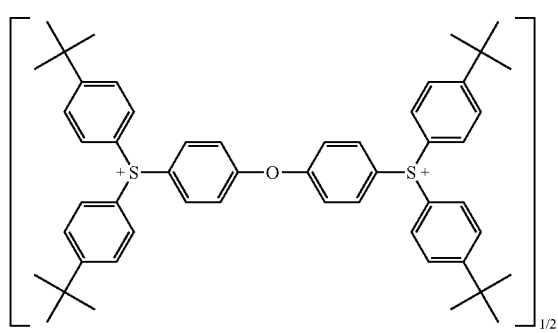

Among the cation (IXz), the cation represented by the formula (IXa):

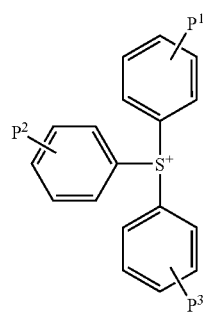

(IXa)

wherein $P^1$, $P^2$ and $P^3$ each independently represent a hydrogen atom, a hydroxyl group, a C1-C12 linear or branched chain alkyl group or a C1-C12 linear or branched chain alkoxy group, is preferable.

Examples of the C1-C12 linear or branched chain alkyl group and the C1-C12 linear or branched chain alkoxy group include the same as described above.

As the organic counter ion represented by $A^+$, a cation represented by the following formulae (IXe):

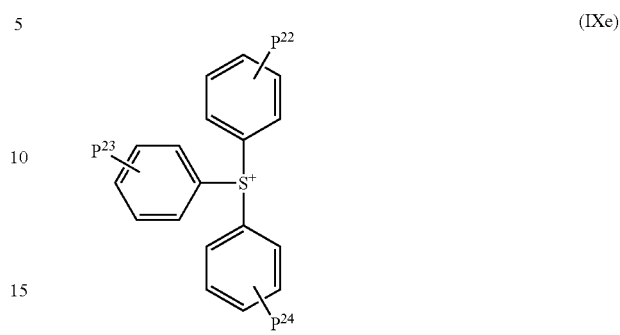

(IXe)

wherein $P^{22}$, $P^{23}$ and $P^{24}$ each independently represent a hydrogen atom or a C1-C4 alkyl group, is also preferable.

As the Salt (VI), a salt wherein $A^+$ is the cation represented by the following formulae (IXe) and the anion part is the following:

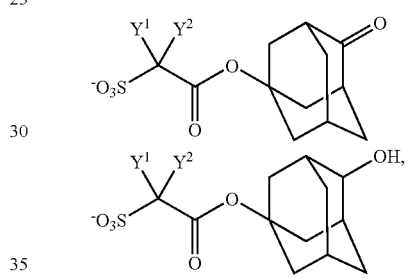

and a salt wherein $A^+$ is the cation represented by the following formulae (IXc) and the anion part is the following:

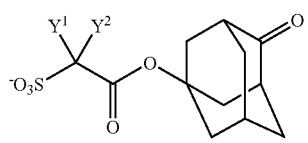

are preferable.

Salt (VI) can be produced according to known methods such as a method described in JP 2007-249192 A1.

In the present resist composition, the weight ratio of resin component to the acid generator is preferably 99.9/0.1 to 60/40. In this specification, "resin component" means Resin (A), Resin (B) and the other resin or resins which are contained in the present resist composition.

In the present resist composition, performance deterioration caused by inactivation of acid which occurs due to post exposure delay can be diminished by adding an organic base compound, particularly a nitrogen-containing organic base compound as a quencher. The present resist composition may contain two or more kinds of organic base compounds.

Specific examples of the nitrogen-containing organic base compound include an amine compound represented by the following formulae:

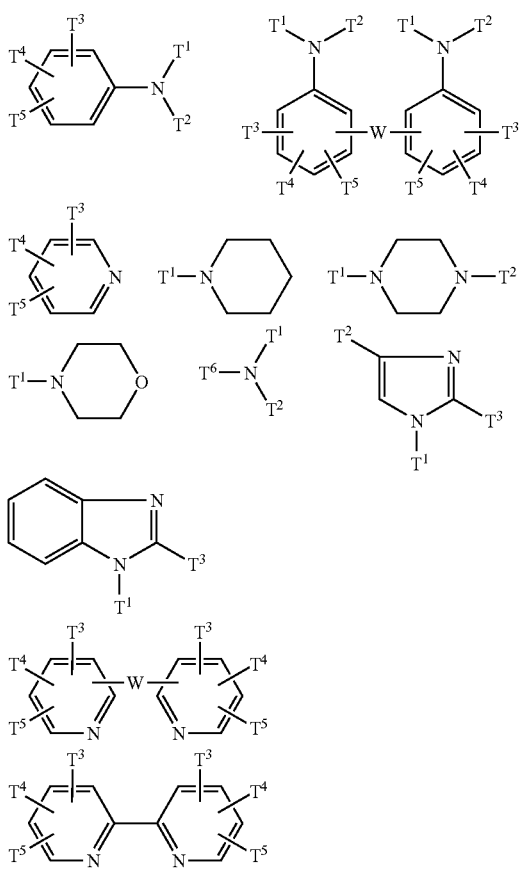

and a quaternary ammonium hydroxide represented by the following formula:

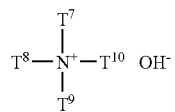

wherein $T^7$, $T^8$, $T^9$ and $T^{10}$ each independently represent an alkyl group, a cycloalkyl group or an aryl group, and the alkyl, cycloalkyl and aryl groups may be substituted with at least one selected from the group consisting of a hydroxyl group, an amino group which may have one or two C1-C4 alkyl groups and a C1-C6 alkoxy group.

The alkyl group in $T^1$, $T^2$, $T^3$, $T^4$, $T^5$, $T^6$, $T^7$, $T^8$, $T^9$ and $T^{10}$ preferably has about 1 to 10 carbon atoms, and more preferably has about 1 to 6 carbon atoms.

Examples of the amino group which may have one or two C1-C4 alkyl groups include an amino group, a methylamino group, an ethylamino group, a butylamino group, a dimethylamino group and a diethylamino group. Examples of the C1-C6 alkoxy group which may be substituted with the C1-C6 alkoxy group or groups include a methoxy group, an ethoxy group, a propoxy group, an isopropoxy group, a butoxy group, a tert-butoxy group, a pentyloxy group, a hexyloxy group and a 2-methoxyethoxy group.

Specific examples of the alkyl group which may be substituted with at least one selected from the group consisting of a hydroxyl group, an amino group which may have one or two C1-C4 alkyl groups, and a C1-C6 alkoxy group which may be substituted with a C1-C6 alkoxy group or groups include a methyl group, an ethyl group, a propyl group, an isopropyl group, a butyl group, a tert-butyl group, a pentyl group, a hexyl group, a octyl group, a nonyl group, a decyl group, a 2-(2-methoxyethoxy)ethyl group, a 2-hydroxyethyl group, a 2-hydroxypropyl group, a 2-aminoethyl group, a 4-aminobutyl group and a 6-aminohexyl group.

wherein $T^1$ and $T^2$ each independently represent a hydrogen atom, an alkyl group, a cycloalkyl group or an aryl group, and the alkyl, cycloalkyl and aryl groups may be substituted with at least one selected from the group consisting of a hydroxyl group, an amino group which have one or two C1-C4 alkyl groups and a C1-C6 alkoxy group, $T^3$ and $T^4$ each independently represent a hydrogen atom, an alkyl group, a cycloalkyl group, an aryl group or an alkoxy group, and the alkyl, cycloalkyl, aryl and alkoxy groups may be substituted with at least one selected from the group consisting of a hydroxyl group, an amino group which may have one or more C1-C4 alkyl groups and a C1-C6 alkoxy group, or $T^3$ and $T^4$ are bonded each other to form an aromatic ring together with the carbon atoms to which they are bonded, $T^5$ represents a hydrogen atom, an alkyl group, a cycloalkyl group, an aryl group, an alkoxy group or a nitro group, and the alkyl, cycloalkyl, aryl and alkoxy groups may be substituted with at least one selected from the group consisting of a hydroxyl group, an amino group which may have one or two C1-C4 alkyl groups and a C1-C6 alkoxy group, $T^6$ represents an alkyl group or a cycloalkyl group, and the alkyl and cycloalkyl groups may be substituted with at least one selected from the group consisting of a hydroxyl group, an amino group which may have one or two C1-C4 alkyl groups and a C1-C6 alkoxy group, and W represents —CO—, —NH—, —S—, —S—S—, an alkylene group of which one or more —CH$_2$— may be replaced by —O—, or an alkenylene group of which one or more —CH$_2$— may be replaced by —O—, The cycloalkyl group in $T^1$, $T^2$, $T^3$, $T^4$, $T^5$, $T^6$, $T^7$, $T^8$, $T^9$ and $T^{10}$ preferably has about 5 to 10 carbon atoms. Specific examples of the cycloalkyl group which may be substituted with at least one selected from the group consisting of a hydroxyl group, an amino group which may have one or two C1-C4 alkyl groups and a C1-C6 alkoxy group include a cyclopentyl group, a cyclohexyl group, a cycloheptyl group and a cyclooctyl group.

The aryl group in $T^1$, $T^2$, $T^3$, $T^4$, $T^5$, $T^6$, $T^7$, $T^8$, $T^9$ and $T^{10}$ preferably has about 6 to 10 carbon atoms. Specific examples of the aryl group which may be substituted with at least one selected from the group consisting of a hydroxyl group, an amino group which may have one or two C1-C4 alkyl groups and a C1-C6 alkoxy group include a phenyl group and a naphthyl group.

The alkoxy group in $T^3$, $T^4$ and $T^5$ preferably has about 1 to 6 carbon atoms and specific examples thereof include a methoxy group, an ethoxy group, a propoxy group, an isopropoxy group, a butoxy group, a tert-butoxy group, a pentyloxy group and a hexyloxy group.

The alkylene and alkenylene groups in W preferably have 2 to 6 carbon atoms. Specific examples of the alkylene group include an ethylene group, a trimethylene group, a tetramethylene group, a methylenedioxy group and an ethylene-1,2-dioxy group, and specific examples of the alkenylene group include an ethene-1,2-diyl group, a 1-propene-1,3-diyl group and a 2-butene-1,4-diyl group.

Specific examples of the amine compound include hexylamine, heptylamine, octylamine, nonylamine, decylamine, aniline, 2-methylaniline, 3-methylaniline, 4-methylaniline, 4-nitroaniline, 1-naphthylamine, 2-naphthylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl] amine, triisopropanolamine, N,N-dimethylaniline, 2,6-diisopropylaniline, imidazole, benzimidazole, pyridine, 4-methylpyridine, 4-methylimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl)ethylene, 2,2'-dipicolylamine and 3,3'-dipicolylamine.

Examples of the quaternary ammonium hydroxide include tetramethylammonium hydroxide, tetraisopropylammonium hydroxide, tetrabutylammonium hydroxide, tetrahexylammonium hydroxide, tetraoctylammonium hydroxide, phenyltrimethylammonium hydroxide, (3-trifluoromethylphenyl) trimethylammonium hydroxide and (2-hydroxyethyl) trimethylammonium hydroxide (so-called "choline").

A hindered amine compound having a piperidine skeleton as disclosed in JP 11-52575 A1 can be also used as the quencher.

In the point of forming patterns having higher resolution, the quaternary ammonium hydroxide is preferably used as the quencher.

When the basic compound is used as the quencher, the present resist composition preferably includes 0.01 to 1% by weight of the basic compound based on the total amount of resin component and the acid generator.

The present resist composition can contain, if necessary, a small amount of various additives such as a sensitizer, a dissolution inhibitor, other polymers, a surfactant, a stabilizer and a dye as long as the effect of the present invention is not prevented.

The present resist composition is usually in the form of a resist liquid composition in which the above-mentioned ingredients are dissolved in a solvent and the resist liquid composition is applied onto a substrate such as a silicon wafer by a conventional process such as spin coating. The solvent used is sufficient to dissolve the above-mentioned ingredients, have an adequate drying rate, and give a uniform and smooth coat after evaporation of the solvent. Solvents generally used in the art can be used.

Examples of the solvent include a glycol ether ester such as ethyl cellosolve acetate, methyl cellosolve acetate and propylene glycol monomethyl ether acetate; a glycol ether such as propylene glycol monomethyl ether; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone. These solvents may be used alone and two or more thereof may be mixed to use.

A resist film applied onto the substrate and then dried is subjected to exposure for patterning, then heat-treated to facilitate a deblocking reaction, and thereafter developed with an alkali developer. The alkali developer used may be any one of various alkaline aqueous solution used in the art. Generally, an aqueous of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended claims, and includes all variations of the equivalent meanings and ranges to the claims.

The present invention will be described more specifically by way of examples, which are not construed to limit the scope of the present invention. The "%" and "part(s)" used to represent the content of any component and the amount of any material used in the following examples and comparative examples are on a weight basis unless otherwise specifically noted. The weight-average molecular weight of any material used in the following examples is a value found by gel permeation chromatography using polystyrene as a standard reference material.

Monomers used in the following Resin Synthetic Examples are following monomers A, B, C, D and E.

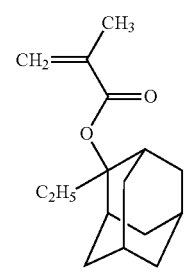

A

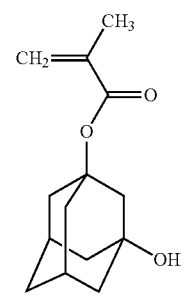

B

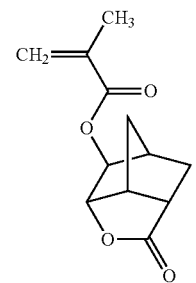

C

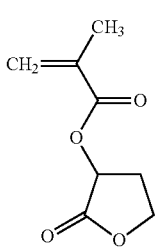

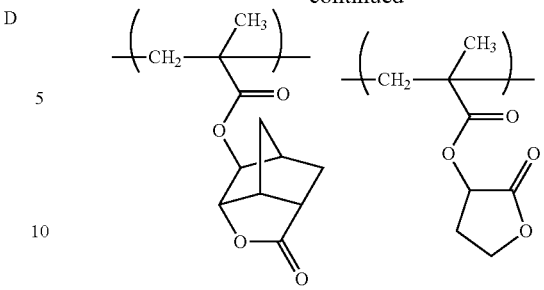

RESIN SYNTHETIC EXAMPLE 2

Into a flask, 39.7 g of monomer A, 103.8 g of monomer E and 265 g of isopropanol were charged to prepare a solution. The solution was heated to 75° C. under a nitrogen atmosphere. To the solution, a solution prepared by dissolving 11.05 g of 2,2'-azobis(2-methylpropionate) in 22.11 g of 1,4-dioxane was added dropwise. The resultant mixture was stirred for 12 hours under reflux. The reaction mixture was cooled and then, was poured into a large amount of methanol to cause precipitation. The precipitate was isolated by filtration to obtain 250 g of a copolymer including methanol.

The obtained copolymer was mixed with 10.3 g of 4-dimethylaminopyridine and 202 g of methanol and the resultant mixture was refluxed for 20 hours. The reaction mixture was cooled and then, was neutralized with 7.6 g of glacial acetic acid. The resultant mixture was poured into a large amount of water to cause precipitation. The precipitate was isolated by filtration and dissolved in acetone. The solution was poured into a large amount of water to cause precipitation. The precipitate was isolated by filtration. The operation wherein the precipitate was dissolved in acetone, the solution was poured into a large amount of water to cause precipitation and then, the precipitate was isolated by filtration was repeated two times to obtain 95.9 g of a resin having a weight-average molecular weight of about 8,600. This resin had the following structural units, and a molar ratio of the structural unit derived from monomer A to the structural unit derived from monomer E (the structural unit derived from monomer A/the structural unit derived from monomer E) was analyzed with $^{13}$C-NMR and it was about 20/80. This is called as Resin B1.

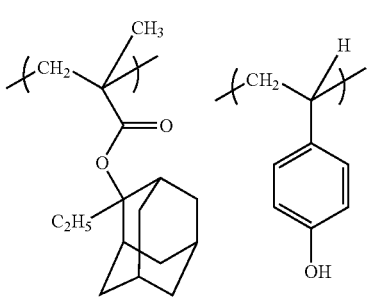

RESIN SYNTHETIC EXAMPLE 1

Into a flask, 15.00 g of monomer A, 4.89 g of monomer B, 11.12 g of monomer C and 8.81 g of monomer D were added (monomer ratio; monomer A: monomer B: monomer C: monomer D=35:12:23:30) and 1.5 times amount of 1,4-dioxane as much as the amount of all monomers to be used was added thereto to prepare a solution. To the solution, 2,2'-azobisisobutyronitrile and 2,2'-azobis(2,4-dimethylvaleronitrile) was added as an initiator in a ratio of 1 mol % and 3 mol % respectively based on all monomer molar amount, and the resultant mixture was heated at 77° C. for about 5 hours. The reaction solution was poured into a large amount of mixture of water and methanol to cause precipitation. The precipitate was isolated and mixed with a large amount of mixture of water and methanol to cause precipitation. The precipitate was isolated. The operation wherein the precipitate was isolated, and mixed with a large amount of mixture of water and methanol to cause precipitation, and the precipitate was isolated was repeated twice. As a result, resin having a weight-average molecular weight of about 8,100 was obtained in a yield of 78%. This resin had the following structural units. This is called as Resin A1.

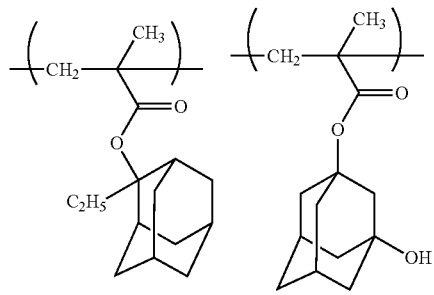

RESIN SYNTHETIC EXAMPLE 3

One hundred two point eight grams of a copolymer having a weight-average molecular weight of about 8,200 was obtained according to the same manner as that of Resin Synthetic Example 2, except that 59.6 g of monomer A and 90.8 g of monomer E were used in place of 39.7 g of monomer A and 103.8 g of monomer E. This resin had the following structural units, and a molar ratio of the structural unit derived from monomer A to the structural unit derived from monomer E (the structural unit derived from monomer A/the structural unit derived from monomer E) was analyzed with $^{13}$C-NMR and it was about 30/70. This is called as Resin B2.

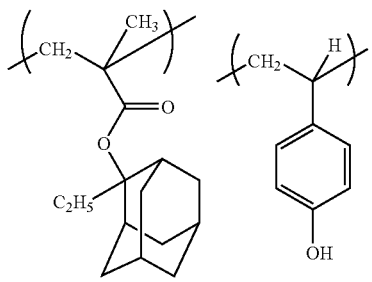

EXAMPLES 1 TO 4 AND COMPARATIVE EXAMPLES 1 TO 4

<Acid Generator>
Acid Generator P1:
triphenylsulfonium 4-oxo-1-adamantyloxycarbonyldifluoromethanesulfonate
Acid Generator P2:
triphenylsulfonium 2,4,6-triisopropylbenzenesulfonate
Acid Generator P3:
N-(butylsulfonyloxy)succinimide
<Resin>
Resin A1
Resin B1
Resin B2
<Quencher>
Q1: 2,6-diisopropylaniline
Q2: tetrabutylammonium hydroxide
<Solvent>

| S1: | propylene glycol monomethyl ether | 60 parts |
| | propylene glycol monomethyl ether acetate | 390 parts |
| S2: | propylene glycol monomethyl ether | 60 parts |
| | propylene glycol monomethyl ether acetate | 420 parts |

The following components were mixed and dissolved, further, filtrated through a fluorine resin filter having pore diameter of 0.2 μm, to prepare resist liquid.
Resin (kind and amount are described in Table 1)
Acid generator (kind and amount are described in Table 1)
Quencher (kind and amount are described in Table 1)
Solvent (kind is described in Table 1)

TABLE 1

| Ex. No. | Resin (kind/amount (part)) | Acid generator (kind/amount (part)) | Quencher (kind/amount (part)) | Solvent |
|---|---|---|---|---|
| Ex. 1 | A1/5 B1/2.5 B2/2.5 | P2/1 P3/1 | Q1/0.055 | S2 |
| Ex. 2 | A1/7.5 B1/1.25 B2/1.25 | P1/1.2 | Q1/0.075 Q2/0.005 | S1 |
| Ex. 3 | A1/5 B1/2.5 B2/2.5 | P1/1.2 | Q1/0.075 Q2/0.005 | S1 |
| Ex. 4 | A1/2.5 B1/3.75 B2/3.75 | P1/1.2 | Q1/0.075 Q2/0.005 | S1 |
| Comp. Ex. 1 | A1/10 | P1/1.2 | Q1/0.075 Q2/0.005 | S1 |
| Comp. Ex. 2 | B1/5 B2/5 | P1/1.2 | Q1/0.075 Q2/0.005 | S1 |
| Comp. Ex. 3 | A1/10 | P2/1 P3/1 | Q1/0.055 | S2 |
| Comp. Ex. 4 | B1/5 B2/5 | P2/1 P3/1 | Q1/0.055 | S2 |

Silicon wafers were each contacted with hexamethyldisilazane at 90° C. for 60 seconds on a direct hotplate. Each of the resist compositions prepared as above was spin-coated over the wafers so that the thickness of the resulting film became 0.06 μm after drying. The silicon wafers thus coated with the respective resist compositions were each prebaked on a direct hotplate at 110° C. for 60 seconds. Using a writing electron beam lithography system ("HL-800D" manufactured by Hitachi, Ltd., 50 KeV), each wafer on which the respective resist film had been thus formed was exposed to a line and space pattern, while changing stepwise the exposure quantity.

After the exposure, each wafer was subjected to post-exposure baking on a hotplate at 100° C. for 60 seconds and then to paddle development for 60 seconds with an aqueous solution of 2.38 wt % tetramethylammonium hydroxide.

Each of a resist pattern developed on the organic anti-reflective coating substrate after the development was observed with a scanning electron microscope, the results of which are shown in Table 2.

Effective Sensitivity (ES): It was expressed as the amount of exposure that the line pattern and the space pattern become 1:1 after exposure through 0.10 μm line and space pattern mask and development.

Resolution: It is expressed as the minimum size of space pattern which gave the space pattern split by the line pattern at the exposure amount of the effective sensitivity.

Pattern Profile: The space pattern which gave a line and space pattern at the exposure amount of the effective sensitivity after conducting a lithography process were observed by a scanning electron microscope. When the cross-section shape of the pattern is rectangle, the pattern profile is good and its evaluation is marked by "○", and when the upper of the pattern was melted and the pattern became smaller, the pattern profile is bad and its evaluation is marked by "X".

TABLE 2

| Ex. No. | ES (μC) | Resolution (nm) | Pattern Profile |
|---|---|---|---|
| Ex. 1 | 46 | 60 | ○ |
| Ex. 2 | 40 | 60 | ○ |
| Ex. 3 | 34 | 60 | ○ |
| Ex. 4 | 26 | 60 | ○ |
| Com. Ex. 1 | 48 | 70 | ○ |
| Comp. Ex. 2 | 14 | 100 | X |

TABLE 2-continued

| Ex. No. | ES (µC) | Resolution (nm) | Pattern Profile |
|---|---|---|---|
| Comp. Ex. 3 | Not Resolved at 100 µC or less | | |
| Comp. Ex. 4 | 16 | 80 | X |

EXAMPLE 5

A resist pattern can be obtained according to the same manner as described in Example 1, except that an EUV lithography system is used in place of the writing electron beam lithography system.

The present resist composition provides good resist pattern in resolution and pattern profile, and is especially suitable for extreme ultraviolet (EUV) lithography and electron beam lithography.

What is claimed is:

1. A resist composition comprising:
(A) a resin comprising a structural unit having an acid-labile group in its side chain and a structural unit represented by the formula (I):

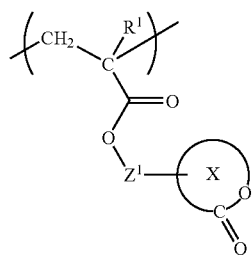

(I)

wherein $R^1$ represents a hydrogen atom or a methyl group, $Z^1$ represents a single bond or $-(CH_2)_k-CO-O-$, k represents an integer of 1 to 4, and ring X represents an unsubstituted or substituted C3-C30 cyclic hydrocarbon group having $-COO-$,
(B) a resin comprising a structural unit having an acid-labile group in its side chain and a structural unit represented by the formula (III):

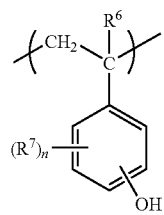

(III)

wherein $R^6$ represents a hydrogen atom or a methyl group, $R^7$ is independently in each occurrence a linear or branched chain C1-C6 alkyl group and n represents an integer of 0 to 4, and
(C) an acid generator.

2. The resist composition according to claim 1, wherein the structural unit having an acid-labile group in its side chain is a structural unit (IIa) or (IIb):

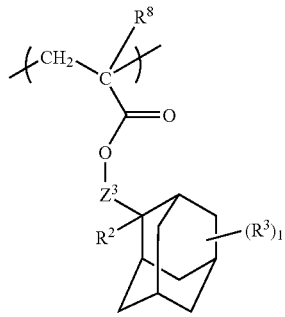

(IIa)

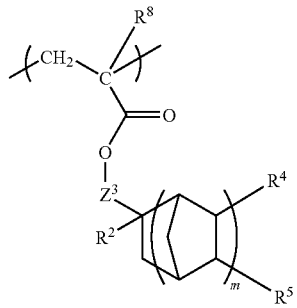

(IIb)

wherein $R^8$ represents a hydrogen atom or a methyl group, $Z^3$ represents a single bond or $-(CH_2)_j-CO-O-$, j represents an integer of 1 to 4, $R^2$ represents a C1-C8 linear or branched chain alkyl group or a C3-C8 cycloalkyl group, $R^3$ represents a methyl group, l represents an integer of 0 to 14, $R^4$ and $R^5$ each independently represent a hydrogen atom or a C1-C8 monovalent hydrocarbon group which may have one or more heteroatoms, or $R^4$ and $R^5$ may be bonded to form a C1-C8 divalent hydrocarbon group which may have at least one heteroatom which forms a ring together with the adjacent carbon atoms to which $R^4$ and $R^5$ are bonded, or $R^4$ and $R^5$ may be also bonded to form a carbon-carbon double bond between the carbon atom to which $R^4$ is bonded and the carbon atom to which $R^5$ is bonded, and m represents an integer of 1 to 3.

3. The resist composition according to claim 1 or 2, wherein a weight ratio of the resin (A) to the resin (B) (the resin (A)/the resin (B)) is 1/3 to 3/1.

4. The resist composition according to claim 1, wherein the acid generator is a salt represented by the formula (V):

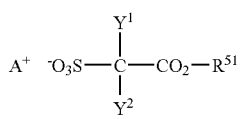

(V)

wherein $A^+$ represents an organic counter ion, $Y^1$ and $Y^2$ each independently represent a fluorine atom or a C1-C6 perfluoroalkyl group, $R^{51}$ represents a C1-C30 hydrocarbon group which may have one or more substituents selected from the group consisting of a C1-C6 alkoxy group, a C1-C4 perfluoroalkyl group, a C1-C6 hydroxyalkyl group, a hydroxyl group and a cyano group, and in which one or more $-CH_2-$ may be replace by $-CO-$ or $-O-$.

* * * * *